United States Patent
Widmer

(10) Patent No.: US 6,614,369 B1
(45) Date of Patent: Sep. 2, 2003

(54) DC BALANCED 7B/8B, 9B/10B, AND PARTITIONED DC BALANCED 12B/14B, 17B/20B, AND 16B/18B TRANSMISSION CODES

(75) Inventor: Albert X. Widmer, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/091,673

(22) Filed: Mar. 5, 2002

(51) Int. Cl.$^7$ .............................. H03M 5/00; H03M 7/00
(52) U.S. Cl. ............................................. 341/59; 341/58
(58) Field of Search ............................ 341/59, 58, 51, 341/65; 375/240.16; 380/215; 382/239; 704/222; 714/784, 785

(56) References Cited

U.S. PATENT DOCUMENTS

| | | | | |
|---|---|---|---|---|
| 4,463,344 A | * | 7/1984 | Adler et al. ................... | 341/59 |
| 4,486,739 A | | 12/1984 | Franaszek et al. | |
| 4,488,142 A | * | 12/1984 | Franaszek ..................... | 341/59 |
| 4,910,608 A | * | 3/1990 | Whiteman et al. .......... | 382/239 |
| 6,198,413 B1 | | 3/2001 | Widmer | |
| 6,400,763 B1 | * | 6/2002 | Wee ....................... | 375/240.16 |

FOREIGN PATENT DOCUMENTS

EP        530372    * 10/1992

OTHER PUBLICATIONS

A.X. Widmer, "The ANSI Fibre Channel Transmission Code," IBM RC 18855 (1993).

* cited by examiner

Primary Examiner—Patrick Wamsley
(74) Attorney, Agent, or Firm—Ryan, Mason & Lewis, LLP; Thu Ann Dang, Esq.

(57) ABSTRACT

The present invention provides techniques for classifying disparities and source vectors for 7B/8B and 9B/10B transmission codes, which are then used to minimize the complexity of decoding and encoding for 16B/18B codes. The classifications are determined for source vectors and for disparity for coded vectors. The vector classifications are selected in a predetermined manner so that the number of classifications is minimized for bit mapping, disparity control, or both. Additionally, the number of bits changed for bit mapping is minimized. Decoding of 7B/8B and 9B/10B transmission codes is performed by converting coded vectors into a single image and then performing decoding operations to decode the single image of the coded vectors. The single image is a primary coded vector, and an alternate coded vector is an inverted version of the primary coded vector. Techniques are presented for using 5B/6B, 7B/8B and 9B/10B transmission codes in other transmission codes such as 12B/14B and 17B/20B transmission codes. A 17B/20B may be created by using two parallel 9B/10B decoders or by using one 7B/8B encoder and two 5B/6B encoders.

29 Claims, 49 Drawing Sheets

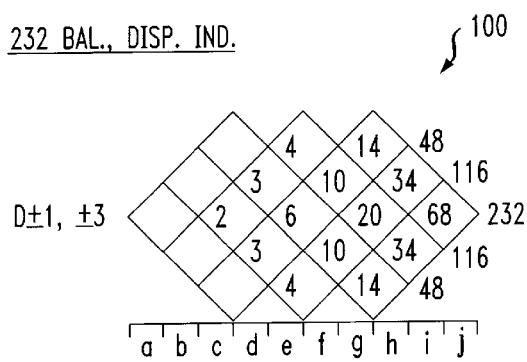
FIG. 1A
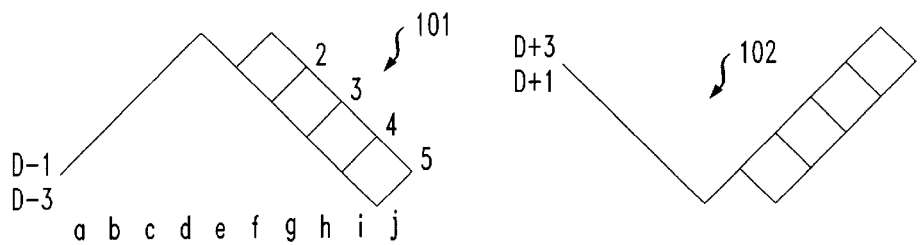
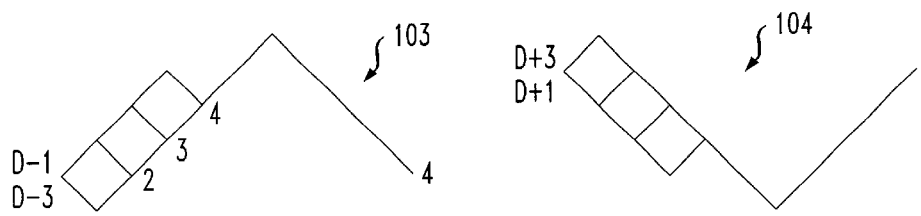
FIG. 1B
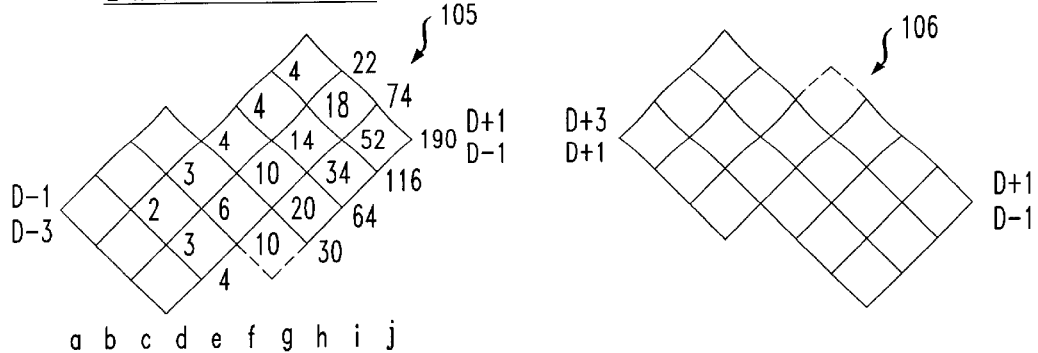

FIG. 2C
2 x 12 DISP. ± 4
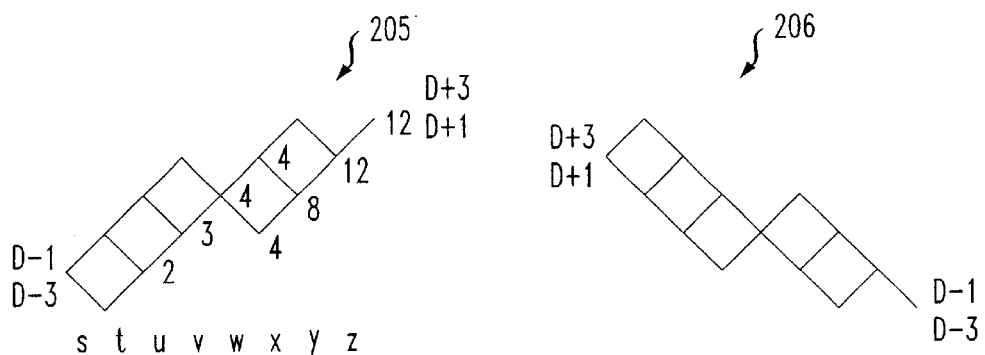
2 x 6 DISP. ± 4
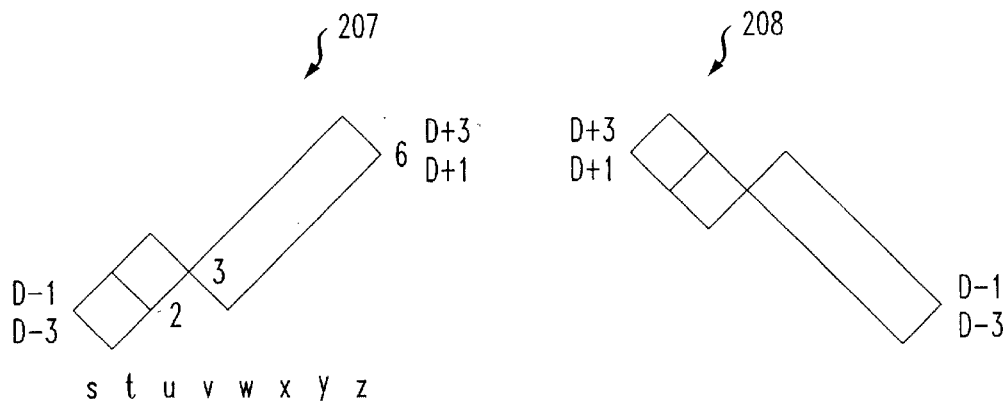

FIG. 8A

| Name | ABCDEFGHI K | Coding Class | Primary abcdefghij | DR Class | Pri DR | DB Class | Pri DB |
|---|---|---|---|---|---|---|---|
| D0 | 000000000 0 | DNCDFI | 0011010010 | N | + | N | −2 |
| D1 | 100000000 0 | DS1uEGH | 1000101100 | S | + | S | −2 |
| D2 | 010000000 0 | DS1m2bDGI | 0101001010 | S | + | S | −2 |
| D3 | 110000000 0 | DQ4t'6mHI | 1100000110 | Q | + | Q | −2 |
| D4 | 001000000 0 | DS2m3mBGI | 0110001010 | S | + | S | −2 |
| D5 | 101000000 0 | DQ4t'6mHI | 1010000110 | Q | + | Q | −2 |
| D6 | 011000000 0 | DQ4t'6mHI | 0110000110 | Q | + | Q | −2 |
| D7 | 111000000 0 | DT1u5ul | 1110000010 | T | + | T5u | −2 |
| D8 | 000100000 0 | DS3t4mCGI | 0011001010 | S | + | S | −2 |
| D9 | 100100000 0 | DQ4t'6mHI | 1001000110 | Q | + | Q | −2 |
| D10 | 010100000 0 | DQ4t'6mHI | 0101000110 | Q | + | Q | −2 |
| D11 | 110100000 0 | DT1u5ul | 1101000010 | T | + | T5u | −2 |
| D12 | 001100000 0 | DQ4t'6mHI | 0011000110 | Q | + | Q | −2 |
| D13 | 101100000 0 | DT1u5ul | 1011000010 | T | + | T5u | −2 |
| D14 | 011100000 0 | DT1m4uG | 0111001000 | T | + | T5u | −2 |
| D15 | 111100000 0 | DM4cCH | 1101000100 | M4c | + | M4c | −2 |
| D16 | 000010000 0 | DS4t5tAFH | 1000110100 | S | + | S | −2 |
| D17 | 100010000 0 | DQ4t'6mHI | 1000100110 | Q | + | Q | −2 |
| D18 | 010010000 0 | DQ4t'6mHI | 0100100110 | Q | + | Q | −2 |
| D19 | 110010000 0 | DT1u5ul | 1100100010 | T | + | T5u | −2 |
| D20 | 001010000 0 | DQ4t'6mHI | 0010100110 | Q | + | Q | −2 |
| D21 | 101010000 0 | DT1u5ul | 1010100010 | T | + | T5u | −2 |
| D22 | 011010000 0 | DT1m3u4b5u EFI | 0110010010 | T | + | T5u | −2 |
| D23 | 111010000 0 | BMK'4c'4t'6t'J | 1110100001 |  | ± | MK'4c'4t'6t' | 0 |
| D24 | 000110000 0 | DQ4t'6mHI | 0001100110 | Q | + | Q | −2 |
| D25 | 100110000 0 | DT1u5ul | 1001100010 | T | + | T5u | −2 |
| D26 | 010110000 0 | DT1m2b3m5ul | 0101100010 | T | + | T5u | −2 |
| D27 | 110110000 0 | BMK'4c'4t'6t'J | 1101100001 |  | ± | MK'4c'4t'6t' | 0 |
| D28 | 001110000 0 | DT2m5ul | 0011100010 | T | + | T5u | −2 |
| D29 | 101110000 0 | BMK'4c'4t'6t'J | 1011100001 |  | ± | MK'4c'4t'6t' | 0 |
| D30 | 011110000 0 | BMK'4c'4t'6t'J | 0111100001 |  | ± | MK'4c'4t'6t' | 0 |
| D31 | 111110000 0 | DU5vCEG | 1101001000 | U5v | + | U5v | −2 |
| D32 | 000001000 0 | DS5q6tAEI | 1000110010 | S | + | S | −2 |
| D33 | 100001000 0 | DQ4t'6mHI | 1000010110 | Q | + | Q | −2 |
| D34 | 010001000 0 | DQ4t'6mHI | 0100010110 | Q | + | Q | −2 |
| D35 | 110001000 0 | FT5u'5q' | 1100010000 | T | + | T5u'5q' | −4 |
| D36 | 001001000 0 | DQ4t'6mHI | 0010010110 | Q | + | DQ | −2 |
| D37 | 101001000 0 | FT5u'5q' | 1010010000 | T | + | T5u'5q' | −4 |
| D38 | 011001000 0 | FT5u'5q' | 0110010000 | T | + | T5u'5q' | −4 |
| D39 | 111001000 0 | BMK'4c'4t'6t'J | 1110010001 |  | ± | MK'4c'4t'6t' | 0 |
| D40 | 000101000 0 | DQ4t'6mHI | 0001010110 | Q | + | Q | −2 |
| D41 | 100101000 0 | FT5u'5q' | 1001010000 | T | + | T5u'5q' | −4 |
| D42 | 010101000 0 | FT5u'5q' | 0101010000 | T | + | T5u'5q' | −4 |
| D43 | 110101000 0 | BMK'4c'4t'6t'J | 1101010001 |  | ± | MK'4c'4t'6t' | 0 |

FIG. 8B

| Name | ABCDEFGHI K | Coding Class | Primary abcdefghij | DR Class | Pri DR | DB Class | Pri DB |
|---|---|---|---|---|---|---|---|
| D44 | 001101000 0 | FT5u'5q' | 0011010000 | T | + | T5u'5q' | -4 |
| D45 | 101101000 0 | BMK'4c'4t'6t'J | 1011010001 |  | ± | MK'4c'4t'6t' | 0 |
| D46 | 011101000 0 | BMK'4c'4t'6t'J | 0111010001 |  | ± | MK'4c'4t'6t' | 0 |
| D47 | 111101000 0 | PU4c5c | 1111010000 | U4c5c | − | U4c5c | 0 |
| D48 | 000011000 0 | DQ4t6mCG | 0010111000 | Q | + | Q | -2 |
| D49 | 100011000 0 | FT5u'5q' | 1000110000 | T | + | T5u'5q' | -4 |
| D50 | 010011000 0 | FT5u'5q' | 0100110000 | T | + | T5u'5q' | -4 |
| D51 | 110011000 0 | BMK'4c'4t'6t'J | 1100110001 |  | ± | MK'4c'4t'6t' | 0 |
| D52 | 001011000 0 | FT5u'5q' | 0010110000 | T | + | T5u'5q' | -4 |
| D53 | 101011000 0 | BMK'4c'4t'6t'J | 1010110001 |  | ± | MK'4c'4t'6t' | 0 |
| D54 | 011011000 0 | BMK'4c'4t'6t'J | 0110110001 |  | ± | MK'4c'4t'6t' | 0 |
| D55 | 111011000 0 | PU4u6c | 1110110000 | U4u6c | − | U4u6c | 0 |
| D56 | 000111000 0 | FT5u'5q' | 0001110000 | T | + | T5u'5q' | -4 |
| D57 | 100111000 0 | BMK'4c'4t'6t'J | 1001110001 |  | ± | MK'4c'4t'6t' | 0 |
| D58 | 010111000 0 | BMK'4c'4t'6t'J | 0101110001 |  | ± | MK'4c'4t'6t' | 0 |
| D59 | 110111000 0 | PU4u6c | 1101110000 | U4u6c | − | U4u6c | 0 |
| D60 | 001111000 0 | BMK'4c'4t'6t'J | 0011110001 |  | ± | MK'4c'4t'6t' | 0 |
| D61 | 101111000 0 | PU4u6c | 1011110000 | U4u6c | − | U4u6c | 0 |
| D62 | 011111000 0 | PU4u6c | 0111110000 | U4u6c | − | U4u6c | 0 |
| D63 | 111111000 0 | DC6vAEFI | 0111000010 | C4c | + | C4c | -2 |
| D64 | 000000100 0 | DS6q8qBEF | 0100111000 | S | + | S | -2 |
| D65 | 100000100 0 | DQ3m6t7tDF | 1001011000 | Q | + | Q | -2 |
| D66 | 010000100 0 | DQ3m6t7tDF | 0101011000 | Q | + | Q | -2 |
| D67 | 110000100 0 | FT5u'5q' | 1100001000 | T | + | T5u'5q' | -4 |
| D68 | 001000100 0 | DQ3m6t7tDF | 0011011000 | Q | + | Q | -2 |
| D69 | 101000100 0 | FT5u'5q' | 1010001000 | T | + | T5u'5q' | -4 |
| D70 | 011000100 0 | FT5u'5q' | 0110001000 | T | + | T5u'5q' | -4 |
| D71 | 111000100 0 | BMK'4c'4t'6t'J | 1110001001 |  | ± | MK'4c'4t'6t' | 0 |
| D72 | 000100100 0 | DQ3t4m6t7tB H | 0101001100 | Q | + | Q | -2 |
| D73 | 100100100 0 | FT5u'5q' | 1001001000 | T | + | T5u'5q' | -4 |
| D74 | 010100100 0 | FT5u'5q' | 0101001000 | T | + | T5u'5q' | -4 |
| D75 | 110100100 0 | BMK'4c'4t'6t'J | 1101001001 |  | ± | MK'4c'4t'6t' | 0 |
| D76 | 001100100 0 | FT5u'5q' | 0011001000 | T | + | T5u'5q' | -4 |
| D77 | 101100100 0 | BMK'4c'4t'6t'J | 1011001001 |  | ± | MK'4c'4t'6t' | 0 |
| D78 | 011100100 0 | BMK'4c'4t'6t'J | 0111001001 |  | ± | MK'4c'4t'6t' | 0 |
| D79 | 111100100 0 | PU4c5c | 1111001000 | U4c5c | − | U4c5c | 0 |
| D80 | 000010100 0 | DQ4t6m'8tAB | 1100101000 | Q | + | Q | -2 |
| D81 | 100010100 0 | FT5u'5q' | 1000101000 | T | + | T5u'5q' | -4 |
| D82 | 010010100 0 | FT5u'5q' | 0100101000 | T | + | T5u'5q' | -4 |
| D83 | 110010100 0 | BMK'4c'4t'6t'J | 1100101001 |  | ± | MK'4c'4t'6t' | 0 |
| D84 | 001010100 0 | FT5u'5q' | 0010101000 | T | + | T5u'5q' | -4 |
| D85 | 101010100 0 | BMK'4c'4t'6t'J | 1010101001 |  | ± | MK'4c'4t' 6t' | 0 |
| D86 | 011010100 0 | BMK'4c'4t'6t'J | 0110101001 |  | ± | MK'4c'4t'6t' | 0 |
| D87 | 111010100 0 | BU4c'6c'4t' | 1110101000 |  | ± | U4c'6c'4t' | 0 |
| D88 | 000110100 0 | FT5u'5q' | 0001101000 | T | + | T5u'5q' | -4 |

FIG. 8C

| Name | ABCDEFGHI K | Coding Class | Primary abcdefghij | DR Class | Pri DR | DB Class | Pri DB |
|---|---|---|---|---|---|---|---|
| D89 | 100110100 0 | BMK'4c'4t'6t'J | 1 0 0 1 1 0 1 0 0 1 | | ± | MK'4c'4t'6t' | 0 |
| D90 | 010110100 0 | BMK'4c'4t'6t'J | 0 1 0 1 1 0 1 0 0 1 | | ± | MK'4c'4t'6t' | 0 |
| D91 | 110110100 0 | BU4c'6c'4t' | 1 1 0 1 1 0 1 0 0 0 | | ± | U4c'6c'4t' | 0 |
| D92 | 001110100 0 | BMK'4c'4t'6t'J | 0 0 1 1 1 0 1 0 0 1 | | ± | MK'4c'4t'6t' | 0 |
| D93 | 101110100 0 | BU4c'6c'4t' | 1 0 1 1 1 0 1 0 0 0 | | ± | U4c'6c'4t' | 0 |
| D94 | 011110100 0 | BU4c'6c'4t' | 0 1 1 1 1 0 1 0 0 0 | | ± | U4c'6c'4t' | 0 |
| D95 | 111110100 0 | DC5v6cAD | 0 1 1 0 1 0 1 0 0 0 | C4c | + | C4c | −2 |
| D96 | 000001100 0 | DQ4t6m'8tAB | 1 1 0 0 0 1 1 0 0 0 | Q | + | Q | −2 |
| D97 | 100001100 0 | FT5u'5q' | 1 0 0 0 0 1 1 0 0 0 | T | + | T5u'5q' | −4 |
| D98 | 010001100 0 | FT5u'5q' | 0 1 0 0 0 1 1 0 0 0 | T | + | T5u'5q' | −4 |
| D99 | 110001100 0 | BMK'4c'4t'6t'J | 1 1 0 0 0 1 1 0 0 1 | | ± | MK'4c'4t'6t' | 0 |
| D100 | 001001100 0 | FT5u'5q' | 0 0 1 0 0 1 1 0 0 0 | T | + | T5u'5q' | −4 |
| D101 | 101001100 0 | BMK'4c'4t'6t'J | 1 0 1 0 0 1 1 0 0 1 | | ± | MK'4c'4t'6t' | 0 |
| D102 | 011001100 0 | BMK'4c'4t'6t'J | 0 1 1 0 0 1 1 0 0 1 | | ± | MK'4c'4t'6t' | 0 |
| D103 | 111001100 0 | BU4c'6c'4t' | 1 1 1 0 0 1 1 0 0 0 | | ± | U4c'6c'4t' | 0 |
| D104 | 000101100 0 | FT5u'5q' | 0 0 0 1 0 1 1 0 0 0 | T | + | T5u'5q' | −4 |
| D105 | 100101100 0 | BMK'4c'4t'6t'J | 1 0 0 1 0 1 1 0 0 1 | | ± | MK'4c'4t'6t' | 0 |
| D106 | 010101100 0 | BMK'4c'4t'6t'J | 0 1 0 1 0 1 1 0 0 1 | | ± | MK'4c'4t'6t' | 0 |
| D107 | 110101100 0 | BU4c'6c'4t' | 1 1 0 1 0 1 1 0 0 0 | | ± | U4c'6c'4t' | 0 |
| D108 | 001101100 0 | BMK'4c'4t'6t'J | 0 0 1 1 0 1 1 0 0 1 | | ± | MK'4c'4t'6t' | 0 |
| D109 | 101101100 0 | BU4c'6c'4t' | 1 0 1 1 0 1 1 0 0 0 | | ± | U4c'6c'4t' | 0 |
| D110 | 011101100 0 | BU4c'6c'4t' | 0 1 1 1 0 1 1 0 0 0 | | ± | U4c'6c'4t' | 0 |
| D111 | 111101100 0 | DC4c5c7u'BD | 1 0 1 0 0 1 1 0 0 0 | C4c | + | C4c | −2 |
| D112 | 000011100 0 | FT5u'5q' | 0 0 0 0 1 1 1 0 0 0 | FT | + | T5u'5q' | −4 |
| D113 | 100011100 0 | BMK'4c'4t'6t'J | 1 0 0 0 1 1 1 0 0 1 | | ± | MK'4c'4t'6t' | 0 |
| D114 | 010011100 0 | BMK'4c'4t'6t'J | 0 1 0 0 1 1 1 0 0 1 | | ± | MK'4c'4t'6t' | 0 |
| D115 | 110011100 0 | BU4c'6c'4t' | 1 1 0 0 1 1 1 0 0 0 | | ± | U4c'6c'4t' | 0 |
| D116 | 001011100 0 | BMK'4c'4t'6t'J | 0 0 1 0 1 1 1 0 0 1 | | ± | MK'4c'4t'6t' | 0 |
| D117 | 101011100 0 | BU4c'6c'4t' | 1 0 1 0 1 1 1 0 0 0 | | ± | U4c'6c'4t' | 0 |
| D118 | 011011100 0 | BU4c'6c'4t' | 0 1 1 0 1 1 1 0 0 0 | | ± | U4c'6c'4t' | 0 |
| D119 | 111011100 0 | DC4c' | 1 1 1 0 1 1 1 0 0 0 | C4c' | − | C4c' | +2 |
| D120 | 000111100 0 | BMK'4c'4t'6t'J | 0 0 0 1 1 1 1 0 0 1 | | ± | MK'4c'4t'6t' | 0 |
| D121 | 100111100 0 | BU4c'6c'4t' | 1 0 0 1 1 1 1 0 0 0 | | ± | U4c'6c'4t' | 0 |
| D122 | 010111100 0 | BU4c'6c'4t' | 0 1 0 1 1 1 1 0 0 0 | | ± | U4c'6c'4t' | 0 |
| D123 | 110111100 0 | DC4c' | 1 1 0 1 1 1 1 0 0 0 | C4c' | − | C4c' | +2 |
| D124 | 001111100 0 | BU4c'6c'4t' | 0 0 1 1 1 1 1 0 0 0 | | ± | U4c'6c'4t' | 0 |
| D125 | 101111100 0 | DC4c' | 1 0 1 1 1 1 1 0 0 0 | C4c' | − | C4c' | +2 |
| D126 | 011111100 0 | DC4c' | 0 1 1 1 1 1 1 0 0 0 | C4c' | − | C4c' | +2 |
| D127 | 111111100 | DV6v8vBCF | 1 0 0 1 1 0 1 0 0 0 | V5v | + | V5v | −2 |
| D128 | 000000010 0 | DS6q8qBEF | 0 1 0 0 1 1 0 1 0 0 | S | + | S | −2 |
| D129 | 100000010 0 | DQ4m7q8tFG | 1 0 0 0 0 1 1 1 0 0 | Q | + | Q | −2 |
| D130 | 010000010 0 | DQ4m7q8tFG | 0 1 0 0 0 1 1 1 0 0 | Q | + | Q | −2 |
| D131 | 110000010 0 | FT5u'5q'0 | 1 1 0 0 0 0 0 1 0 0 | T | + | T5u'5q' | −4 |
| D132 | 001000010 0 | DQ4m7q8tFG | 0 0 1 0 0 1 1 1 0 0 | Q | + | Q | −2 |
| D133 | 101000010 0 | FT5u'5q' | 1 0 1 0 0 0 0 1 0 0 | T | + | T5u'5q' | −4 |

FIG. 8D

| Name | ABCDEFGHI K | Coding Class | Primary abcdefghij | DR Class | Pri DR | DB Class | Pri DB |
|---|---|---|---|---|---|---|---|
| D134 | 011000010 0 | FT5u'5q' | 0110000100 | T | + | T5u'5q' | −4 |
| D135 | 111000010 0 | BMK'4c'4t'6t'J | 1110000101 | | ± | MK'4c'4t'6t' | 0 |
| D136 | 000100010 0 | DQ4m7q8tFG | 0001011100 | Q | + | Q | −2 |
| D137 | 100100010 0 | FT5u'5q' | 1001000100 | T | + | T5u'5q' | −4 |
| D138 | 010100010 0 | FT5u'5q' | 0101000100 | T | + | T5u'5q' | −4 |
| D139 | 110100010 0 | BMK'4c'4t'6t'J | 1101000101 | | ± | MK'4c'4t'6t' | 0 |
| D140 | 001100010 0 | FT5u'5q' | 0011000100 | T | + | T5u'5q' | −4 |
| D141 | 101100010 0 | BMK'4c'4t'6t'J | 1011000101 | | ± | MK'4c'4t'6t' | 0 |
| D142 | 011100010 0 | BMK'4c'4t'6t'J | 0111000101 | | ± | MK'4c'4t'6t' | 0 |
| D143 | 111100010 0 | PU4c5c | 1111000100 | U4c5c | − | U4c5c | 0 |
| D144 | 000010010 0 | DQ4t6m'8tAB | 1100100100 | Q | + | Q | −2 |
| D145 | 100010010 0 | FT5u'5q' | 1000100100 | T | + | T5u'5q' | −4 |
| D146 | 010010010 0 | FT5u'5q' | 0100100100 | T | + | T5u'5q' | −4 |
| D147 | 110010010 0 | BMK'4c'4t'6t'J | 1100100101 | | ± | MK'4c'4t'6t' | 0 |
| D148 | 001010010 0 | FT5u'5q' | 0010100100 | T | + | T5u'5q' | −4 |
| D149 | 101010010 0 | BMK'4c'4t'6t'J | 1010100101 | | ± | MK'4c'4t'6t' | 0 |
| D150 | 011010010 0 | BMK'4c'4t'6t'J | 0110100101 | | ± | MK'4c'4t'6t' | 0 |
| D151 | 111010010 0 | BU4c'6c'4t' | 1110100100 | | ± | U4c'6c'4t' | 0 |
| D152 | 000110010 0 | FT5u'5q' | 0001100100 | T | + | T5u'5q' | −4 |
| D153 | 100110010 0 | BMK'4c'4t'6t'J | 1001100101 | | ± | MK'4c'4t'6t' | 0 |
| D154 | 010110010 0 | BMK'4c'4t'6t'J | 0101100101 | | ± | MK'4c'4t'6t' | 0 |
| D155 | 110110010 0 | BU4c'6c'4t' | 1101100100 | | ± | U4c'6c'4t' | 0 |
| D156 | 001110010 0 | BMK'4c'4t'6t'J | 0011100101 | | ± | MK'4c'4t'6t' | 0 |
| D157 | 101110010 0 | BU4c'6c'4t' | 1011100100 | | ± | U4c'6c'4t' | 0 |
| D158 | 011110010 0 | BU4c'6c'4t' | 0111100100 | | ± | U4c'6c'4t' | 0 |
| D159 | 111110010 0 | DC5v6cAD | 0110100100 | C4c | + | C4c | −2 |
| D160 | 000001010 0 | DQ4t6m'8tAB | 1100010100 | Q | + | Q | −2 |
| D161 | 100001010 0 | FT5u'5q' | 1000010100 | T | + | T5u'5q' | −4 |
| D162 | 010001010 0 | FT5u'5q' | 0100010100 | T | + | T5u'5q' | −4 |
| D163 | 110001010 0 | BMK'4c'4t'6t'J | 1100010101 | | ± | MK'4c'4t'6t' | 0 |
| D164 | 001001010 0 | FT5u'5q' | 0010010100 | T | + | T5u'5q' | −4 |
| D165 | 101001010 0 | BMK'4c'4t'6t'J | 1010010101 | | ± | MK'4c'4t'6t' | 0 |
| D166 | 011001010 0 | BMK'4c'4t'6t'J | 0110010101 | | ± | MK'4c'4t'6t' | 0 |
| D167 | 111001010 0 | BU4c'6c'4t' | 1110010100 | | ± | U4c'6c'4t' | 0 |
| D168 | 000101010 0 | FT5u'5q' | 0001010100 | T | + | T5u'5q' | −4 |
| D169 | 100101010 0 | BMK'4c'4t'6t'J | 1001010101 | | ± | MK'4c'4t'6t' | 0 |
| D170 | 010101010 0 | BMK'4c'4t'6t'J | 0101010101 | | ± | MK'4c'4t'6t' | 0 |
| D171 | 110101010 0 | BU4c'6c'4t' | 1101010100 | | ± | U4c'6c'4t' | 0 |
| D172 | 001101010 0 | BMK'4c'4t'6t'J | 0011010101 | | ± | MK'4c'4t'6t' | 0 |
| D173 | 101101010 0 | BU4c'6c'4t' | 1011010100 | | ± | U4c'6c'4t' | 0 |
| D174 | 011101010 0 | BU4c'6c'4t' | 0111010100 | | ± | U4c'6c'4t' | 0 |
| D175 | 111101010 0 | DC4c5c7u'BD | 1010010100 | C4c | + | C4c | −2 |
| D176 | 000011010 0 | FT5u'5q' | 0000110100 | T | + | T5u'5q' | −4 |
| D177 | 100011010 0 | BMK'4c'4t'6t'J | 1000110101 | | ± | MK'4c'4t'6t' | 0 |
| D178 | 010011010 0 | BMK'4c'4t'6t'J | 0100110101 | | ± | MK'4c'4t'6t' | 0 |

FIG. 8E

| Name | ABCDEFGHI K | Coding Class | Primary abcdefghij | DR Class | Pri DR | DB Class | Pri DB |
|---|---|---|---|---|---|---|---|
| D179 | 1100110100 | BU4c'6c'4t' | 1100110100 | | ± | U4c'6c'4t' | 0 |
| D180 | 0010110100 | BMK'4c'4t'6t'J | 0010110101 | | ± | MK'4c'4t'6t' | 0 |
| D181 | 1010110100 | BU4c'6c'4t' | 1010110100 | | ± | U4c'6c'4t' | 0 |
| D182 | 0110110100 | BU4c'6c'4t' | 0110110100 | | ± | U4c'6c'4t' | 0 |
| D183 | 1110110100 | DC4c' | 1110110100 | C4c' | − | C4c' | +2 |
| D184 | 0001110100 | BMK'4c'4t'6t'J | 0001110101 | | ± | MK'4c'4t'6t' | 0 |
| D185 | 1001110100 | BU4c'6c'4t' | 1001110100 | | ± | U4c'6c'4t' | 0 |
| D186 | 0101110100 | BU4c'6c'4t' | 0101110100 | | ± | U4c'6c'4t' | 0 |
| D187 | 1101110100 | DC4c' | 1101110100 | C4c' | − | C4c' | +2 |
| D188 | 0011110100 | BU4c'6c'4t' | 0011110100 | | ± | U4c'6c'4t' | 0 |
| D189 | 1011110100 | DC4c' | 1011110100 | C4 c' | − | C4c' | +2 |
| D190 | 0111110100 | DC4c' | 0111110100 | C4c' | − | C4c' | +2 |
| D191 | 1111110100 | DV6v8vBCF | 1001100100 | V5v | + | V5v | −2 |
| D192 | 0000001100 | DQ4t6m'8tAB | 1100001100 | Q | + | Q | −2 |
| D193 | 1000001100 | FT5u'5q' | 1000001100 | T | + | T5u'5q' | −4 |
| D194 | 0100001100 | FT5u'5q' | 0100001100 | T | + | T5u'5q' | −4 |
| D195 | 1100001100 | BMK'4c'4t'6t'J | 1100001101 | | ± | MK'4c'4t'6t' | 0 |
| D196 | 0010001100 | FT5u'5q' | 0010001100 | T | + | T5u'5q' | −4 |
| D197 | 1010001100 | BMK'4c'4t'6t'J | 1010001101 | | ± | MK'4c'4t'6t' | 0 |
| D198 | 0110001100 | BMK'4c'4t'6t'J | 0110001101 | | ± | MK'4c'4t'6t' | 0 |
| D199 | 1110001100 | BU4c'6c'4t' | 1110001100 | | ± | U4c'6c'4t' | 0 |
| D200 | 0001001100 | FT5u'5q' | 0001001100 | T | + | T5u'5q' | −4 |
| D201 | 1001001100 | BMK'4c'4t'6t'J | 1001001101 | | ± | MK'4c'4t'6t' | 0 |
| D202 | 0101001100 | BMK'4c'4t'6t'J | 0101001101 | | ± | MK'4c'4t'6t' | 0 |
| D203 | 1101001100 | BU4c'6c'4t' | 1101001100 | | ± | U4c'6c'4t' | 0 |
| D204 | 0011001100 | BMK'4c'4t'6t'J | 0011001101 | | ± | MK'4c'4t'6t' | 0 |
| D205 | 1011001100 | BU4c'6c'4t' | 1011001100 | | ± | U4c'6c'4t' | 0 |
| D206 | 0111001100 | BU4c'6c'4t' | 0111001100 | | ± | U4c'6c'4t' | 0 |
| D207 | 1111001100 | DC4c5c7u'BD | 1010001100 | C4c | + | C4c | −2 |
| D208 | 0000101100 | FT5u'5q' | 0000101100 | T | + | T5u'5q' | −4 |
| D209 | 1000101100 | BMK'4c'4t'6t'J | 1000101101 | | ± | MK'4c'4t'6t' | 0 |
| D210 | 0100101100 | BMK'4c'4t'6t'J | 0100101101 | | ± | MK'4c'4t'6t' | 0 |
| D211 | 1100101100 | BU4c'6c'4t' | 1100101100 | | ± | U4c'6c'4t' | 0 |
| D212 | 0010101100 | BMK'4c'4t'6t'J | 0010101101 | | ± | MK'4c'4t'6t' | 0 |
| D213 | 1010101100 | BU4c'6c'4t' | 1010101100 | | ± | U4c'6c'4t' | 0 |
| D214 | 0110101100 | BU4c'6c'4t' | 0110101100 | | ± | U4c'6c'4t' | 0 |
| D215 | 1110101100 | DC4c' | 1110101100 | C4c' | − | C4c' | +2 |
| D216 | 0001101100 | BMK'4c'4t'6t'J | 0001101101 | | ± | MK'4c'4t'6t' | 0 |
| D217 | 1001101100 | BU4c'6c'4t' | 1001101100 | | ± | U4c'6c'4t' | 0 |
| D218 | 0101101100 | BU4c'6c'4t' | 0101101100 | | ± | U4c'6c'4t' | 0 |
| D219 | 1101101100 | DC4c' | 1101101100 | C4c' | − | C4c' | +2 |
| D220 | 0011101100 | BU4c'6c'4t' | 0011101100 | | ± | U4c'6c'4t' | 0 |
| D221 | 1011101100 | DC4c' | 1011101100 | C4c' | − | C4c' | +2 |
| D222 | 0111101100 | DC4c' | 0111101100 | C4c' | − | C4c' | +2 |
| D223 | 1111101100 | DV5v6c7vBC E | 1001001100 | V5v | + | V5v | −2 |

*FIG. 8F*

| Name | ABCDEFGHI K | Coding Class | Primary abcdefghij | DR Class | Pri DR | DB Class | Pri DB |
|---|---|---|---|---|---|---|---|
| D224 | 0000011100 | DT5q8mCEF | 0010101100 | T | + | T5q | -2 |
| D225 | 1000011100 | BMK'4c'4t'6t'J | 1000011101 |  | ± | MK'4c'4t'6t' | 0 |
| D226 | 0100011100 | BMK'4c'4t'6t'J | 0100011101 |  | ± | MK'4c'4t'6t' | 0 |
| D227 | 1100011100 | BU4c'6c'4t' | 1100011100 |  | ± | U4c'6c'4t' | 0 |
| D228 | 0010011100 | BMK'4c'4t'6t'J | 0010011101 |  | ± | MK'4c'4t'6t' | 0 |
| D229 | 1010011100 | BU4c'6c'4t' | 1010011100 |  | ± | U4c'6c'4t' | 0 |
| D230 | 0110011100 | BU4c'6c'4t' | 0110011100 |  | ± | U4c'6c'4t' | 0 |
| D231 | 1110011100 | DC4c' | 1110011100 | C4c' | − | C4c' | +2 |
| D232 | 0001011100 | BMK'4c'4t'6t'J | 0001011101 |  | ± | MK'4c'4t'6t' | 0 |
| D233 | 1001011100 | BU4c'6c'4t' | 1001011100 |  | ± | U4c'6c'4t' | 0 |
| D234 | 0101011100 | BU4c'6c'4t' | 0101011100 |  | ± | U4c'6c'4t' | 0 |
| D235 | 1101011100 | DC4c' | 1101011100 | C4c' | − | C4c' | +2 |
| D236 | 0011011100 | BU4c'6c'4t' | 0011011100 |  | ± | U4c'6c'4t' | 0 |
| D237 | 1011011100 | DC4c' | 1011011100 | C4c' | − | C4c' | +2 |
| D238 | 0111011100 | DC4c' | 0111011100 | C4c' | − | C4c' | +2 |
| D239 | 1111011100 | DV4c5c8vABF | 0011001100 | V8v | + | V8v | -2 |
| D240 | 0000111100 | DM4t8bDGHI | 0001110010 | M4t | + | M4t | -2 |
| D241 | 1000111100 | BU4c'6c'4t' | 1000111100 |  | ± | U4c'6c'4t' | 0 |
| D242 | 0100111100 | BU4c'6c'4t' | 0100111100 |  | ± | U4c'6c'4t' | 0 |
| D243 | 1100111100 | DC4c' | 1100111100 | C4c' | − | C4c' | +2 |
| D244 | 0010111100 | BU4c'6c'4t' | 0010111100 |  | ± | U4c'6c'4t' | 0 |
| D245 | 1010111100 | DC4c' | 1010111100 | C4c' | − | C4c' | +2 |
| D246 | 0110111100 | DC4c' | 0110111100 | C4c' | − | C4c' | +2 |
| D247 | 1110111100 | FV4u8v | 1110111100 | V4u8v | − | V4u8v | +4 |
| D248 | 0001111100 | BU4c'6c'4t' | 0001111100 |  | ± | U4c'6c'4t' | 0 |
| D249 | 1001111100 | DC4c' | 1001111100 | C4c' | − | C4c' | +2 |
| D250 | 0101111100 | DC4c' | 0101111100 | C4c' | − | C4c' | +2 |
| D251 | 1101111100 | FV4u8v | 1101111100 | V4u8v | − | V4u8v | +4 |
| D252 | 0011111100 | DC4c' | 0011111100 | C4c' | − | C4c' | +2 |
| D253 | 1011111100 | FV4u8v | 1011111100 | V4u8v | − | V4u8v | +4 |
| D254 | 0111111100 | FV4u8v | 0111111100 | V4u8v | − | V4u8v | +4 |
| D255 | 1111111100 | DH8hBDFG | 1010100100 | H | + | H | -2 |
| D256 | 0000000010 | DS8sCEG | 0010101010 | S | + | S | -2 |
| D257 | 1000000010 | DQ4m8qFG | 1000011010 | Q | + | Q | -2 |
| D258 | 0100000010 | DQ4m8qFG | 0100011010 | Q | + | Q | -2 |
| D259 | 1100000010 | FT5u'5q' | 1100000010 | T | + | T5u'5q' | -4 |
| D260 | 0010000010 | DQ4m8qFG | 0010011010 | Q | + | Q | -2 |
| D261 | 1010000010 | FT5u'5q' | 1010000010 | T | + | T5u'5q' | -4 |
| D262 | 0110000010 | FT5u'5q' | 0110000010 | T | + | T5u'5q' | -4 |
| D263 | 1110000010 | BMK'4c'4t'6t'J | 1110000011 |  | ± | MK'4c'4t'6t' | 0 |
| D264 | 0001000010 | DQ4m8qFG | 0001011010 | Q | + | Q | -2 |
| D265 | 1001000010 | FT5u'5q' | 1001000010 | T | + | T5u'5q' | -4 |
| D266 | 0101000010 | FT5u'5q' | 0101000010 | T | + | T5u'5q' | -4 |
| D267 | 1101000010 | BMK'4c'4t'6t'J | 1101000011 |  | ± | MK'4c'4t'6t' | 0 |
| D268 | 0011000010 | FT5u'5q' | 0011000010 | T | + | T5u'5q' | -4 |

FIG. 8G

| Name | ABCDEFGHI K | Coding Class | Primary abcdefghij | DR Class | Pri DR | DB Class | Pri DB |
|---|---|---|---|---|---|---|---|
| D269 | 1011000010 | BMK'4c'4t'6t'J | 1011000011 | | ± | MK'4c'4t'6t' | 0 |
| D270 | 0111000010 | BMK'4c'4t'6t'J | 0111000011 | | ± | MK'4c'4t'6t' | 0 |
| D271 | 1111000010 | PU4c5c | 1111000010 | U4c5c | − | U4c5c | 0 |
| D272 | 0000100010 | DQ4t5t8qAG | 1000101010 | Q | + | Q | −2 |
| D273 | 1000100010 | FT5u'5q' | 1000100010 | T | + | T5u'5q' | −4 |
| D274 | 0100100010 | FT5u'5q' | 0100100010 | T | + | T5u'5q' | −4 |
| D275 | 1100100010 | BMK'4c'4t'6t'J | 1100100011 | | ± | MK'4c'4t'6t' | 0 |
| D276 | 0010100010 | FT5u'5q' | 0010100010 | T | + | T5u'5q' | −4 |
| D277 | 1010100010 | BMK'4c'4t'6t'J | 1010100011 | | ± | MK'4c'4t'6t' | 0 |
| D278 | 0110100010 | BMK'4c'4t'6t'J | 0110100011 | | ± | MK'4c'4t'6t' | 0 |
| D279 | 1110100010 | BU4c'6c'4t' | 1110100010 | | ± | U4c'6c'4t' | 0 |
| D280 | 0001100010 | FT5u'5q' | 0001100010 | T | + | T5u'5q' | −4 |
| D281 | 1001100010 | BMK'4c'4t'6t'J | 1001100011 | | ± | MK'4c'4t'6t' | 0 |
| D282 | 0101100010 | BMK'4c'4t'6t'J | 0101100011 | | ± | MK'4c'4t'6t' | 0 |
| D283 | 1101100010 | BU4c'6c'4t' | 1101100010 | | ± | U4c'6c'4t' | 0 |
| D284 | 0011100010 | BMK'4c'4t'6t'J | 0011100011 | | ± | MK'4c'4t'6t' | 0 |
| D285 | 1011100010 | BU4c'6c'4t' | 1011100010 | | ± | U4c'6c'4t' | 0 |
| D286 | 0111100010 | BU4c'6c'4t' | 0111100010 | | ± | U4c'6c'4t' | 0 |
| D287 | 1111100010 | DC5v6cAD | 0110100010 | C4c | + | C4c | −2 |
| D288 | 0000010010 | DQ5q7q8qAB | 1100010010 | Q | + | Q | −2 |
| D289 | 1000010010 | FT5u'5q' | 1000010010 | T | + | T5u'5q' | −4 |
| D290 | 0100010010 | FT5u'5q' | 0100010010 | T | + | T5u'5q' | −4 |
| D291 | 1100010010 | BMK'4c'4t'6t'J | 1100010011 | | ± | MK'4c'4t'6t' | 0 |
| D292 | 0010010010 | FT5u'5q' | 0010010010 | T | + | T5u'5q' | −4 |
| D293 | 1010010010 | BMK'4c'4t'6t'J | 1010010011 | | ± | MK'4c'4t'6t' | 0 |
| D294 | 0110010010 | BMK'4c'4t'6t'J | 0110010011 | | ± | MK'4c'4t'6t' | 0 |
| D295 | 1110010010 | BU4c'6c'4t' | 1110010010 | | ± | U4c'6c'4t' | 0 |
| D296 | 0001010010 | FT5u'5q' | 0001010010 | T | + | T5u'5q' | −4 |
| D297 | 1001010010 | BMK'4c'4t'6t'J | 1001010011 | | ± | MK'4c'4t'6t' | 0 |
| D298 | 0101010010 | BMK'4c'4t'6t'J | 0101010011 | | ± | MK'4c'4t'6t' | 0 |
| D299 | 1101010010 | BU4c'6c'4t' | 1101010010 | | ± | U4c'6c'4t' | 0 |
| D300 | 0011010010 | BMK'4c'4t'6t'J | 0011010011 | | ± | MK'4c'4t'6t' | 0 |
| D301 | 1011010010 | BU4c'6c'4t' | 1011010010 | | ± | U4c'6c'4t' | 0 |
| D302 | 0111010010 | BU4c'6c'4t' | 0111010010 | | ± | U4c'6c'4t' | 0 |
| D303 | 1111010010 | DC4c5c7u'BD | 1010010010 | C4c | + | C4c | −2 |
| D304 | 0000110010 | FT5u'5q' | 0000110010 | T | + | T5u'5q' | −4 |
| D305 | 1000110010 | BMK'4c'4t'6t'J | 1000110011 | | ± | MK'4c'4t'6t' | 0 |
| D306 | 0100110010 | BMK'4c'4t'6t'J | 0100110011 | | ± | MK'4c'4t'6t' | 0 |
| D307 | 1100110010 | BU4c'6c'4t' | 1100110010 | | ± | U4c'6c'4t' | 0 |
| D308 | 0010110010 | BMK'4c'4t'6t'J | 0010110011 | | ± | MK'4c'4t'6t' | 0 |
| D309 | 1010110010 | BU4c'6c'4t' | 1010110010 | | ± | U4c'6c'4t' | 0 |
| D310 | 0110110010 | BU4c'6c'4t' | 0110110010 | | ± | U4c'6c'4t' | 0 |
| D311 | 1110110010 | DC4c' | 1110110010 | C4c' | − | C4c' | +2 |
| D312 | 0001110010 | BMK'4c'4t'6t'J | 0001110011 | | ± | MK'4c'4t'6t' | 0 |
| D313 | 1001110010 | BU4c'6c'4t' | 1001110010 | | ± | U4c'6c'4t' | 0 |

FIG. 8H

| Name | ABCDEFGHI K | Coding Class | Primary abcdefghij | DR Class | Pri DR | DB Class | Pri DB |
|---|---|---|---|---|---|---|---|
| D314 | 0101110010 | BU4c'6c'4t' | 0101110010 |  | ± | U4c'6c'4t' | 0 |
| D315 | 1101110010 | DC4c' | 1101110010 | C4c' | − | C4c' | +2 |
| D316 | 0011110010 | BU4c'6c'4t' | 0011110010 |  | ± | U4c'6c'4t' | 0 |
| D317 | 1011110010 | DC4c' | 1011110010 | C4c' | − | C4c' | +2 |
| D318 | 0111110010 | DC4c' | 0111110010 | C4c' | − | C4c' | +2 |
| D319 | 1111110010 | DV6v8cBCE | 1001010010 | V5v | + | V5v | −2 |
| D320 | 0000001010 | DQ5q7q8qAB | 1100001010 | Q | + | Q | −2 |
| D321 | 1000001010 | FT5u'5q' | 1000001010 | T | + | T5u'5q' | −4 |
| D322 | 0100001010 | FT5u'5q' | 0100001010 | T | + | T5u'5q' | −4 |
| D323 | 1100001010 | BMK'4c'4t'6t'J | 1100001011 |  | ± | MK'4c'4t'6t' | 0 |
| D324 | 0010001010 | FT5u'5q' | 0010001010 | T | + | T5u'5q' | −4 |
| D325 | 1010001010 | BMK'4c'4t'6t'J | 1010001011 |  | ± | MK'4c'4t'6t' | 0 |
| D326 | 0110001010 | BMK'4c'4t'6t'J | 0110001011 |  | ± | MK'4c'4t'6t' | 0 |
| D327 | 1110001010 | BU4c'6c'4t' | 1110001010 |  | ± | U4c'6c'4t' | 0 |
| D328 | 0001001010 | FT5u'5q' | 0001001010 | T | + | T5u'5q' | −4 |
| D329 | 1001001010 | BMK'4c'4t'6t'J | 1001001011 |  | ± | MK'4c'4t'6t' | 0 |
| D330 | 0101001010 | BMK'4c'4t'6t'J | 0101001011 |  | ± | MK'4c'4t'6t' | 0 |
| D331 | 1101001010 | BU4c'6c'4t' | 1101001010 |  | ± | U4c'6c'4t' | 0 |
| D332 | 0011001010 | BMK'4c'4t'6t'J | 0011001011 |  | ± | MK'4c'4t'6t' | 0 |
| D333 | 1011001010 | BU4c'6c'4t' | 1011001010 |  | ± | U4c'6c'4t' | 0 |
| D334 | 0111001010 | BU4c'6c'4t' | 0111001010 |  | ± | U4c'6c'4t' | 0 |
| D335 | 1111001010 | DC4c6u8uDI | 1110001000 | C4c | + | C4c | −2 |
| D336 | 0000101010 | FT5u'5q' | 0000101010 | T | + | T5u'5q' | −4 |
| D337 | 1000101010 | BMK'4c'4t'6t'J | 1000101011 |  | ± | MK'4c'4t'6t' | 0 |
| D338 | 0100101010 | BMK'4c'4t'6t'J | 0100101011 |  | ± | MK'4c'4t'6t' | 0 |
| D339 | 1100101010 | BU4c'6c'4t' | 1100101010 |  | ± | U4c'6c'4t' | 0 |
| D340 | 0010101010 | BMK'4c'4t'6t'J | 0010101011 |  | ± | MK'4c'4t'6t' | 0 |
| D341 | 1010101010 | BU4c'6c'4t' | 1010101010 |  | ± | U4c'6c'4t' | 0 |
| D342 | 0110101010 | BU4c'6c'4t' | 0110101010 |  | ± | U4c'6c'4t' | 0 |
| D343 | 1110101010 | DC4c' | 1110101010 | C4c' | − | C4c' | +2 |
| D344 | 0001101010 | BMK'4c'4t'6t'J | 0001101011 |  | ± | MK'4c'4t'6t' | 0 |
| D345 | 1001101010 | BU4c'6c'4t' | 1001101010 |  | ± | U4c'6c'4t' | 0 |
| D346 | 0101101010 | BU4c'6c'4t' | 0101101010 |  | ± | U4c'6c'4t' | 0 |
| D347 | 1101101010 | DC4c' | 1101101010 | C4c' | − | C4c' | +2 |
| D348 | 0011101010 | BU4c'6c'4t' | 0011101010 |  | ± | U4c'6c'4t' | 0 |
| D349 | 1011101010 | DC4c' | 1011101010 | C4c' | − | C4c' | +2 |
| D350 | 0111101010 | DC4c' | 0111101010 | C4c' | − | C4c' | +2 |
| D351 | 1111101010 | DV5v6c7vBC E | 1001001010 | V5v | + | V5v | −2 |
| D352 | 0000011010 | DT5q7t8tACF | 1010001010 | T | + | T5q | −2 |
| D353 | 1000011010 | BMK'4c'4t'6t'J | 1000011011 |  | ± | MK'4c'4t'6t' | 0 |
| D354 | 0100011010 | BMK'4c'4t'6t'J | 0100011011 |  | ± | MK'4c'4t'6t' | 0 |
| D355 | 1100011010 | BU4c'6c'4t' | 1100011010 |  | ± | U4c'6c'4t' | 0 |
| D356 | 0010011010 | BMK'4c'4t'6t'J | 0010011011 |  | ± | MK'4c'4t'6t' | 0 |
| D357 | 1010011010 | BU4c'6c'4t' | 1010011010 |  | ± | U4c'6c'4t' | 0 |
| D358 | 0110011010 | BU4c'6c'4t' | 0110011010 |  | ± | U4c'6c'4t' | 0 |

FIG. 8I

| Name | ABCDEFGHI K | Coding Class | Primary abcdefghij | DR Class | Pri DR | DB Class | Pri DB |
|---|---|---|---|---|---|---|---|
| D359 | 1110011010 | DC4c' | 1110011010 | C4c' | − | C4c' | +2 |
| D360 | 0001011010 | BMK'4c'4t'6t'J | 0001011011 | | ± | MK'4c'4t'6t' | 0 |
| D361 | 1001011010 | BU4c'6c'4t' | 1001011010 | | ± | U4c'6c'4t' | 0 |
| D362 | 0101011010 | BU4c'6c'4t' | 0101011010 | | ± | U4c'6c'4t' | 0 |
| D363 | 1101011010 | DC4c' | 1101011010 | C4c' | − | C4c' | +2 |
| D364 | 0011011010 | BU4c'6c'4t' | 0011011010 | | ± | U4c'6c'4t' | 0 |
| D365 | 1011011010 | DC4c' | 1011011010 | C4c' | − | C4c' | +2 |
| D366 | 0111011010 | DC4c' | 0111011010 | C4c' | − | C4c' | +2 |
| D367 | 1111011010 | FV5v'8v' | 1111011010 | V5v'8v' | − | V5v'8v' | +4 |
| D368 | 0000111010 | DM4t5t8mDI | 0001111000 | M4t | + | M4t | −2 |
| D369 | 1000111010 | BU4c'6c'4t' | 1000111010 | | ± | U4c'6c'4t' | 0 |
| D370 | 0100111010 | BU4c'6c'4t' | 0100111010 | | ± | U4c'6c'4t' | 0 |
| D371 | 1100111010 | DC4c' | 1100111010 | C4c' | − | C4c' | +2 |
| D372 | 0010111010 | BU4c'6c'4t' | 0010111010 | | ± | U4c'6c'4t' | 0 |
| D373 | 1010111010 | DC4c' | 1010111010 | C4c' | − | C4c' | +2 |
| D374 | 0110111010 | DC4c' | 0110111010 | C4c' | − | C4c' | +2 |
| D375 | 1110111010 | FV5v'8v' | 1110111010 | V5v'8v' | − | V5v'8v' | +4 |
| D376 | 0001111010 | BU4c'6c'4t' | 0001111010 | | ± | U4c'6c'4t' | 0 |
| D377 | 1001111010 | DC4c' | 1001111010 | C4c' | − | C4c' | +2 |
| D378 | 0101111010 | DC4c' | 0101111010 | C4c' | − | C4c' | +2 |
| D379 | 1101111010 | FV5v'8v' | 1101111010 | V5v'8v' | − | V5v'8v' | +4 |
| D380 | 0011111010 | DC4c' | 0011111010 | C4c' | − | C4c' | +2 |
| D381 | 1011111010 | FV5v'8v' | 1011111010 | V5v'8v' | − | V5v'8v' | +4 |
| D382 | 0111111010 | FV5v'8v' | 0111111010 | V5v'8v' | − | V5v'8v' | +4 |
| D383 | 111111101 | DH7h8vBDFI | 1010101000 | H | + | H | −2 |
| D384 | 0000000110 | DQ7sBDFH | 0101010010 | Q | + | Q | −2 |
| D385 | 1000000110 | FT5u'5q' | 1000000110 | T | + | T5u'5q' | −4 |
| D386 | 0100000110 | FT5u'5q' | 0100000110 | T | + | T5u'5q' | −4 |
| D387 | 1100000110 | BMK'4c'4t'6t'J | 1100000111 | | ± | MK'4c'4t'6t' | 0 |
| D388 | 0010000110 | FT5u'5q' | 0010000110 | T | + | T5u'5q' | −4 |
| D389 | 1010000110 | BMK'4c'4t'6t'J | 1010000111 | | ± | MK'4c'4t'6t' | 0 |
| D390 | 0110000110 | BMK'4c'4t'6t'J | 0110000111 | | ± | MK'4c'4t'6t' | 0 |
| D391 | 1110000110 | BU4c'6c'4t' | 1110000110 | | ± | U4c'6c'4t' | 0 |
| D392 | 0001000110 | FT5u'5q' | 0001000110 | T | + | T5u'5q' | −4 |
| D393 | 1001000110 | BMK'4c'4t'6t'J | 1001000111 | | ± | MK'4c'4t'6t' | 0 |
| D394 | 0101000110 | BMK'4c'4t'6t'J | 0101000111 | | ± | MK'4c'4t'6t' | 0 |
| D395 | 1101000110 | BU4c'6c'4t' | 1101000110 | | ± | U4c'6c'4t' | 0 |
| D396 | 0011000110 | BMK'4c'4t'6t'J | 0011000111 | | ± | MK'4c'4t'6t' | 0 |
| D397 | 1011000110 | BU4c'6c'4t' | 1011000110 | | ± | U4c'6c'4t' | 0 |
| D398 | 0111000110 | BU4c'6c'4t' | 0111000110 | | ± | U4c'6c'4t' | 0 |
| D399 | 1111000110 | DC4c6u8uDI | 1110000100 | C4c | + | C4c | −2 |
| D400 | 0000100110 | FT5u'5q' | 0000100110 | FT | + | T5u'5q' | −4 |
| D401 | 1000100110 | BMK'4c'4t'6t'J | 1000100111 | | ± | MK'4c'4t'6t' | 0 |
| D402 | 0100100110 | BMK'4c'4t'6t'J | 0100100111 | | ± | MK'4c'4t'6t' | 0 |
| D403 | 1100100110 | BU4c'6c'4t' | 1100100110 | | ± | U4c'6c'4t' | 0 |

FIG. 8J

| Name | ABCDEFGHI K | Coding Class | Primary abcdefghij | DR Class | Pri DR | DB Class | Pri DB |
|---|---|---|---|---|---|---|---|
| D404 | 0010100110 | BMK'4c'4t'6t'J | 0010100111 | | ± | MK'4c'4t'6t' | 0 |
| D405 | 1010100110 | BU4c'6c'4t' | 1010100110 | | ± | U4c'6c'4t' | 0 |
| D406 | 0110100110 | BU4c'6c'4t' | 0110100110 | | ± | U4c'6c'4t' | 0 |
| D407 | 1110100110 | DC4c' | 1110100110 | C4c' | − | C4c' | +2 |
| D408 | 0001100110 | BMK'4c'4t'6t'J | 0001100111 | | ± | MK'4c'4t'6t' | 0 |
| D409 | 1001100110 | BU4c'6c'4t' | 1001100110 | | ± | U4c'6c'4t' | 0 |
| D410 | 0101100110 | BU4c'6c'4t' | 0101100110 | | ± | U4c'6c'4t' | 0 |
| D411 | 1101100110 | DC4c' | 1101100110 | C4c' | − | C4c' | +2 |
| D412 | 0011100110 | BU4c'6c'4t' | 0011100110 | | ± | U4c'6c'4t' | 0 |
| D413 | 1011100110 | DC4c' | 1011100110 | C4c' | − | C4c' | +2 |
| D414 | 0111100110 | DC4c' | 0111100110 | C4c' | − | C4c' | +2 |
| D415 | 1111100110 | DV5v7cABI | 0011100100 | V5v | + | V5v | −2 |
| D416 | 0000010110 | DT5q6t7qADI | 1001010100 | T | + | T5q | −2 |
| D417 | 1000010110 | BMK'4c'4t'6t'J | 1000010111 | | ± | MK'4c'4t'6t' | 0 |
| D418 | 0100010110 | BMK'4c'4t'6t'J | 0100010111 | | ± | MK'4c'4t'6t' | 0 |
| D419 | 1100010110 | BU4c'6c'4t' | 1100010110 | | ± | U4c'6c'4t' | 0 |
| D420 | 0010010110 | BMK'4c'4t'6t'J | 0010010111 | | ± | MK'4c'4t'6t' | 0 |
| D421 | 1010010110 | BU4c'6c'4t' | 1010010110 | | ± | U4c'6c'4t' | 0 |
| D422 | 0110010110 | BU4c'6c'4t' | 0110010110 | | ± | U4c'6c'4t' | 0 |
| D423 | 1110010110 | DC4c' | 1110010110 | C4c' | − | C4c' | +2 |
| D424 | 0001010110 | BMK'4c'4t'6t'J | 0001010111 | | ± | MK'4c'4t'6t' | 0 |
| D425 | 1001010110 | BU4c'6c'4t' | 1001010110 | | ± | U4c'6c'4t' | 0 |
| D426 | 0101010110 | BU4c'6c'4t' | 0101010110 | | ± | U4c'6c'4t' | 0 |
| D427 | 1101010110 | DC4c' | 1101010110 | C4c' | − | C4c' | +2 |
| D428 | 0011010110 | BU4c'6c'4t' | 0011010110 | | ± | U4c'6c'4t' | 0 |
| D429 | 1011010110 | DC4c' | 1011010110 | C4c' | − | C4c' | +2 |
| D430 | 0111010110 | DC4c' | 0111010110 | C4c' | − | C4c' | +2 |
| D431 | 1111010110 | FV5v'8v' | 1111010110 | V5v'8v' | − | V5v'8v' | +4 |
| D432 | 0000110110 | DM4t5t8mDI | 0001110100 | M4t | + | M4t | −2 |
| D433 | 1000110110 | BU4c'6c'4t' | 1000110110 | | ± | U4c'6c'4t' | 0 |
| D434 | 0100110110 | BU4c'6c'4t' | 0100110110 | | ± | U4c'6c'4t' | 0 |
| D435 | 1100110110 | DC4c' | 1100110110 | C4c' | − | C4c' | +2 |
| D436 | 0010110110 | BU4c'6c'4t' | 0010110110 | | ± | U4c'6c'4t' | 0 |
| D437 | 1010110110 | DC4c' | 1010110110 | C4c' | − | C4c' | +2 |
| D438 | 0110110110 | DC4c' | 0110110110 | C4c' | − | C4c' | +2 |
| D439 | 1110110110 | FV5v'8v' | 1110110110 | V5v'8v' | − | V5v'8v' | +4 |
| D440 | 0001110110 | BU4c'6c'4t' | 0001110110 | | ± | U4c'6c'4t' | 0 |
| D441 | 1001110110 | DC4c' | 1001110110 | C4c' | − | C4c' | +2 |
| D442 | 0101110110 | DC4c' | 0101110110 | C4c' | − | C4c' | +2 |
| D443 | 1101110110 | FV5v'8v' | 1101110110 | V5v'8v' | − | V5v'8v' | +4 |
| D444 | 0011110110 | DC4c' | 0011110110 | C4c' | − | C4c' | +2 |
| D445 | 1011110110 | FV5v'8v' | 1011110110 | V5v'8v' | − | V5v'8v' | +4 |
| D446 | 0111110110 | FV5v'8v' | 0111110110 | V5v'8v' | − | V5v'8v' | +4 |
| D447 | 1111110110 | DH6v7vAEFI | 0111000100 | H | + | H | −2 |
| D448 | 0000001110 | DT6qDEH | 0001101010 | T | + | T5q | −2 |

FIG. 8K

| Name | ABCDEFGHI K | Coding Class | Primary abcdefghij | DR Class | Pri DR | DB Class | Pri DB |
|---|---|---|---|---|---|---|---|
| D449 | 1000001111 0 | DM4m6t | 1000001110 | M6t | + | M6t | -2 |
| D450 | 0100001111 0 | DM4m6t | 0100001110 | M6t | + | M6t | -2 |
| D451 | 1100001111 0 | BU4c'6c'4t' | 1100001110 | | ± | U4c'6c'4t' | 0 |
| D452 | 0010001111 0 | DM4m6t | 0010001110 | M6t | + | M6t | -2 |
| D453 | 1010001111 0 | BU4c'6c'4t' | 1010001110 | | ± | U4c'6c'4t' | 0 |
| D454 | 0110001111 0 | BU4c'6c'4t' | 0110001110 | | ± | U4c'6c'4t' | 0 |
| D455 | 1110001111 0 | DC4c' | 1110001110 | C4c' | − | C4c' | +2 |
| D456 | 0001001111 0 | DM4m6t | 0001001110 | M6t | + | M6t | -2 |
| D457 | 1001001111 0 | BU4c'6c'4t' | 1001001110 | | ± | U4c'6c'4t' | 0 |
| D458 | 0101001111 0 | BU4c'6c'4t' | 0101001110 | | ± | U4c'6c'4t' | 0 |
| D459 | 1101001111 0 | DC4c' | 1101001110 | C4c' | − | C4c' | +2 |
| D460 | 0011001111 0 | BU4c'6c'4t' | 0011001110 | | ± | U4c'6c'4t' | 0 |
| D461 | 1011001111 0 | DC4c' | 1011001110 | C4c' | − | C4c' | +2 |
| D462 | 0111001111 0 | DC4c' | 0111001110 | C4c' | − | C4c' | +2 |
| D463 | 1111001111 0 | FV5v'8v' | 1111001110 | V5v'8v' | − | V5v'8v' | +4 |
| D464 | 0000101111 0 | DM4t5t8mDI | 0001101100 | M4t | + | M4t | -2 |
| D465 | 1000101111 0 | BU4c'6c'4t' | 1000101110 | | ± | U4c'6c'4t' | 0 |
| D466 | 0100101111 0 | BU4c'6c'4t' | 0100101110 | | ± | U4c'6c'4t' | 0 |
| D467 | 1100101111 0 | DC4c' | 1100101110 | C4c' | − | C4c' | +2 |
| D468 | 0010101111 0 | BU4c'6c'4t' | 0010101110 | | ± | U4c'6c'4t' | 0 |
| D469 | 1010101111 0 | DC4c' | 1010101110 | C4c' | − | C4c' | +2 |
| D470 | 0110101111 0 | DC4c' | 0110101110 | C4c' | − | C4c' | +2 |
| D471 | 1110101111 0 | FV5v'8v' | 1110101110 | V5v'8v' | − | V5v'8v' | +4 |
| D472 | 0001101111 0 | BU4c'6c'4t' | 0001101110 | | ± | U4c'6c'4t' | 0 |
| D473 | 1001101111 0 | DC4c' | 1001101110 | C4c' | − | C4c' | +2 |
| D474 | 0101101111 0 | DC4c' | 0101101110 | C4c' | − | C4c' | +2 |
| D475 | 1101101111 0 | FV5v'8v' | 1101101110 | V5v'8v' | − | V5v'8v' | +4 |
| D476 | 0011101111 0 | DC4c' | 0011101110 | C4c' | − | C4c' | +2 |
| D477 | 1011101111 0 | FV5v'8v' | 1011101110 | V5v'8v' | − | V5v'8v' | +4 |
| D478 | 0111101111 0 | FV5v'8v' | 0111101110 | V5v'8v' | − | V5v'8v' | +4 |
| D479 | 1111101111 0 | DH5v6cBEHI | 1011001000 | H | + | H | -2 |
| D480 | 0000011111 0 | DM5qAEHI | 1000111000 | M4t | + | M4t | -2 |
| D481 | 1000011111 0 | BU4c'6c'4t' | 1000011110 | | ± | U4c'6c'4t' | 0 |
| D482 | 0100011111 0 | BU4c'6c'4t' | 0100011110 | | ± | U4c'6c'4t' | 0 |
| D483 | 1100011111 0 | DC4c' | 1100011110 | C4c' | − | C4c' | +2 |
| D484 | 0010011111 0 | BU4c'6c'4t' | 0010011110 | | ± | U4c'6c'4t' | 0 |
| D485 | 1010011111 0 | DC4c' | 1010011110 | C4c' | − | C4c' | +2 |
| D486 | 0110011111 0 | DC4c' | 0110011110 | C4c' | − | C4c' | +2 |
| D487 | 1110011111 0 | FV5v'8v' | 1110011110 | V5v'8v' | − | V5v'8v' | +4 |
| D488 | 0001011111 0 | BU4c'6c'4t' | 0001011110 | | ± | U4c'6c'4t' | 0 |
| D489 | 1001011111 0 | DC4c' | 1001011110 | C4c' | − | C4c' | +2 |
| D490 | 0101011111 0 | DC4c' | 0101011110 | C4c' | − | C4c' | +2 |
| D491 | 1101011111 0 | FV5v'8v' | 1101011110 | V5v'8v' | − | V5v'8v' | +4 |
| D492 | 0011011111 0 | DC4c' | 0011011110 | C4c' | − | C4c' | +2 |
| D493 | 1011011111 0 | FV5v'8v' | 1011011110 | V5v'8v' | − | V5v'8v' | +4 |
| D494 | 0111011111 0 | FV5v'8v' | 0111011110 | V5v'8v' | − | V5v'8v' | +4 |

FIG. 8L

| Name | ABCDEFGHI K | Coding Class | Primary abcdefghij | DR Class | Pri DR | DB Class | Pri DB |
|---|---|---|---|---|---|---|---|
| D495 | 1111011110 | DH4c5cABGI | 0011010100 | H | + | H | -2 |
| D496 | 0000111110 | PU4t | 0000111110 | U4t | − | U4t | 0 |
| D497 | 1000111110 | DC4c' | 1000111110 | C4c' | − | C4c' | +2 |
| D498 | 0100111110 | DC4c' | 0100111110 | C4c' | − | C4c' | +2 |
| D499 | 1100111110 | FV5v'8v' | 1100111110 | V5v'8v' | − | V5v'8v' | +4 |
| D500 | 0010111110 | DC4c' | 0010111110 | C4c' | − | C4c' | +2 |
| D501 | 1010111110 | FV5v'8v' | 1010111110 | V5v'8v' | − | V5v'8v' | +4 |
| D502 | 0110111110 | FV5v'8v' | 0110111110 | V5v'8v' | − | V5v'8v' | +4 |
| D503 | 1110111110 | DH3c4uACFH | 0100101010 | H | + | H | -2 |
| D504 | 0001111110 | DC4c' | 0001111110 | C4c' | − | C4c' | +2 |
| D505 | 1001111110 | FV5v'8v' | 1001111110 | V5v'8v' | − | V5v'8v' | +4 |
| D506 | 0101111110 | FV5v'8v' | 0101111110 | V5v'8v' | − | V5v'8v' | +4 |
| D507 | 1101111110 | DH1u3uADG H | 0100110010 | H | + | H | -2 |
| D508 | 0011111110 | DVK'2mFHI | 0011101000 | VK'2m | + | VK'2m | -2 |
| D509 | 1011111110 | DH1u3uADG H | 0010110010 | H | + | H | -2 |
| D510 | 0111111110 | D H1mBDGI | 0010110100 | H | + | H | -2 |
| D511 | 1111111110 | DXACFHI | 0101101000 | X | + | X | -2 |
| K39 | 1110010001 | DMK | 1110010000 | MK | + | MK | -2 |
| K43 | 1101010001 | DMK | 1101010000 | MK | + | MK | -2 |
| K45 | 1011010001 | DMK | 1011010000 | MK | + | MK | -2 |
| K46 | 0111010001 | DMK | 0111010000 | MK | + | MK | -2 |
| K51 | 1100110001 | DMK | 1100110000 | MK | + | MK | -2 |
| K53 | 1010110001 | DMK | 1010110000 | MK | + | MK | -2 |
| K54 | 0110110001 | DMK | 0110110000 | MK | + | MK | -2 |
| K57 | 1001110001 | DMK | 1001110000 | MK | + | MK | -2 |
| K58 | 0101110001 | DMK | 0101110000 | MK | + | MK | -2 |
| K60 | 0011110001 | DMK | 0011110000 | MK | + | MK | -2 |
| K102 | 0110011001 | DMK | 0110011000 | MK | + | MK | -2 |
| K141 | 1011000101 | DMK | 1011000100 | MK | + | MK | -2 |
| K154 | 0101100101 | DMK | 0101100100 | MK | + | MK | -2 |
| K166 | 0110010101 | DMK | 0110010100 | MK | + | MK | -2 |
| K170 | 0101010101 | DMK | 0101010100 | MK | + | MK | -2 |
| K198 | 0110001101 | DMK | 0110001100 | MK | + | MK | -2 |
| K210 | 0100101101 | DMK | 0100101100 | MK | + | MK | -2 |
| C508 | 0011111111 | FVK | 0011111110 | VK | − | VK | +4 |

FIG. 16A

|       | abcdefghij  | CODING CLASS |
|-------|-------------|--------------|
| D40   | 0001010110  | DQ4t'6mHI    |
| D264  | 0001011010  | DQ4m8qFG     |
| D136  | 0001011100  | DQ4m7q8tFG   |
| D24   | 0001100110  | DQ4t'6mHI    |
| D448  | 0001101010  | DT6qDEH      |
| D464  | 0001101100  | DM4t5t8mDI   |
| D240  | 0001110010  | DM4t8bDGHI   |
| D432  | 0001110100  | DM4t5t8mDI   |
| D368  | 0001111000  | DM4t5t8mDI   |
| D36   | 0010010110  | DQ4t'6mHI    |
| D260  | 0010011010  | DQ4m8qFG     |
| D132  | 0010011100  | DQ4m7q8tFG   |
| D20   | 0010100110  | DQ4t'6mHI    |
| D256  | 0010101010  | DS8sCEG      |
| D224  | 0010101100  | DT5q8mCEF    |
| D509  | 0010110010  | DH1u3uADGH   |
| D510  | 0010110100  | DH1mBDGI     |
| D48   | 0010111000  | DQ4t6mCG     |
| D34   | 0100010110  | DQ4t'6mHI    |
| D258  | 0100011010  | DQ4m8qFG     |
| D130  | 0100011100  | DQ4m7q8tFG   |
| D18   | 0100100110  | DQ4t'6mHI    |
| D503  | 0100101010  | DH3c4uACFH   |
| K210  | 0100101100  | DMK          |
| D507  | 0100110010  | DH1u3uADGH   |
| D128  | 0100110100  | DS6q8qBEF    |
| D64   | 0100111000  | DS6q8qBEF    |
| D33   | 1000010110  | DQ4t'6mHI    |
| D257  | 1000011010  | DQ4m8qFG     |
| D129  | 1000011100  | DQ4m7q8tFG   |
| D17   | 1000100110  | DQ4t'6mHI    |
| D272  | 1000101010  | DQ4t5t8qAG   |
| D1    | 1000101100  | DS1uEGH      |
| D32   | 1000110010  | DS5q6tAEI    |
| D16   | 1000110100  | DS4t5tAFH    |
| D480  | 1000111000  | DM5qAEHI     |
| D12   | 0011000110  | DQ4t'6mHI    |
| D8    | 0011001010  | DS3t4mCGI    |
| D239  | 0011001100  | DV4c5c8vABF  |
| D0    | 0011010010  | DNCDFI       |
| D495  | 0011010100  | DH4c5cABGI   |
| D68   | 0011011000  | DQ3m6t7tDF   |
| D10   | 0101000110  | DQ4t'6mHI    |
| D2    | 0101001010  | DS1m2bDGI    |

FIG. 16B

| | abcdefghij | CODING CLASS |
|---|---|---|
| D72 | 0101001100 | DQ3t4m6t7tBH |
| D384 | 0101010010 | DQ7sBDFH |
| K170 | 0101010100 | DMK |
| D66 | 0101011000 | DQ3m6t7tDF |
| D6 | 0110000110 | DQ4t'6mHI |
| D4 | 0110001010 | DS2m3mBGI |
| K198 | 0110001100 | DMK |
| D22 | 0110010010 | DT1m3u4b5uEFI |
| K166 | 0110010100 | DMK |
| K102 | 0110011000 | DMK |
| D9 | 1001000110 | DQ4t'6mHI |
| D351 | 1001001010 | DV5v6c7vBCE |
| D223 | 1001001100 | DV5v6c7vBCE |
| D319 | 1001010010 | DV6v8cBCE |
| D416 | 1001010100 | DT5q6t7qADI |
| D65 | 1001011000 | DQ3m6t7tDF |
| D5 | 1010000110 | DQ4t'6mHI |
| D352 | 1010001010 | DT5q7t8tACF |
| D207 | 1010001100 | DC4c5c7u'BD |
| D303 | 1010010010 | DC4c5c7u'BD |
| D175 | 1010010100 | DC4c5c7u'BD |
| D111 | 1010011000 | DC4c5c7u'BD |
| D3 | 1100000110 | DQ4t'6mHI |
| D320 | 1100001010 | DQ5q7q8qAB |
| D192 | 1100001100 | DQ4t6m'8tAB |
| D288 | 1100010010 | DQ5q7q8qAB |
| D160 | 1100010100 | DQ4t6m'8tAB |
| D96 | 1100011000 | DQ4t6m'8tAB |
| D28 | 0011100010 | DT2m5ul |
| D415 | 0011100100 | DV5v7cABI |
| D508 | 0011101000 | DVK'2mFHI |
| D26 | 0101100010 | DT1m2b3m5ul |
| K154 | 0101100100 | DMK |
| D511 | 0101101000 | DXACFHI |
| D287 | 0110100010 | DC5v6cAD |
| D159 | 0110100100 | DC5v6cAD |
| D95 | 0110101000 | DC5v6cAD |
| D63 | 0111000010 | DC6vAEFI |
| D447 | 0111000100 | DH6v7vAE FI |
| D14 | 0111001000 | DT1m4uG |
| D25 | 1001100010 | DT1u5ul |
| D191 | 1001100100 | DV6v8vBCF |
| D127 | 1001101000 | DV6v8vBCF |
| D21 | 1010100010 | DT1u5ul |
| D255 | 1010100100 | DH8hBDFG |

FIG. 16C

|      | abcdefghij | CODING CLASS |
|------|------------|--------------|
| D383 | 1010101000 | DH7h8vBDFI   |
| D13  | 1011000010 | DT1u5ul      |
| K141 | 1011000100 | DMK          |
| D479 | 1011001000 | DH5v6cBEHI   |
| D19  | 1100100010 | DT1u5ul      |
| D144 | 1100100100 | DQ4t6m'8tAB  |
| D80  | 1100101000 | DQ4t6m'8tAB  |
| D11  | 1101000010 | DT1u5ul      |
| D15  | 1101000100 | DM4cCH       |
| D31  | 1101001000 | DU5vCEG      |
| D7   | 1110000010 | DT1u5ul      |
| D399 | 1110000100 | DC4c6u8uDI   |
| D335 | 1110001000 | DC4c6u8uDI   |

FIG. 17
14 x DQ4t'6mHI
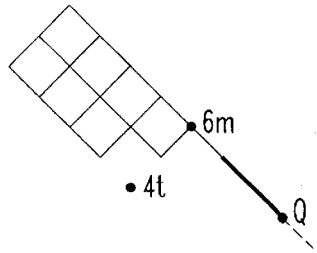
3 x DQ3m6t7tDF
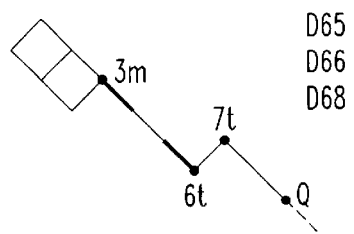
D65
D66
D68
FIG. 18
1 x DQ3t4m6t7tBH
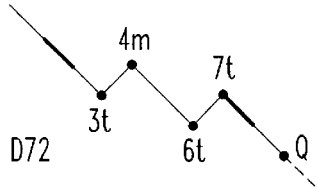
D72
4 x DQ4m8qFG
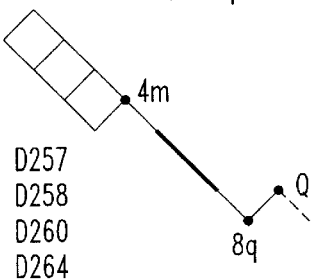
D257
D258
D260
D264
FIG. 19
4 x DQ4m7q8tFG
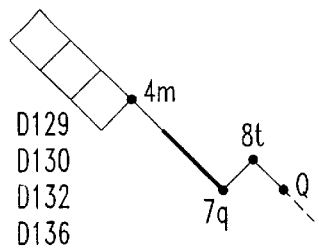
D129
D130
D132
D136
1 x DQ7sBDFH
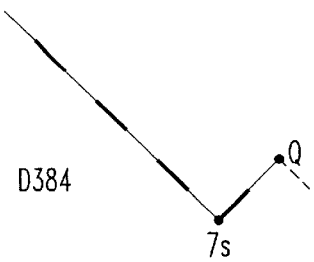
D384

FIG. 34A

| Name | STUVWXY K | Coding Class | Primary stuvwxyz | Alternate stuvwxyz | DR Class | DR | DB Class | DB |
|---|---|---|---|---|---|---|---|---|
| D0 | 0000000 0 | DSSVX | 10010100 | 01101011 | S | + | S | -2 |
| D1 | 1000000 0 | DQ3mWX | 10001100 | 01110011 | Q | + | Q | -2 |
| D2 | 0100000 0 | DQ3mWX | 01001100 | 10110011 | Q | + | Q | -2 |
| D3 | 1100000 0 | DTK'4bW | 11001000 | 00110111 | T | + | TK'4b | -2 |
| D4 | 0010000 0 | DQ3mWX | 00101100 | 11010011 | Q | + | Q | -2 |
| D5 | 1010000 0 | DTK'4bW | 10101000 | 01010111 | T | + | TK'4b | -2 |
| D6 | 0110000 0 | DTK'4bW | 01101000 | 10010111 | T | + | TK'4b | -2 |
| D7 | 1110000 0 | BMK'4t'Z | 11100001 | | | ± | MK'4t' | 0 |
| D8 | 0001000 0 | DQ3t5tSY | 10010010 | 01101101 | Q | + | Q | -2 |
| D9 | 1001000 0 | DTK'4bW | 10011000 | 01100111 | T | + | TK'4b | -2 |
| D10 | 0101000 0 | DTK'4bW | 01011000 | 10100111 | T | + | TK'4b | -2 |
| D11 | 1101000 0 | BMK'4t'Z | 11010001 | | | ± | MK'4t' | 0 |
| D12 | 0011000 0 | DTK'4bW | 00111000 | 11000111 | T | + | TK'4b | -2 |
| D13 | 1011000 0 | BMK'4t'Z | 10110001 | | | ± | MK'4t' | 0 |
| D14 | 0111000 0 | BMK'4t'Z | 01110001 | | | ± | MK'4t' | 0 |
| D15 | 1111000 0 | PU4c | 11110000 | 00001111 | U4c | - | U4c | 0 |
| D16 | 0000100 0 | DQ3t5tSY | 10001010 | 01110101 | Q | + | Q | -2 |
| D17 | 1000100 0 | FT4m | 10001000 | 01110111 | T | + | T4m | -4 |
| D18 | 0100100 0 | FT4m | 01001000 | 10110111 | T | + | T4m | -4 |
| D19 | 1100100 0 | BMK'4t'Z | 11001001 | | | ± | MK'4t' | 0 |
| D20 | 0010100 0 | FT4m | 00101000 | 11010111 | T | + | T4m | -4 |
| D21 | 1010100 0 | BMK'4t'Z | 10101001 | | | ± | MK'4t' | 0 |
| D22 | 0110100 0 | BMK'4t'Z | 01101001 | | | ± | MK'4t' | 0 |
| D23 | 1110100 0 | BU4c' | 11101000 | | | ± | U4c' | 0 |
| D24 | 0001100 0 | FT4m | 00011000 | 11100111 | T | + | T4m | -4 |
| D25 | 1001100 0 | BMK'4t'Z | 10011001 | | | ± | MK'4t' | 0 |
| D26 | 0101100 0 | BMK'4t'Z | 01011001 | | | ± | MK'4t' | 0 |
| D27 | 1101100 0 | BU4c' | 11011000 | | | ± | U4c' | 0 |
| D28 | 0011100 0 | BMK'4t'Z | 00111001 | | | ± | MK'4t' | 0 |
| D29 | 1011100 0 | BU4c' | 10111000 | | | ± | U4c' | 0 |
| D30 | 0111100 0 | BU4c' | 01111000 | | | ± | U4c' | 0 |
| D31 | 1111100 0 | DC4cVZ | 11101001 | 00010110 | C | - | C | +2 |
| D32 | 0000010 0 | DQ5qTV | 01010100 | 10101011 | Q | + | Q | -2 |
| D33 | 1000010 0 | FT4m | 10000100 | 01111011 | T | + | T4m | -4 |
| D34 | 0100010 0 | FT4m | 01000100 | 10111011 | T | + | T4m | -4 |
| D35 | 1100010 0 | BMK'4t'Z | 11000101 | | | ± | MK'4t' | 0 |
| D36 | 0010010 0 | FT4m | 00100100 | 11011011 | T | + | T4m | -4 |
| D37 | 1010010 0 | BMK'4t'Z | 10100101 | | | ± | MK'4t' | 0 |
| D38 | 0110010 0 | BMK'4t'Z | 01100101 | | | ± | MK'4t' | 0 |
| D39 | 1110010 0 | BU4c' | 11100100 | | | ± | U4c' | 0 |
| D40 | 0001010 0 | FT4m | 00010100 | 11101011 | T | + | T4m | -4 |
| D41 | 1001010 0 | BMK'4t'Z | 10010101 | | | ± | MK'4t' | 0 |
| D42 | 0101010 0 | BMK'4t'Z | 01010101 | | | ± | MK'4t' | 0 |

FIG. 34B

| Name | STUVWXY K | Coding Class | Primary stuvwxyz | Alternate stuvwxyz | DR Class | DR | DB Class | DB |
|---|---|---|---|---|---|---|---|---|
| D43 | 1101010 0 | BU4c' | 11010100 | | | ± | U4c' | 0 |
| D44 | 0011010 0 | BMK'4t'Z | 00110101 | | | ± | MK'4t' | 0 |
| D45 | 1011010 0 | BU4c' | 10110100 | | | ± | U4c' | 0 |
| D46 | 0111010 0 | BU4c' | 01110100 | | | ± | U4c' | 0 |
| D47 | 1111010 0 | DC4cVZ | 11100101 | 00011010 | C | − | C | +2 |
| D48 | 0000110 0 | DT4t5tSTW | 11000100 | 00111011 | T | + | T4t5t | −2 |
| D49 | 1000110 0 | BMK'4t'Z | 10001101 | | | ± | MK'4t' | 0 |
| D50 | 0100110 0 | BMK'4t'Z | 01001101 | | | ± | MK'4t' | 0 |
| D51 | 1100110 0 | BU4c' | 11001100 | | | ± | U4c' | 0 |
| D52 | 0010110 0 | BMK'4t'Z | 00101101 | | | ± | MK'4t' | 0 |
| D53 | 1010110 0 | BU4c' | 10101100 | | | ± | U4c' | 0 |
| D54 | 0110110 0 | BU4c' | 01101100 | | | ± | U4c' | 0 |
| D55 | 1110110 0 | DC4c' | 11101100 | 00010011 | C | − | C | +2 |
| D56 | 0001110 0 | BMK'4t'Z | 00011101 | | | ± | MK'4t' | 0 |
| D57 | 1001110 0 | BU4c' | 10011100 | | | ± | U4c' | 0 |
| D58 | 0101110 0 | BU4c' | 01011100 | | | ± | U4c' | 0 |
| D59 | 1101110 0 | DC4c' | 11011100 | 00100011 | C | − | C | +2 |
| D60 | 0011110 0 | BU4c' | 00111100 | | | ± | U4c' | 0 |
| D61 | 1011110 0 | DC4c' | 10111100 | 01000011 | C | − | C | +2 |
| D62 | 0111110 0 | DC4c' | 01111100 | 10000011 | C | − | C | +2 |
| D63 | 1111110 0 | DVK'6vSTW | 00110100 | 11001011 | VK' | + | VK' | −2 |
| D64 | 0000001 0 | DQ5qTV | 01010010 | 10101101 | Q | + | Q | −2 |
| D65 | 1000001 0 | FT4m | 10000010 | 01111101 | T | + | T4m | −4 |
| D66 | 0100001 0 | FT4m | 01000010 | 10111101 | T | + | T4m | −4 |
| D67 | 1100001 0 | BMK'4t'Z | 11000011 | | | ± | MK'4t' | 0 |
| D68 | 0010001 0 | FT4m | 00100010 | 11011101 | T | + | T4m | −4 |
| D69 | 1010001 0 | BMK'4t'Z | 10100011 | | | ± | MK'4t' | 0 |
| D70 | 0110001 0 | BMK'4t'Z | 01100011 | | | ± | MK'4t' | 0 |
| D71 | 1110001 0 | BU4c' | 11100010 | | | ± | U4c' | 0 |
| D72 | 0001001 0 | FT4m | 00010010 | 11101101 | T | + | T4m | −4 |
| D73 | 1001001 0 | BMK'4t'Z | 10010011 | | | ± | MK'4t' | 0 |
| D74 | 0101001 0 | BMK'4t'Z | 01010011 | | | ± | MK'4t' | 0 |
| D75 | 1101001 0 | BU4c' | 11010010 | | | ± | U4c' | 0 |
| D76 | 0011001 0 | BMK'4t'Z | 00110011 | | | ± | MK'4t' | 0 |
| D77 | 1011001 0 | BU4c' | 10110010 | | | ± | U4c' | 0 |
| D78 | 0111001 0 | BU4c' | 01110010 | | | ± | U4c' | 0 |
| D79 | 1111001 0 | DC4cVZ | 11100011 | 00011100 | C | − | C | +2 |
| D80 | 0000101 0 | DT4t5tSTW | 11000010 | 00111101 | T | + | T4t5t | −2 |
| D81 | 1000101 0 | BMK'4t'Z | 10001011 | | | ± | MK'4t' | 0 |
| D82 | 0100101 0 | BMK'4t'Z | 01001011 | | | ± | MK'4t' | 0 |
| D83 | 1100101 0 | BU4c' | 11001010 | | | ± | U4c' | 0 |
| D84 | 0010101 0 | BMK'4t'Z | 00101011 | | | ± | MK'4t' | 0 |
| D85 | 1010101 0 | BU4c' | 10101010 | | | ± | U4c' | 0 |

FIG. 34C

| Name | STUVWXY K | Coding Class | Primary stuvwxyz | Alternate stuvwxyz | DR Class | DR | DB Class | DB |
|---|---|---|---|---|---|---|---|---|
| D86 | 0110101 0 | BU4c' | 01101010 | | | ± | U4c' | 0 |
| D87 | 1110101 0 | DC4c' | 11101010 | 00010101 | C | − | C | +2 |
| D88 | 0001101 0 | BMK'4t'Z | 00011011 | | | ± | MK'4t' | 0 |
| D89 | 1001101 0 | BU4c' | 10011010 | | | ± | U4c' | 0 |
| D90 | 0101101 0 | BU4c' | 01011010 | | | ± | U4c' | 0 |
| D91 | 1101101 0 | DC4c' | 11011010 | 00100101 | C | − | C | +2 |
| D92 | 0011101 0 | BU4c' | 00111010 | | | ± | U4c' | 0 |
| D93 | 1011101 0 | DC4c' | 10111010 | 01000101 | C | − | C | +2 |
| D94 | 0111101 0 | DC4c' | 01111010 | 10000101 | C | − | C | +2 |
| D95 | 1111101 0 | DVK'5v6cSVW | 01100010 | 10011101 | VK' | + | VK' | −2 |
| D96 | 0000011 0 | DT5qU | 00100110 | 11011001 | T | + | T5q | −2 |
| D97 | 1000011 0 | BMK'4t'Z | 10000111 | | | ± | MK'4t' | 0 |
| D98 | 0100011 0 | BMK'4t'Z | 01000111 | | | ± | MK'4t' | 0 |
| D99 | 1100011 0 | BU4c' | 11000110 | | | ± | U4c' | 0 |
| D100 | 0010011 0 | BMK'4t'Z | 00100111 | | | ± | MK'4t' | 0 |
| D101 | 1010011 0 | BU4c' | 10100110 | | | ± | U4c' | 0 |
| D102 | 0110011 0 | BU4c' | 01100110 | | | ± | U4c' | 0 |
| D103 | 1110011 0 | DC4c' | 11100110 | 00011001 | C | − | C | +2 |
| D104 | 0001011 0 | BMK'4t'Z | 00010111 | | | ± | MK'4t' | 0 |
| D105 | 1001011 0 | BU4c' | 10010110 | | | ± | U4c' | 0 |
| D106 | 0101011 0 | BU4c' | 01010110 | | | ± | U4c' | 0 |
| D107 | 1101011 0 | DC4c' | 11010110 | 00101001 | C | − | C | +2 |
| D108 | 0011011 0 | BU4c' | 00110110 | | | ± | U4c' | 0 |
| D109 | 1011011 0 | DC4c' | 10110110 | 01001001 | C | − | C | +2 |
| D110 | 0111011 0 | DC4c' | 01110110 | 10001001 | C | − | C | +2 |
| D111 | 1111011 0 | DVK'3c5cSTX | 00110010 | 11001101 | VK' | + | VK' | −2 |
| D112 | 0000111 0 | DM4tTX | 01001010 | 10110101 | M4t | + | M4t | −2 |
| D113 | 1000111 0 | BU4c' | 10001110 | | | ± | U4c' | 0 |
| D114 | 0100111 0 | BU4c' | 01001110 | | | ± | U4c' | 0 |
| D115 | 1100111 0 | DC4c' | 11001110 | 00110001 | C | − | C | +2 |
| D116 | 0010111 0 | BU4c' | 00101110 | | | ± | U4c' | 0 |
| D117 | 1010111 0 | DC4c' | 10101110 | 01010001 | C | − | C | +2 |
| D118 | 0110111 0 | DC4c' | 01101110 | 10010001 | C | − | C | +2 |
| D119 | 1110111 0 | DVK'3c5cSTX | 00101010 | 11010101 | VK' | + | VK' | −2 |
| D120 | 0001111 0 | BU4c' | 00011110 | | | ± | U4c' | 0 |
| D121 | 1001111 0 | DC4c' | 10011110 | 01100001 | C | − | C | +2 |
| D122 | 0101111 0 | DC4c' | 01011110 | 10100001 | C | − | C | +2 |
| D123 | 1101111 0 | DVK'2u3uTVW | 10000110 | 01111001 | VK' | + | VK' | −2 |
| D124 | 0011111 0 | DC4c' | 00111110 | 11000001 | C | − | C | +2 |
| D125 | 1011111 0 | DVK'2bVWY | 10100100 | 01011011 | VK' | + | VK' | −2 |
| D126 | 0111111 0 | DVK'2bVWY | 01100100 | 10011011 | VK' | + | VK' | −2 |
| D127 | 1111111 0 | DHTVWX | 10100010 | 01011101 | H | + | H | −2 |
| K9 | 1001000 1 | FTK3m4b | 10010000 | 01101111 | T | + | TK | −4 |
| K10 | 0101000 1 | FTK3m4b | 01010000 | 10101111 | T | + | TK | −4 |

FIG. 34D

| Name | STUVWXY K | Coding Class | Primary stuvwxyz | Alternate stuvwxyz | DR Class | DR | DB Class | DB |
|---|---|---|---|---|---|---|---|---|
| K12 | 0011000 1 | FTK3m4b | 00110000 | 11001111 | T | + | TK | −4 |
| K98 | 0100011 1 | DMK4t' | 01000110 | 10111001 | MK4t' | + | MK4t' | −2 |
| K123 | 1101111 1 | FVK3u | 11011110 | 00100001 | VK | − | VK | +4 |
| K125 | 1011111 1 | FVK3u | 10111110 | 01000001 | VK | − | VK | +4 |
| C126 | 0111111 1 | FVK3u | 01111110 | 10000001 | VK | − | VK | +4 |

FIG. 50A

| Name | Encoded Bits stuvwxyz | Decoding Class | Decoded Bits STUVWXY K | DR Class | DR | DU Class | DU |
|---|---|---|---|---|---|---|---|
| D0 | 10010100 | MD0SVX | 0000000 0 | M | + | M | -2 |
| D0 | 01101011 | U | | U | - | U | +2 |
| D1 | 10001100 | M3m4m6bWX | 1000000 0 | M | + | M | -2 |
| D1 | 01110011 | U | | U | - | U | +2 |
| D2 | 01001100 | M3m4m6bWX | 0100000 0 | M | + | M | -2 |
| D2 | 10110011 | U | | U | - | U | +2 |
| D3 | 11001000 | M4b5uW | 1100000 0 | M | + | M | -2 |
| D3 | 00110111 | U | | U | - | U | +2 |
| D4 | 00101100 | M3m4m6bWX | 0010000 0 | M | + | M | -2 |
| D4 | 11010011 | U | | U | - | U | +2 |
| D5 | 10101000 | M4b5uW | 1010000 0 | M | + | M | -2 |
| D5 | 01010111 | U | | U | - | U | +2 |
| D6 | 01101000 | M4b5uW | 0110000 0 | M | + | M | -2 |
| D6 | 10010111 | U | | U | - | U | +2 |
| D7 | 11100001 | B | 1110000 0 | B | ± | B | 0 |
| D8 | 10010010 | M1u3m5m6mSY | 0001000 0 | M | + | M | -2 |
| D8 | 01101101 | U | | U | - | U | +2 |
| D9 | 10011000 | M4b5uW | 1001000 0 | M | + | M | -2 |
| D9 | 01100111 | U | | U | - | U | +2 |
| D10 | 01011000 | M4b5uW | 0101000 0 | M | + | M | -2 |
| D10 | 10100111 | U | | U | - | U | +2 |
| D11 | 11010001 | B | 1101000 0 | B | ± | B | 0 |
| D12 | 00111000 | M4b5uW | 0011000 0 | M | + | M | -2 |
| D12 | 11000111 | U | | U | - | U | +2 |
| D13 | 10110001 | B | 1011000 0 | B | ± | B | 0 |
| D14 | 01110001 | B | 0111000 0 | B | ± | B | 0 |
| D15 | 11110000 | 4c8b | 1111000 0 | 4c8b | - | 4c8b | 0 |
| D15 | 00001111 | 4t8b | | 4t8b | + | 4t8b | 0 |
| D16 | 10001010 | M1u3m5m6mSY | 0000100 0 | M | + | M | -2 |
| D16 | 01110101 | U | | U | - | U | +2 |
| D17 | 10001000 | T | 1000100 0 | T | + | T | -4 |
| D17 | 01110111 | C | | C | - | C | +4 |
| D18 | 01001000 | T | 0100100 0 | T | + | T | -4 |
| D18 | 10110111 | C | | C | - | C | +4 |
| D19 | 11001001 | B | 1100100 0 | B | ± | B | 0 |
| D20 | 00101000 | T | 0010100 0 | T | + | T | -4 |
| D20 | 11010111 | C | | C | - | C | +4 |
| D21 | 10101001 | B | 1010100 0 | B | ± | B | 0 |
| D22 | 01101001 | B | 0110100 0 | B | ± | B | 0 |
| D23 | 11101000 | B | 1110100 0 | B | ± | B | 0 |
| D24 | 00011000 | T | 0001100 0 | T | + | T | -4 |
| D24 | 11100111 | C | | C | - | C | +4 |
| D25 | 10011001 | B | 1001100 0 | B | ± | B | 0 |

FIG. 50B

| Name | Encoded Bits stuvwxyz | Decoding Class | Decoded Bits STUVWXY K | DR Class | DR | DU Class | DU |
|---|---|---|---|---|---|---|---|
| D26 | 01011001 | B | 0101100 0 | B | ± | B | 0 |
| D27 | 11011000 | B | 1101100 0 | B | ± | B | 0 |
| D28 | 00111001 | B | 0011100 0 | B | ± | B | 0 |
| D29 | 10111000 | B | 1011100 0 | B | ± | B | 0 |
| D30 | 01111000 | B | 0111100 0 | B | ± | B | 0 |
| D31 | 11101001 | U3c4u7uV | 1111100 0 | U | − | U | +2 |
| D31 | 00010110 | M3t4m | | M | + | M | −2 |
| D32 | 01010100 | M1m2b3m4b5mTV | 0000010 0 | M | + | M | −2 |
| D32 | 10101011 | U | | U | − | U | +2 |
| D33 | 10000100 | T | 1000010 0 | T | + | T | −4 |
| D33 | 01111011 | C | | C | − | C | +4 |
| D34 | 01000100 | T | 0100010 0 | T | + | T | −4 |
| D34 | 10111011 | C | | C | − | C | +4 |
| D35 | 11000101 | B | 1100010 0 | B | ± | B | 0 |
| D36 | 00100100 | T | 0010010 0 | T | + | T | −4 |
| D36 | 11011011 | C | | C | − | C | +4 |
| D37 | 10100101 | B | 1010010 0 | B | ± | B | 0 |
| D38 | 01100101 | B | 0110010 0 | B | ± | B | 0 |
| D39 | 11100100 | B | 1110010 0 | B | ± | B | 0 |
| D40 | 00010100 | T | 0001010 0 | T | + | T | −4 |
| D40 | 11101011 | C | | C | − | C | +4 |
| D41 | 10010101 | B | 1001010 0 | B | ± | B | 0 |
| D42 | 01010101 | B | 0101010 0 | B | ± | B | 0 |
| D43 | 11010100 | B | 1101010 0 | B | ± | B | 0 |
| D44 | 00110101 | B | 0011010 0 | B | ± | B | 0 |
| D45 | 10110100 | B | 1011010 0 | B | ± | B | 0 |
| D46 | 01110100 | B | 0111010 0 | B | ± | B | 0 |
| D47 | 11100101 | U3c4u7uV | 1111010 0 | U | − | U | +2 |
| D47 | 00011010 | M3t4m | | M | + | M | −2 |
| D48 | 11000100 | M2u5mSTW | 0000110 0 | M | + | M | −2 |
| D48 | 00111011 | U | | U | − | U | +2 |
| D49 | 10001101 | B | 1000110 0 | B | ± | B | 0 |
| D50 | 01001101 | B | 0100110 0 | B | ± | B | 0 |
| D51 | 11001100 | B | 1100110 0 | B | ± | B | 0 |
| D52 | 00101101 | B | 0010110 0 | B | ± | B | 0 |
| D53 | 10101100 | B | 1010110 0 | B | ± | B | 0 |
| D54 | 01101100 | B | 0110110 0 | B | ± | B | 0 |
| D55 | 11101100 | U | 1110110 0 | U | − | U | +2 |
| D55 | 00010011 | M | | M | + | M | −2 |
| D56 | 00011101 | B | 0001110 0 | B | ± | B | 0 |
| D57 | 10011100 | B | 1001110 0 | B | ± | B | 0 |
| D58 | 01011100 | B | 0101110 0 | B | ± | B | 0 |
| D59 | 11011100 | U | 1101110 0 | U | − | U | +2 |
| D59 | 00100011 | M | | M | + | M | −2 |

FIG. 50C

| Name | Encoded Bits stuvwxyz | Decoding Class | Decoded Bits STUVWXY K | DR Class | DR | DU Class | DU |
|---|---|---|---|---|---|---|---|
| D60 | 00111100 | B | 0011110 0 | B | ± | B | 0 |
| D61 | 10111100 | U | 1011110 0 | U | − | U | +2 |
| D61 | 01000011 | M |  | M | + | M | −2 |
| D62 | 01111100 | U | 0111110 0 | U | − | U | +2 |
| D62 | 10000011 | M |  | M | + | M | −2 |
| D63 | 00110100 | MD63STW | 1111110 0 | M | + | M | −2 |
| D63 | 11001011 | U |  | U | − | U | +2 |
| D64 | 01010010 | M1m2b3m4b5mTV | 0000001 0 | M | + | M | −2 |
| D64 | 10101101 | U |  | U | − | U | +2 |
| D65 | 10000010 | T | 1000001 0 | T | + | T | −4 |
| D65 | 01111101 | C |  | C | − | C | +4 |
| D66 | 01000010 | T | 0100001 0 | T | + | T | −4 |
| D66 | 10111101 | C |  | C | − | C | +4 |
| D67 | 11000011 | B | 1100001 0 | B | ± | B | 0 |
| D68 | 00100010 | T | 0010001 0 | T | + | T | −4 |
| D68 | 11011101 | C |  | C | − | C | +4 |
| D69 | 10100011 | B | 1010001 0 | B | ± | B | 0 |
| D70 | 01100011 | B | 0110001 0 | B | ± | B | 0 |
| D71 | 11100010 | B | 1110001 0 | B | ± | B | 0 |
| D72 | 00010010 | T | 0001001 0 | T | + | T | −4 |
| D72 | 11101101 | C |  | C | − | C | +4 |
| D73 | 10010011 | B | 1001001 0 | B | ± | B | 0 |
| D74 | 01010011 | B | 0101001 0 | B | ± | B | 0 |
| D75 | 11010010 | B | 1101001 0 | B | ± | B | 0 |
| D76 | 00110011 | B | 0011001 0 | B | ± | B | 0 |
| D77 | 10110010 | B | 1011001 0 | B | ± | B | 0 |
| D78 | 01110010 | B | 0111001 0 | B | ± | B | 0 |
| D79 | 11100011 | U3c4u7uV | 1111001 0 | U | − | U | +2 |
| D79 | 00011100 | M3t4m |  | M | + | M | −2 |
| D80 | 11000010 | M2u5mSTW | 0000101 0 | M | + | M | −2 |
| D80 | 00111101 | U |  | U | − | U | +2 |
| D81 | 10001011 | B | 1000101 0 | B | ± | B | 0 |
| D82 | 01001011 | B | 0100101 0 | B | ± | B | 0 |
| D83 | 11001010 | B | 1100101 0 | B | ± | B | 0 |
| D84 | 00101011 | B | 0010101 0 | B | ± | B | 0 |
| D85 | 10101010 | B | 1010101 0 | B | ± | B | 0 |
| D86 | 01101010 | B | 0110101 0 | B | ± | B | 0 |
| D87 | 11101010 | U | 1110101 0 | U | − | U | +2 |
| D87 | 00010101 | M |  | M | + | M | −2 |
| D88 | 00011011 | B | 0001101 0 | B | ± | B | 0 |
| D89 | 10011010 | B | 1001101 0 | B | ± | B | 0 |
| D90 | 01011010 | B | 0101101 0 | B | ± | B | 0 |
| D91 | 11011010 | U | 1101101 0 | U | − | U | +2 |
| D91 | 00100101 | M |  | M | + | M | −2 |

FIG. 50D

| Name | Encoded Bits stuvwxyz | Decoding Class | Decoded Bits STUVWXY K | DR Class | DR | DU Class | DU |
|---|---|---|---|---|---|---|---|
| D92 | 00111010 | B | 0011101 0 | B | ± | B | 0 |
| D93 | 10111010 | U | 1011101 0 | U | − | U | +2 |
| D93 | 01000101 | M | | M | + | M | −2 |
| D94 | 01111010 | U | 0111101 0 | U | − | U | +2 |
| D94 | 10000101 | M | | M | + | M | −2 |
| D95 | 01100010 | MD95SVW | 1111101 0 | M | + | M | −2 |
| D95 | 10011101 | U | | U | − | U | +2 |
| D96 | 00100110 | MD96U | 0000011 0 | M | + | M | −2 |
| D96 | 11011001 | U | | U | − | U | +2 |
| D97 | 10000111 | B | 1000011 0 | B | ± | B | 0 |
| D98 | 01000111 | B | 0100011 0 | B | ± | B | 0 |
| D99 | 11000110 | B | 1100011 0 | B | ± | B | 0 |
| D100 | 00100111 | B | 0010011 0 | B | ± | B | 0 |
| D101 | 10100110 | B | 1010011 0 | B | ± | B | 0 |
| D102 | 01100110 | B | 0110011 0 | B | ± | B | 0 |
| D103 | 11100110 | U | 1110011 0 | U | − | U | +2 |
| D103 | 00011001 | M | | M | + | M | −2 |
| D104 | 00010111 | B | 0001011 0 | B | ± | B | 0 |
| D105 | 10010110 | B | 1001011 0 | B | ± | B | 0 |
| D106 | 01010110 | B | 0101011 0 | B | ± | B | 0 |
| D107 | 11010110 | U | 1101011 0 | U | − | U | +2 |
| D107 | 00101001 | M | | M | + | M | −2 |
| D108 | 00110110 | B | 0011011 0 | B | ± | B | 0 |
| D109 | 10110110 | U | 1011011 0 | U | − | U | +2 |
| D109 | 01001001 | M | | M | + | M | −2 |
| D110 | 01110110 | U | 0111011 0 | U | − | U | +2 |
| D110 | 10001001 | M | | M | + | M | −2 |
| D111 | 00110010 | M2m3m5m6mSTX | 1111011 0 | M | + | M | −2 |
| D111 | 11001101 | U | | U | − | U | +2 |
| D112 | 01001010 | MD112TX | 0000111 0 | M | + | M | −2 |
| D112 | 10110101 | U | | U | − | U | +2 |
| D113 | 10001110 | B | 1000111 0 | B | ± | B | 0 |
| D114 | 01001110 | B | 0100111 0 | B | ± | B | 0 |
| D115 | 11001110 | U | 1100111 0 | U | − | U | +2 |
| D115 | 00110001 | M | | M | + | M | −2 |
| D116 | 00101110 | B | 0010111 0 | B | ± | B | 0 |
| D117 | 10101110 | U | 1010111 0 | U | − | U | +2 |
| D117 | 01010001 | M | | M | + | M | −2 |
| D118 | 01101110 | U | 0110111 0 | U | − | U | +2 |
| D118 | 10010001 | M | | M | + | M | −2 |
| D119 | 00101010 | M2m3m5m6mSTX | 1110111 0 | M | + | M | −2 |
| D119 | 11010101 | U | | U | − | U | +2 |
| D120 | 00011110 | B | 0001111 0 | B | ± | B | 0 |
| D121 | 10011110 | U | 1001111 0 | U | − | U | +2 |

FIG. 50E

| Name | Encoded Bits stuvwxyz | Decoding Class | Decoded Bits STUVWXY K | DR Class | DR | DU Class | DU |
|---|---|---|---|---|---|---|---|
| D121 | 01100001 | M | | M | + | M | -2 |
| D122 | 01011110 | U | 0101111 0 | U | - | U | +2 |
| D122 | 10100001 | M | | M | + | M | -2 |
| D123 | 10000110 | MD123TVW | 1101111 0 | M | + | M | -2 |
| D123 | 01111001 | U | | U | - | U | +2 |
| D124 | 00111110 | U | 0011111 0 | U | - | U | +2 |
| D124 | 11000001 | M | | M | + | M | -2 |
| D125 | 10100100 | M2b3u5m6bVWY | 1011111 0 | M | + | M | -2 |
| D125 | 01011011 | U | | U | - | U | +2 |
| D126 | 01100100 | M2b3u5m6bVWY | 0111111 0 | M | + | M | -2 |
| D126 | 10011011 | U | | U | - | U | +2 |
| D127 | 10100010 | MD127TVWX | 1111111 0 | M | + | M | -2 |
| D127 | 01011101 | U | | U | - | U | +2 |
| K9 | 10010000 | T$_K$3m4bK | 1001000 1 | T | + | T | -4 |
| K9 | 01101111 | C$_K$3u4b | | C | - | C | +4 |
| K10 | 01010000 | T$_K$3m4bK | 0101000 1 | T | + | T | -4 |
| K10 | 10101111 | C$_K$3u4b | | C | - | C | +4 |
| K12 | 00110000 | T$_K$3m4bK | 0011000 1 | T | + | T | -4 |
| K12 | 11001111 | C$_K$3u4b | | C | - | C | +4 |
| K98 | 01000110 | MK98K | 0100011 1 | M | + | M | -2 |
| K98 | 10111001 | 8u | | U | - | U | +2 |
| K123 | 11011110 | C$_K$K | 1101111 1 | C | - | C | +4 |
| K123 | 00100001 | T$_K$ | | T | + | T | -4 |
| K125 | 10111110 | C$_K$K | 1011111 1 | C | - | C | +4 |
| K125 | 01000001 | T$_K$ | | T | + | T | -4 |
| C126 | 01111110 | C$_K$K | 0111111 1 | C | - | C | +4 |
| C126 | 10000001 | T$_K$ | | T | + | T | -4 |

FIG. 55
1 x M1m3u6mSVW=MD95SVW   1 x M1u5tTVW=MD123TVW
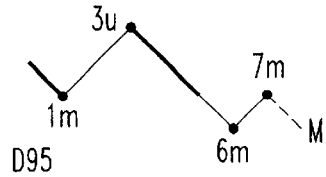
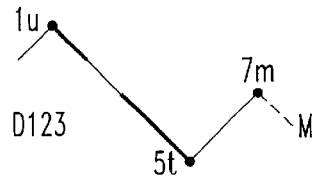
FIG. 56
2 x M2m3m5m6mSTX   2 x M2b3u5m6bVWY
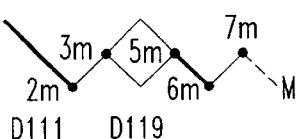
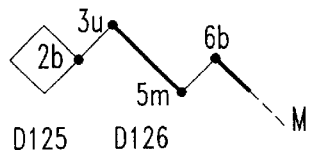
FIG. 57
1 x M1m2b5tK = MK98K   1 x M1m2b4m5m6mTX = MD112TX
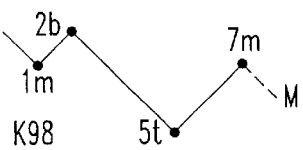
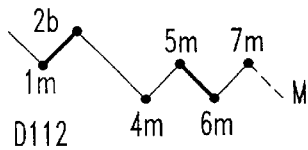
FIG. 58
1 x M1u3m4b5m6bSVX = MD0SVX   1 x M1u2b3u6mTVWX = MD127TVWX
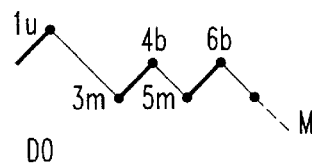
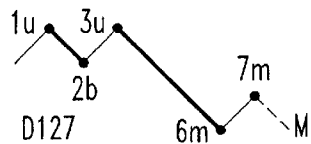

DC BALANCED 7B/8B, 9B/10B, AND PARTITIONED DC BALANCED 12B/14B, 17B/20B, AND 16B/18B TRANSMISSION CODES

FIELD OF THE INVENTION

The present invention relates to transmission codes and, more particularly, relates to methods and apparatuses used to produce and interpret Direct Current (DC) balanced 7B/8B, 9B/10B, and partitioned DC balanced 12B/14B, 17B/20B, and 16B/18B transmission codes.

BACKGROUND OF THE INVENTION

One purpose of transmission codes is to transform the frequency spectrum of a serial data stream so that clocking can be recovered readily and AC (alternating current) coupling is possible. A transmission code must also provide special characters outside the data alphabet for functions such as character synchronization, frame delimiters and perhaps for abort, reset, idle, diagnostics, and other functions. Codes are also used, often in combination with signal waveform shaping, to adapt the signal spectrum more closely to specific channel requirements. In most cases, a reduction in bandwidth by constraints on both the high and the low frequency components is desirable to reduce distortion in the transmission media, especially electromagnetic cables, or in a band limited receiver, and to reduce the effects of extrinsic and intrinsic noise.

For fiber optic links and intra-establishment wire links, interest centers for many reasons on a family of two-level codes. For wire links, one prefers codes with no DC (direct current) and little low frequency content in order to DC-isolate the transmission line from the driver and receiver circuitry, by transformers or capacitors, and to reduce signal distortion on the line. Although these factors do not apply to the fiber optic case, good low frequency characteristics of the code are still helpful for a number of reasons.

For instance, high gain fiber optic receivers need an AC coupling stage near the front end. The control of the drive level, receiver gain, and equalization is simplified and the precision of control is improved, if it can be based on the average signal power, especially at top data rates. DC restore circuits tend to lose precision with rising data rates and cease to operate properly below the maximum rates for other circuits required in a transceiver. Finally, if the time constants associated with the parasitic capacitances at the front end of a receiver are comparable to or longer than a baud interval, a signal with reduced low frequency content will suffer less distortion and will enable many links to operate without an equalizing circuit.

Manchester and related codes are simple two-level codes and solve the clocking and low frequency problems very well. These codes translate each bit into two bits for transmission and are a good choice whenever the high clocking rates cause no problems in the logic or analog circuits, in the transducers, or on the transmission line. They also reduce the data transmission rate by a factor of two since they encode 2 bits for every data bit (i.e., these codes are called rate ½ codes).

There are additional codes that solve or ameliorate the clocking and low frequency problems yet also provide higher data transmission rates. For instance, simple 5B/6B codes translate five binary bits into six binary digits and raise the number of information bits transmitted per baud interval to 0.833. There are also 7B/8B and 9B/10B codes that additionally raise the data transmission rate.

However, there is still a need to provide suitable transmission codes that provide reduced complexity during encoding and decoding and yet provide enough flexibility to be able to be modified for other applications.

SUMMARY OF THE INVENTION

The present invention provides techniques for classifying disparities and source vectors for 7B/8B and 9B/10B transmission codes, which are then used to minimize the complexity of decoding and encoding for 16B/18B codes. Furthermore, decoding for 7B/8B, 9B/10B, and 16B/18B transmission codes is simplified through techniques discussed below. Additionally, the present invention provides techniques for encoding and decoding 12B/14B and 17B/20B transmission codes using the classifications and decoding techniques for the 5B,6B, 7B/8B and 9B/10B transmission codes.

In a first aspect of the invention, the encoding space for 7B/8B and 9B/10B codes is divided into classifications. The classifications are preferably determined for source vectors, which are uncoded vectors, and for disparity for coded vectors. The disparity is the difference between the number of one and zero bits in a defined block of bits, which in this case is the coded vector. As described in more detail below, disparity is important in maintaining a DC balanced code. In one embodiment, the vector classifications are selected in a predetermined manner so that the number of classifications is minimized for bit mapping, disparity control, or both. Bit mapping is basically the conversion of source vectors to coded vectors. Disparity control is basically how the disparity is maintained per 7B/8B, 9B/10B, or 16B/18B vector. In another embodiment, the number of bits changed for bit mapping is minimized. Benefits to classification as per the above techniques are reduced encoder and decoder complexity and additional flexibility within the 7B/8B and 9B/10B transmission codes to allow the codes to be more easily converted for use with transmission codes other than the 16B/18B transmission code.

In a second aspect of the invention, decoding of 7B/8B and 9B/10B transmission codes is performed by converting coded vectors into a single image and then performing decoding operations to decode the coded vectors. This aspect has a benefit of reduced decoding complexity, as only the single image need be decoded. In one embodiment, the single image is a primary coded vector, and an alternate coded vector is an inverted version of the primary coded vector. When a coded vector is to be decoded, it is determined whether the coded vector is a primary or alternate coded vector. If the coded vector is a primary coded vector, then the coded vector is simply decoded. If the coded vector is an alternate coded vector, then the coded vector is inverted and then decoded. In a second embodiment, a single bit is used to determine if the coded vector is a primary or alternate coded vector. In a third embodiment, the single bit and the classification of the encoded vector are used to determine if the coded vector is a primary or alternate coded vector. Additionally, in this aspect, the classifications are preferably designed to support this single image decoding technique.

In a third aspect of the invention, techniques are presented for using the B/6B, 7B/8B, and 9B/10B transmission codes in other transmission codes such as 12B/14B and 17B/20B transmission codes. For instance, a 17B/20B transmission code ay be created by using two parallel 9B/10B decoders or by using one 7B/8B encoder and two 5B/6B encoders.

A more complete understanding of the present invention, as well as further features and advantages of the present invention, will be obtained by reference to the following detailed description and drawings.

BRIEF DESCRIPTION OF THE DRAWINGS

FIGS. 1A through 1C are respective trellis diagrams illustrating the 9B/10B code portion of a 16B/18B transmission code according to the invention;

FIGS. 2A through 2C are respective trellis diagrams illustrating the 7B/8B code portion of a 16B/18B transmission code according to the invention;

FIGS. 8A through 8L are each portions of an encoding table for the 59B/10B code portion of a 16B/18B transmission code, in accordance with one embodiment of the present invention;

FIGS. 16A through 16C are each portions of a table listing coded vectors from the trellis of FIG. 15 and the coding classifications for these coded vectors, in accordance with one embodiment of the present invention;

FIGS. 17 through 33 are trellis diagrams representing source vectors that have been extracted from FIG. 6 in accordance with principles of the present invention, where the trellis diagrams indicate source vectors, bits to be complemented (if any) in the source vectors, and an additional bit used for coding;

FIGS. 34A through 34D are each portions of an encoding table for the 7B/8B code portion of a 16B/18B transmission code, in accordance with one embodiment of the present invention;

FIGS. 50A through 50E are each portions of a decoding table for the 7B/8B code portion of a 16B/18B transmission code, in accordance with one embodiment of the present invention; and FIGS. 51 through 58 are trellis diagrams corresponding to the trellis diagrams of FIGS. 39 through 46, respectively, where the trellis diagrams of FIGS. 51 through 58 are used to illustrate decoding of the encoded vectors shown in FIGS. 39 through 46.

DETAILED DESCRIPTION OF PREFERRED EMBODIMENTS

Figure 1C:
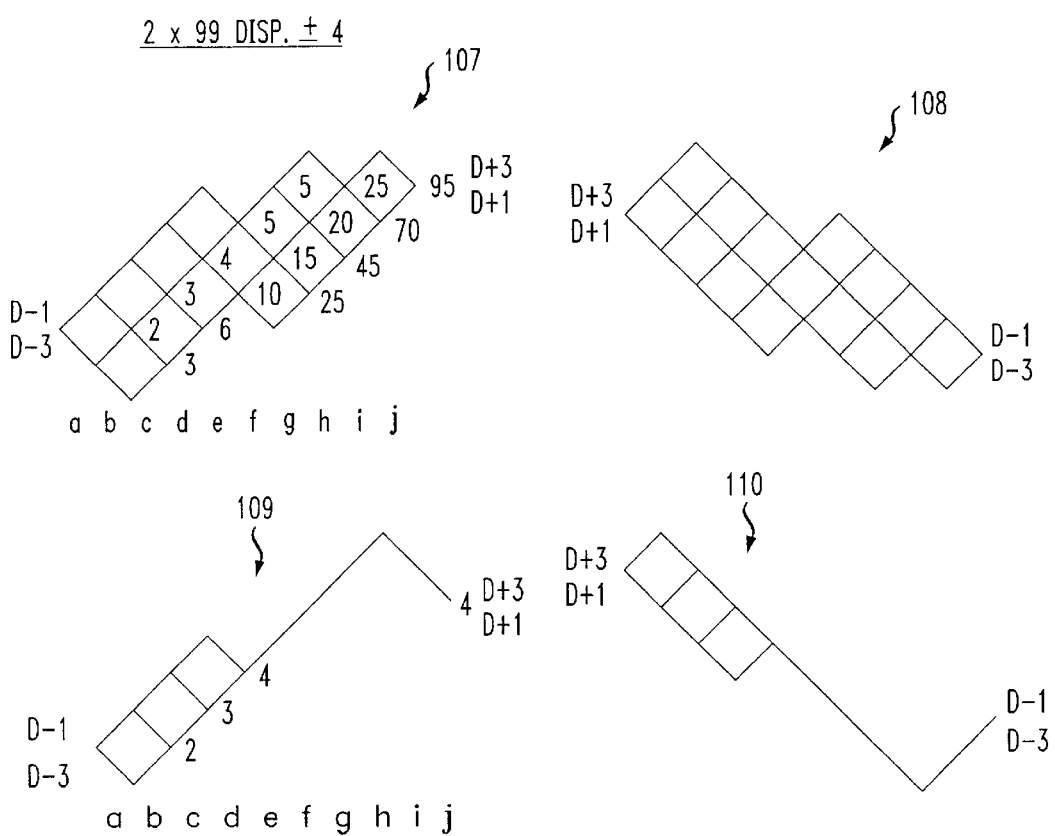

A good description of 16B/18B, 7B/8B, 9B/10B codes appears in U.S. Pat. No. 6,198,413, entitled "Partitioned DC Balanced (0,6) 16B/18B Transmission Code With Error Correction," issue date of Mar. 6, 2001, by inventor Albert X. Widmer, assigned to the assignee of the present invention and hereby incorporated by reference herein. Although additional description of these codes is given below, more information is also given in U.S. Pat. No. 6,198,413.

Aspects of the present invention add to the concepts disclosed in U.S. Pat. No. 6,198,413. In that patent, no specific mapping between uncoded and coded vectors is given. Aspects of the present invention provide this mapping in such a way that decoder and encoder complexity is reduced. Specifically, techniques are presented for minimizing the number of classifications for bit mapping and disparity control and for reducing the number of bits changed through bit mapping. The latter has an additional benefit of reducing, on average, the error spread in the decoded domain resulting from an error in a coded vector.

Additionally, decoding is reduced in aspects of the present invention by providing a single vector image for particular classifications of vectors. This simplifies decoding because the decoding process or apparatus need only be designed to decode one image. Generally, when a coded vector is received, it is possible to determine whether the coded vector was inverted when transmitted. The inversion is performed because of disparity rules, which are used to keep the code Direct Current (DC) balanced. When the coded vector was inverted when transmitted, the coded vector is again inverted before decoding. A preferable technique for determining whether a coded vector was inverted when transmitted is to determine a value of a coding bit and to determine a classification of the coded vector. Using these two criteria, it can then be determined whether the coded vector was inverted when transmitted. In one embodiment, if the coding bit is a one (1) and the classification of the coded vectors falls within certain classifications, then the coded vector is again complemented. This is described in greater detail below.

Additionally, aspects of the present invention are shown that apply the 7B/8B and 9B/10B codes to transmission codes other than the 16B/18B transmission codes.

For ease of reference, the detailed description is divided into the following sections: (I) Description of the 16B/18B Code; (II) Encoding Tables; (III) Operation for Various Applications; (IV) Implementation; (V) Logic Equations for 9B/10B Encoder and Decoder; (VI) Logic Equations for 7B/8B Encoder; (VII) 8B/7B Decoding; (VIII) Logic Equations for 8B/7B Decoder; (IX) Conclusion.

I. Description of 16B/18B Code

(a) Notation and Overview of 16B/18B Code

As used herein, the following terms are defined in the following manner. A "vector" is a particular bit pattern of defined length. A "source vector" is the uncoded data or control character from an information source. A "coded vector" is the bit pattern resulting from coding. The "run length" (RL) is the maximum number of contiguous one or zero bits, either inside bytes or across byte boundaries, as seen on the transmission media. A "code point" is an uncoded source vector together with the associated single vector or pair of vectors in the coded domain. The "disparity" of a vector, or the block disparity (DB), is the difference between the number of one and zero bits in a defined block of bits. The "running disparity" (RD) takes on a new value after every transmitted bit. It is incremented by one for a one bit and decremented by one for a zero bit. For balanced codes, it is usually referenced to a steady state average value of zero. The "digital sum variation" (DSV) is the difference between the maximum and minimum value of the running disparity between two points in the bit stream (not just between byte boundaries). For a balanced code, the DSV is finite over an arbitrarily long string of bits. The "normalized DC offset" of a block of bits is closely related to the low frequency spectrum content that the bit pattern can generate. It is defined as the sum of the RD values after each transmitted bit, divided by the number of bits in the block.

A "comma" indicates proper byte boundaries and can be used for the instantaneous acquisition or verification of the character and word boundaries. To be useful, a comma must occur with uniform alignment relative to the byte boundaries. In the absence of errors, the comma must not occur in any other bit positions, neither within characters nor through overlap between characters. A "comma character" is a coded byte completely containing a comma. A "special character" is a valid transmission character which does not translate into one of the valid data bytes. Special characters are also referred to as "control characters" because of the way they are used in the coding system.

As noted above, run length is defined as the number of identical contiguous symbols which appear in the signal stream. For a binary code, the run length is the number of contiguous ones or zeros after encoding. What is of interest is the shortest (X) and the longest (Y) run lengths that appear. These two parameters are often given in the form (d,k) where d=X−1 and k=Y−1. The (d,k) representation gives the minimum (d) and maximum (k) number of bauds between unequal symbols. For an (0,6) code, for example, any symbol can be followed by no more than 6 contiguous identical symbols, for a maximum run length of 7. Codes designed for digital transmission usually have a parameter d of zero.

The bits of the uncoded 9B vectors are labeled with the upper case letters 'ABCDEFGHI' and the control input for special non-data characters is labeled with 'K'. The bits of the coded 10B vectors are labeled with the lower case letters 'abcdefghij'. The bits of the uncoded 7B vectors are labeled with the upper case letters 'STUVWXY', and the bits of the coded 8B vectors are labeled with the lower case letters 'stuvwxyz'. Serial transmission is in the order in which the bits are listed above, from left to right, such that 'a' is first for 10B blocks and 's' is first for 8B blocks.

The 16B/18B code is partitioned into a 9B/10B and a 7B/8B code. At all 10B and 8B boundaries, the running disparity can assume one of four values: D=1, or D=±3. Encoded vectors in this code are either balanced and disparity independent, balanced and disparity dependent, or have a disparity of ±2 or a disparity of ±4. If the current running disparity is positive (+1 or +3), only disparity independent vectors or vectors with a required positive entry disparity may be entered and complementary rules apply for a negative running disparity. Almost half the source vectors are translated into a single balanced disparity independent encoded vector. All other 7B or 9B vectors are translated into one of a pair of complementary 8B or 10B vectors, respectively, according to the disparity rules above.

(b) 9B/10B Code

The 9B/10B code comprises a total of 530 code points with 828 coded 10B vectors as illustrated by the trellis diagrams of FIG. 1. The use and interpretation of trellis diagrams for this kind of application is explained in "The ANSI Fibre Channel Transmission Code," an International Business Machines (IBM) Research Report (1993), the disclosure of which is hereby incorporated by reference.

(i) 232 Balanced disparity independent 10B Vectors. There are 232 disparity independent balanced vectors, shown as trellis diagram 100 of FIG. 1A. Disparity independence means that they can be entered in a sequence regardless of the current starting disparity (one of the 4 values defined above). Balance means that the running disparities at the start and end of the vector are identical. The subset (232) of all possible 10B vectors (1024) chosen is the set of balanced vectors with a run length of no more than three at the leading and trailing boundaries. As shown in trellis diagram 100, there are 10 bits, a through j. The j bit is a coding bit that is added to the previous nine bits to create the 10 bit coded vector. As additionally explained in U.S. Pat. No. 6,198,413, the numbers shown in the trellis diagram 100 indicate how many paths or vectors there are that pass through a single point. For example, 232 vectors pass through the final point in the diagram.

(ii) 2×9 Balanced, Disparity Dependent 10B Vectors. These 9 data vectors have been added as a partial replacement of 10 vectors in FIG. 1B (illustrated by dotted line), which are preferably reserved as control characters herein. These new 9 data vectors are shown in trellis diagrams 101 and 103, with their complementary vectors shown in trellis diagrams 102 and 104. For a negative running disparity, 8 balanced vectors with either four leading ones or four trailing zeros and one vector with both four leading ones and four trailing zeros are included. These are shown in trellis diagrams 101 and 103. For a positive running disparity, the complementary vectors are used, which are shown in trellis diagrams 102 and 104.

(iii) 2×190 (180*) 10B Vectors with Disparity ±2. A set of 190 10B vectors comprises all bit patterns with a disparity of ±2, a run length of no more than three at the front end and no more than three zeros or four ones at the trailing end. These coded vectors are shown in trellis diagram 105 of FIG. 1B. An exact complementary set of another 190 vectors has a disparity of −2 and is shown in trellis diagram 106 of FIG. 1B.

A set of 10 vectors with four trailing ones is reserved for control characters in the 16B/18B environment and is not used for applications where it would generate false commas, e.g. for contiguous 10B vectors. These are shown in trellis diagram 105 of FIG. 1B by a dotted line (i.e., the 10 vectors that pass through the dotted line). A complementary set of 10 vectors, with four trailing zeros, are shown in the trellis diagram 106 of FIG. 1B.

(iv) 2×99 10B Vectors with Disparity ±4. The set of 95 10B vectors of the trellis diagram 107 of FIG. 1C comprises all bit patterns with a disparity of ±4, no more than four ones or two zeros at the front end and no more than one zero or four ones at the trailing end. An exact complementary set of another 95 vectors has a disparity of −4, and is shown in trellis diagram 108 of FIG. 1C.

The set of four 10B vectors shown in trellis diagram 109 of FIG. 1C comprises all bit patterns with a disparity of ±4, no more than three ones or one zero at the front end and exactly two zeros at the trailing end. An exact complementary set of another 4 vectors has a disparity of −4, and is shown in trellis diagram 110 of FIG. 1C.

(v) Control and Comma Characters. Up to eighteen 10B vectors can be reserved for information other than normal data. If any of the 18 control characters is to be encoded, a control line K must be asserted together with an appropriate data field. One of the control vectors is reserved for the generation of a singular comma sequence for quick synchronization. In a preferred embodiment, the comma extends over a first 10B field and the first three bits of the 8B field. The bit pattern is 011111110'111 for a negative starting disparity, or its complement for a positive starting disparity. For synchronization, only the 10 ones in bold type (or zeros) in an 11-bit field need to be monitored, assuming a synchronization enabling circuit is activated only after a majority of misaligned commas has been received. The construction of a complete 18B comma character is discussed below in reference to FIG. 3.

The 10B part of the comma sequence is listed as the last entry C508 in FIG. 8L. Just before C508, the other 17 control characters are also defined below in FIG. 8L.

(c) 7B/8B Code

The 7B/8B code comprises a total of 135 code points with 202 coded 8B vectors as illustrated by the trellis diagrams of FIG. 2.

(i) 69 Balanced 8B Vectors. A set of 68 disparity independent, balanced vectors is illustrated in trellis diagram 200 of FIG. 2A. The subset (68) of all possible 8B vectors (256) chosen is the set of balanced vectors with a run length of no more than three at the leading and trailing boundaries. As shown in trellis diagram 200, each 7B vector has bits s through z, with the z bit being a coding bit to create the 8B coded vectors.

Figure 2A:
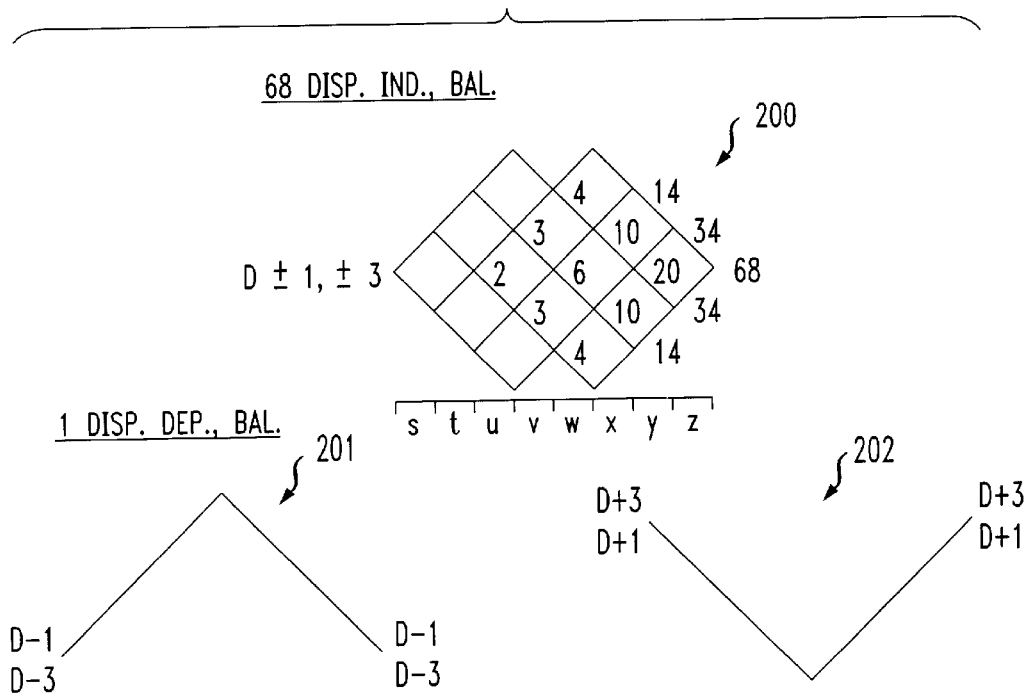

There is one disparity dependent, balanced, complementary vector pair illustrated in trellis diagrams 201 and 202 of FIG. 2A with a leading and trailing run of four.

(ii) 2×48 8B Vectors with Disparity ±2. A set of 48 8B vectors comprises all bit patterns with a disparity of ±2, no more than three ones or two zeros at the front end and no more than two zeros or three ones at the trailing end. These are shown in trellis diagram 203 of FIG. 2B. An exact complementary set of another 48 vectors has a disparity of −2, and is shown in trellis diagram 204 of FIG. 2B.

(iii) 2×18 8B Vectors with Disparity ±4. The set of twelve 8B vectors of trellis diagram 205 of FIG. 2C comprises all bit patterns with a disparity of ±4, no more than three ones or one zero at the front end and one to three ones at the trailing end. An exact complementary set of another 12 vectors has a disparity of −4, and is shown in trellis diagram 206 of FIG. 2C. All 12 vectors of trellis diagram 205 and 206 of FIG. 2C are data vectors.

Trellis diagram 207 of FIG. 2C illustrates a set of six optional control vectors with a disparity of ±4 and no more than two ones or one zero at the front and exactly one zero or 4 ones at the end. An exact complementary set of another 6 vectors has a disparity of −4, and is shown in trellis diagram 208 of FIG. 2C.

(iv) Comma Characters. For the generation of the comma sequence for the 16B/18B code, a subset of four complementary pairs of balanced 8B vectors must be made disparity dependent if they follow C508 of FIG. 8L, similar to what is done for balanced 4B vectors in 8B/10B control characters of U.S. Pat. No. 4,486,739. One or the other of the complements must be chosen depending on the polarity of the running disparity at the end of the 10B comma vector. The 8B bit patterns, from the table shown in FIG. 34, suitable for comma generation together with the required polarity in front of the 8B vector are listed below:

| Data Name | Polarity DR | Coded Bit Pattern | Polarity DR | Coded Bit Pattern | Data Name |
|---|---|---|---|---|---|
| D23 | + | 11101000 | − | 00010111 | D104 |
| D39 | + | 11100100 | − | 00011011 | D88 |
| D71 | + | 11100010 | − | 00011101 | D56 |
| D7 | + | 11100001 | − | 00011110 | D120 |

A short note about nomenclature is useful at this juncture. The data name "C508," which in this example is the coded vector "0011111110," is chosen as such because the "C" stands for "control" and the "001111111" corresponds to the 9B portion and has a value of 508. To determine this value, the formula used is $0\times2^1+0\times2^1+\ldots+1\times2^7+1\times2^8$, which is 508. Similarly, the data name "D23" is a data vector having a 9B portion of "1110100." It should be noted that these portions are written "backwards" as compared to how binary values are normally written. For instance, 23 is generally written as "100111."

To generate the top sequence, D23 is presented to the encoder and the encoded value is transmitted if the running disparity is positive; otherwise, the coded vector is complemented. At the receiver, if the disparity is negative at the end of the C508 10B vector (see FIG. 8), the following 8B vector is complemented, otherwise the receiver will decode it into D104, which may also be acceptable for some applications. Since for both polarities, the decoding process just drops the last bit (z), the complementation can be done before or after decoding. For implementation purposes at high data rates, the running disparity in front of the 10B comma vector may be observed, which is always complementary to the ending polarity.

Figure 3:
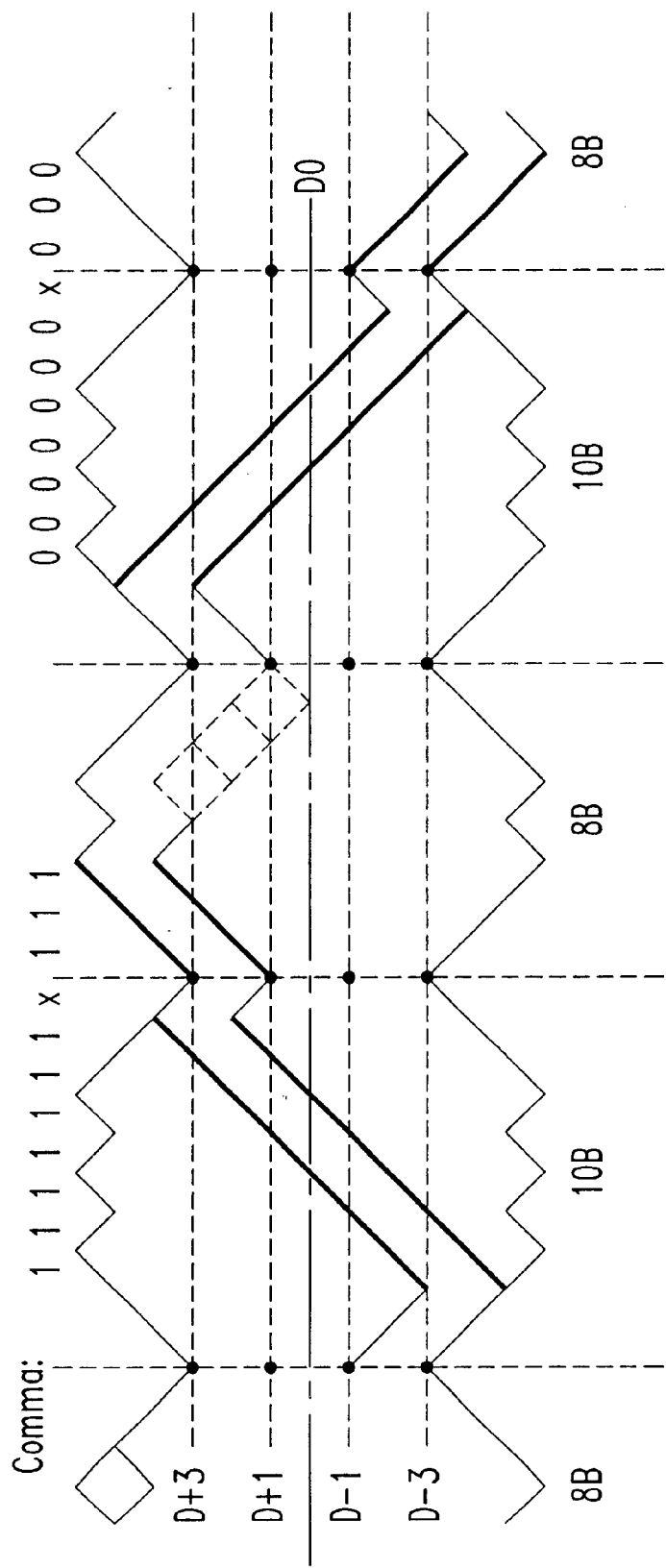
FIG. 3 is a trellis envelope diagram illustrating characteristics of a 16B/18B transmission code and exemplary configurations for a comma character sequence according to the invention.

FIG. 3 illustrates how the complete comma of either polarity fits into a trellis diagram. For purposes of the comma function, the possible location of the sequence at different disparity levels is irrelevant. To acquire the 2-byte word synchronization, the circuits may search for either one or both of the bit sequences '1111111x111' and '0000000x000'.

(d) Properties of the 16B/18B Code

The important characteristics of the code can be directly extracted from the trellis envelope diagram in FIG. 3. The vertical axis of the diagram in FIG. 3 represents running disparity, while the horizontal axis represents 18B digit intervals. FIG. 3 also shows four possible configurations for the comma sequence. Using FIG. 3 together with the trellis diagrams of FIGS. 1 and 2, one can verify that the comma sequence is singular, i.e. it cannot be reproduced in any other position relative to the vector boundaries neither within the 18B block nor across 18B block boundaries. For more information on FIG. 3, see U.S. Pat. No. 6,198,413.

(i) Clocking and Synchronization Parameters. The maximum run length is seven and no contiguous runs of seven are possible. The minimum transition density is four per 18B block for an indefinite length. The code includes a singular comma sequence.

(ii) Low Frequency Characteristics. The code is DC balanced. The maximum digital sum variation is 12. The normalized DC offset as defined in "The ANSI Fibre Channel Transmission Code," the disclosure of which has been incorporated by reference, is 4.83. The low frequency cut-off point for high pass filters must be located about 2.5 times lower than for Fibre Channel 8B/10B code for equal eye closure. The low frequency wander can be reduced on a statistical basis by scrambling the data before encoding. 8B/10B coded, scrambled data can operate with a 50% higher low frequency cut-off point than a coded worst case pattern. For 16B/18B code, the gain from scrambling before encoding is expected to be more.

(iii) Control Characters. The 10B and 8B fields include 18 and 7 control characters, respectively, so it possible to generate a total of [(18×135)+(7×530)]=6140 control characters in the 18-bit domain. The code includes four 18B control characters with the comma sequence. Depending on the application, the user may relegate some of the unused control characters to the class of invalid vectors.

(e) Implementation of Coder, Decoder and Error Checks

Figure 4:
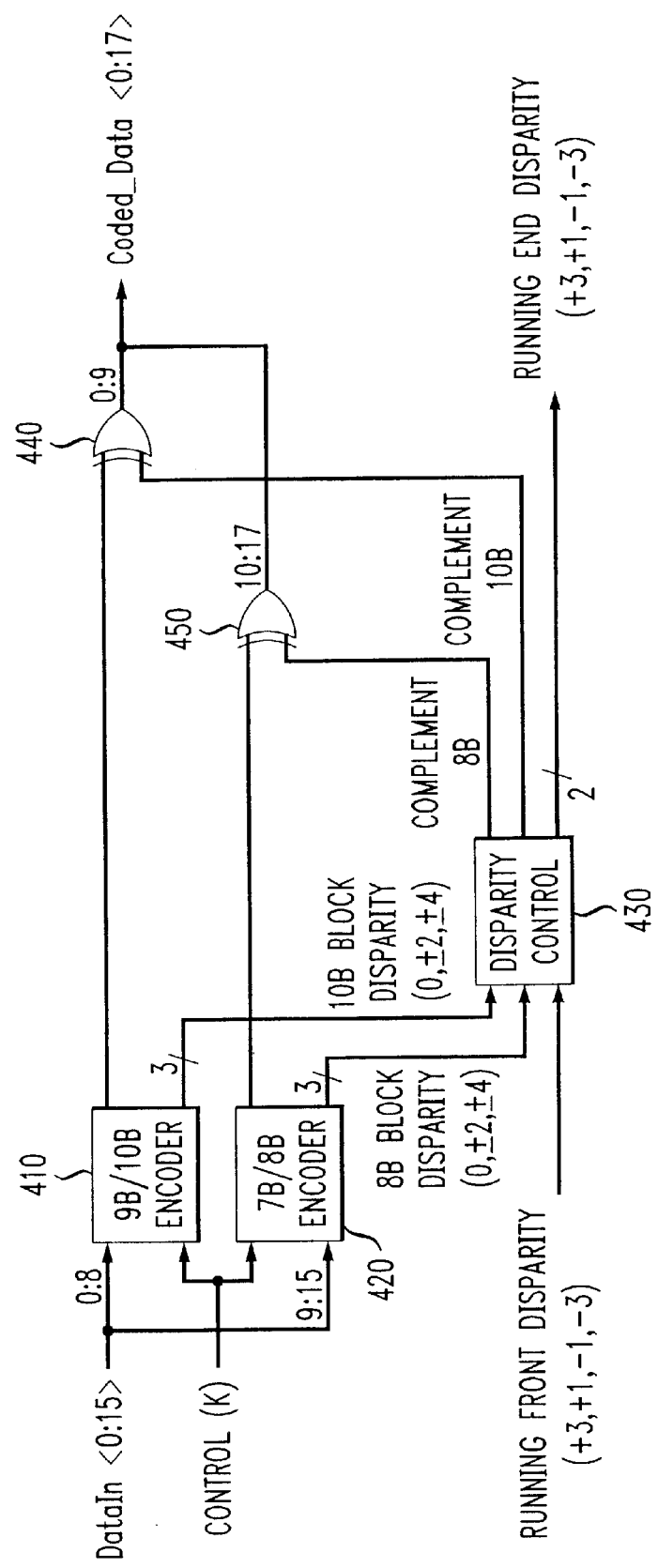
FIG. 4 is a block diagram illustrating an exemplary encoder for implementing a 16B/18B transmission code according to a preferred embodiment of the invention.
Figure 5:
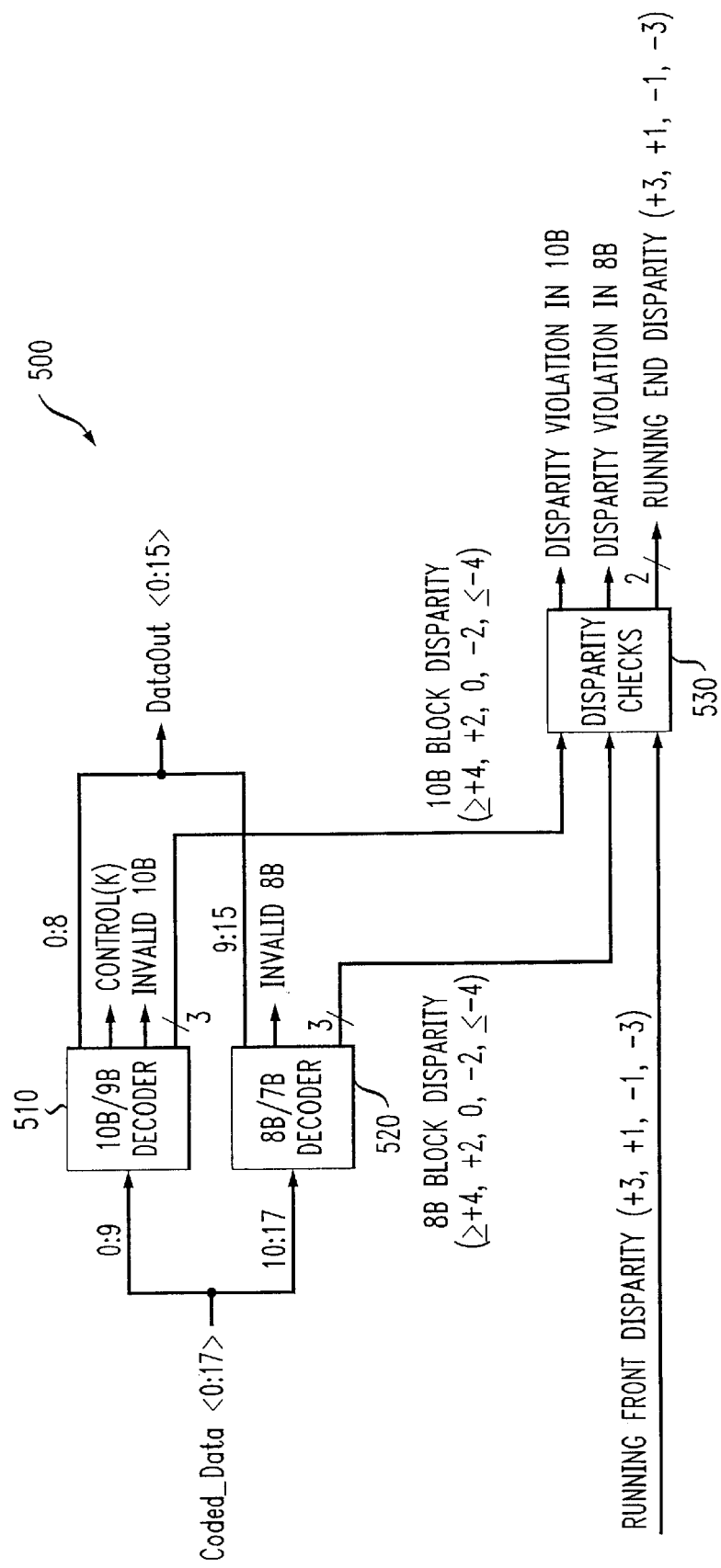
FIG. 5 is a block diagram illustrating an exemplary decoder for implementing a 16B/18B transmission code according to a preferred embodiment of the invention.

FIG. 4 and FIG. 5 show block diagrams for encoding and decoding, respectively. The decoder circuit includes code violation and disparity error checks. In the presence of errors, the received blocks may have a disparity of ±6, 8 or 10, which are outside the normal range but are assigned a disparity value of ±4 for purposes of the running disparity.

Referring now to FIG. 4, a block diagram of an exemplary encoder 400 for implementing a 16B/18B transmission code according to the invention is shown. It is to be appreciated that FIG. 4 illustrates an overall functional organization of an 16B/18B encoder of the present invention. Accordingly, FIG. 4 also represents in essence a data flow chart for the encoding system. The encoder 400 includes a 9B/10B encoder 410, a 7B/8B encoder 420, a disparity control block 430, and logic gates 440 and 450. It is to be understood that the element 440 represents a set of ten exclusive OR gates and element 450 represents a set of eight exclusive OR gates.

It is assumed that 16 bits of parallel data enter the encoder 400. It is to be understood that the data could be provided on parallel lines from an originating system or could be the output of a serial-to-parallel converter which accumulates data in 16-bit blocks and transfers it to the encoder 400 in parallel. Data bits are denoted in an x:y format. That is, Datain <0:15> denotes the 16-bit block (i.e., bit 0 through bit 15) input to the encoder 400. Similarly, Coded_Data <0:17> denotes the 18-bit binary digit block (i.e., binary digit 0 through binary digit 17) output by the encoder 400. The input block is partitioned such that the first 9 data bits 0:8 are gated into the 9B/10B encoder 410 for the 9-bit sub-block and bits 9:15 are gated to 7B/8B encoder 420 for the 7-bit sub-block. The 9B/10B encoder encodes the 9 data bits 0:8 into 10 binary digits 0:9, while the 7B/8B encoder encodes the 7 data bits 9:15 into 8 binary digits 10:17. The 9B/10B and 7B/8B encoders operate to a large extent independently of each other. A control line K is input to the sub-block encoders 410 and 420 to indicate whether the input-data lines represent data or control information such as frame delimiters and a limited set of other special characters.

It is to be appreciated that the logical functions that the blocks in FIG. 4 perform are in accordance with the respective 9B/10B code and 7B/8B code defined and explained above in the context of the trellis diagrams of FIGS. 1A through 1C and FIGS. 2A through 2C. The particular assignment of coded vectors to source vectors according to the inventive 16B/18B transmission code may be implemented in various forms of hardware, software and/or combinations thereof. For example, the encoder 400 of the invention may be implemented using one or more of the following approaches: (i) specific logic which implements the assignment and classifications between source vectors and coded vectors; (ii) logic synthesis; (iii) table look-up techniques, for example, using two separate tables for a subset of the 8B and 10B vectors, wherein the subsets may include those translations which are not readily classified and implemented with parity circuits in combination with simple combinatorial logic. Further, the encoder 400 may be implemented on a general purpose computer, including at least one processor and associated memory, suitably programmed to implement the encoding methodology associated with the 16B/8B transmission code of the invention, as described herein. However, other implementation approaches may be employed. The implementation depends on a suitable choice of assignments between the uncoded input (source) vectors and the set of coded vectors. By way of ex ample, a parity bit may be appended to the uncoded bits and then the number of bits to be changed for singular assignments between source vectors and coded vectors is minimized.

Note that it is preferred that combinatorial logic be used when encoding and decoding because the classifications developed herein and discussed below provide reduced encoding and decoding complexity.

The following is an example of how the encoder 400, in accordance with the trellis diagrams of FIGS. 1A through 1C and FIGS. 2A through 2C, encodes an input 16B block into 18 binary digits for transmission.

As a 9B/10B encoding example, combinatorial logic of the 9B/10B encoder may determine that the 9-bit input matches one of the 116 patterns which leads to the upper node '116' of FIG. 1A and then simply append a zero to generate a balanced coded vector. If the circuitry senses a data pattern leading to the lower node '116', a one bit is appended. In both cases, a balanced vector is generated which may be indicated with a value of '00' on the three lines labeled "10B Block Disparity" in FIG. 4. Since balanced vectors are disparity independent, the "Complement 10B" line is not asserted and the "Running End Disparity" equals the "Running Front Disparity."

For disparity dependent code blocks, the Disparity Control unit 430 determines whether the required polarity of the input disparity (plus or minus) matches the polarity of the current "Running Front Disparity" and asserts the "Complement 10B" line on a mismatch. The "Complement 10B" line is gated with the set of ten exclusive OR gates to provide the appropriate ten binary digits 0:9 for the input vector. The Disparity Control unit 430 also calculates the new "Running End Disparity" based on the "Running Front Disparity" and the disparity of the coded block after complementation, if any. The encoding of 8B vectors is exactly analogous to the above explanation for 10B vectors.

Referring now to FIG. 5, a block diagram of an exemplary decoder 500 for implementing a 16B/18B transmission code according to the invention is shown. It is to be appreciated that FIG. 5 illustrates an overall functional organization of an 18B/16B decoder of the present invention. Accordingly, FIG. 5 also represents in essence a data flow chart for the decoding system. The decoder 500 includes a 10B/9B decoder 510, an 8B/7B decoder 520, and a disparity checks unit 530. The decoder circuit includes code violation and disparity error checks. In the presence of errors, the received blocks may have a disparity of 6, 8 or 10, which may be lumped together with the disparity of 4 for the purposes of the running disparity (+4, −4). It is to be understood that an 18B/16B decoder according to the invention may be implemented in accordance with one or more of the approaches mentioned above for the 16B/18B encoder. However, other implementation approaches may be employed.

The decoding circuits of FIG. 5 generally perform the reverse function of encoding. As an example, if any balanced vector encoded according to the encoding example given with respect to FIG. 4 is received, it can be sensed by combinatorial logic and the appended bit with a value of either zero or one is simply dropped to revert to the uncoded data set and the Running disparity remains unchanged. For some unbalanced inputs, it is necessary to flip back some of the bits, but the last bit is generally dropped since it is just used to identify the coded vector. Additionally, some coded vectors can be handled during decoding by converting the coded vectors to a single image and then performing decoding. This is explained in greater detail below.

Encoded vectors which are outside the defined alphabets (e.g., all ones) cause the "Invalid 10B" or "Invalid 8B" outputs to be asserted. The Disparity Check circuit 530 updates the running disparity similar to the Disparity Control circuit 430 in FIG. 4. For the purposes of these calculations, disparities with an absolute value of greater than four generated by errors are assumed to be four. The circuit 530 also checks whether the required polarity for the entry disparity of a received vector matches the polarity of the current "Running Front Disparity." For example, if the 8B vector '01110111' is received with a current "Running Front Disparity" of either +1 or +3, there is a disparity violation. If a mismatch is detected for either a 10B or an 8B vector, the respective "Disparity Violation" line is asserted.

The implementation problems to be solved for the blocks labeled "Encoder" (i.e., encoders 410 and 420) and "Decoder" (i.e., decoders 510 and 520) are circuit area and delay reduction. Design principles for both the 7B/8B and 9B/10B codes are as follows: (1) Careful assignments and classifications between source vectors and encoded vectors, minimizing the number of different classifications and the number of individual bits to be changed to obtain the primary vectors; (2) Combinatorial logic to define classes of vectors by listing of all possible paths to a particular node in the trellis diagram; (3) Logic synthesis with some intelligent input for certain subsets of the problem. These are discussed in more detail below.

II. Encoding Tables

The tables shown in FIGS. 8 and 34 represent specific coding assignments between uncoded and coded vectors in the 9B/10B and 7B/8B domains, respectively. These tables are explained in greater detail below, but the techniques used to determine the tables and the classifications therein are discussed now.

(a) Design Principles

The assignment of encoded vectors to the uncoded source vectors should be done in a way that minimizes the complexity of both the encoder and decoder. It is assumed that this will be accomplished if the number of classifications is minimized both for bit mapping and disparity control. It is also assumed that complexity of encoder and decoder is minimized if the number of bits changed for bit mapping is minimized as well, which also reduces on average the error spread in the decoded bits resulting from an error in the coded domain.

For the decoding process, it is advisable to reduce the complementary vector pairs by complementation to a single image before the actual bit mapping back to a source vector is done. To this effect, in a first decoding step, all disparity dependent coded vectors with a j-bit or z-bit value of one are complemented. This procedure, which is not mandatory but is preferred, is anticipated in the creation of the coding table. The procedure may add some delay to the decoding circuitry, but also simplifies pipelining if needed anyway. In either case, the appended bit 0j for 9B/10B and z for 7B/8B) is simply dropped after the vector has been classified for bit mapping and disparity checking purposes. The coding tables are created in steps as follows:

1. Generate a list of all source vectors and all valid encoded vectors.
2. Assume a default value of zero for the appended bit.
3. In the coded domain, reserve the vector required for the comma generation. Assign it a source vector which matches the first n−1 coded bits. The variable n is the number of data bits in a code. For the 7B/8B code, n is 7, while n is 9 for a 9B/10B code.
4. Assign all source vectors which match the first n−1 bits of encoded vectors to the respective matching vectors and remove them from both lists.
5. Find sets of several source vectors that can be made to match an encoded vector of either polarity by complementing just one bit in the source vector and make the assignment.
6. Find sets of several source vectors which can be made to match a remaining coded vector by complementing two source bits, and so on.
7. Terminate this search when more than half the coded bits would be selectively complemented.
8. Look for single source vectors that can be made to match a coded vector by changing just one bit, and so on.
9. Once all data vectors have been assigned, assign the remaining coded vectors to control characters and choose a corresponding source vector which matches the first n−1 bits of the control vector.
10. Reevaluate the assignments to see whether certain swaps might lead to simplifications. For instance, see whether minor added complexities for bit mapping can simplify disparity control. It is desirable to have a uniform polarity requirement for the primary encoded vectors (plus or minus) across several classifications, e.g. for all K characters.

(i) Coding classifications for bit mapping. The following are coding classifications for bit mapping. The classifications are shown in more detail in FIG. 8, discussed below, which details a table of source to encoded vectors. Before discussing FIG. 8, it is advantageous to discuss nomenclature used for relating the classifications.

The first capital letter B, D, or F indicates the disparity of the coded vector: B indicates a Balanced coded vector; P indicates a complementary pair of balanced coded vectors which are selected based on the Polarity of the running disparity; D (Dual) indicates a complementary pair of coded vectors with a disparity of two; and F indicates a complementary pair of coded vectors with a disparity of Four.

Figure 6:
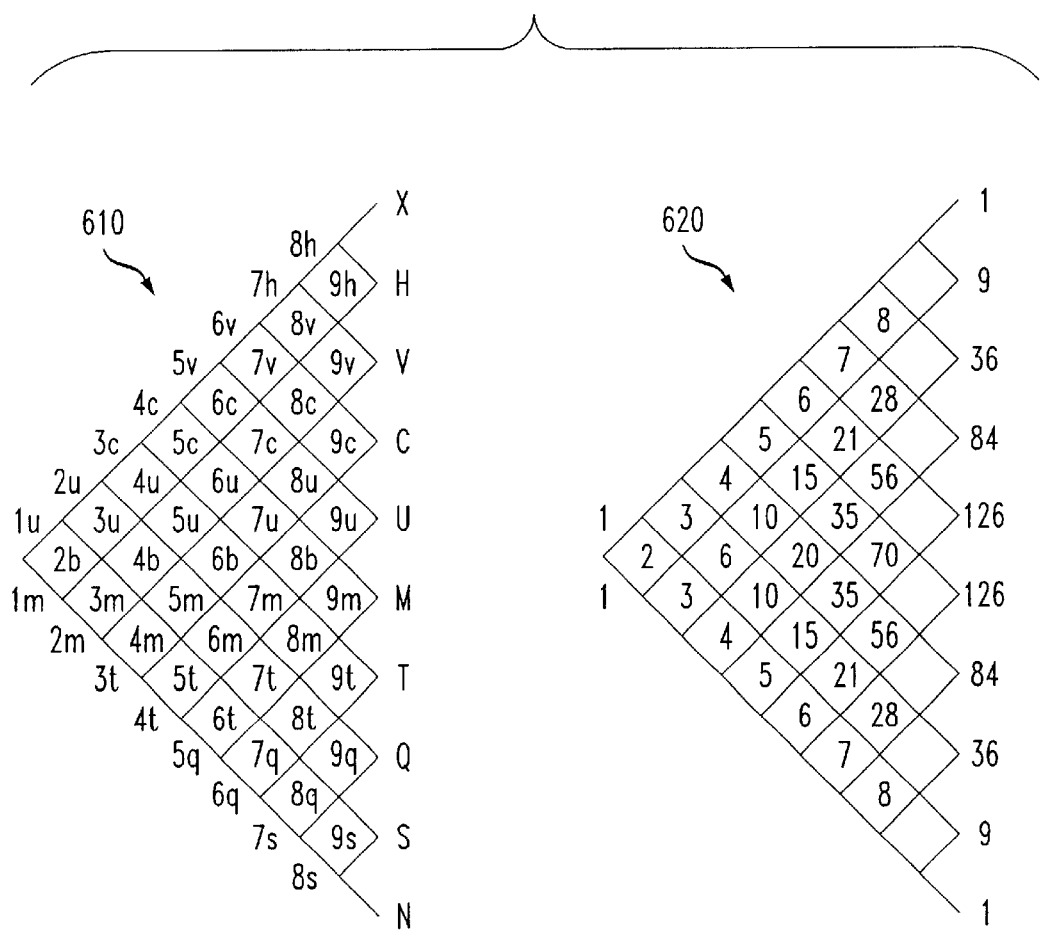
FIG. 6 is a trellis diagram illustrating notations used for disparity control classifications for the 9B/10B code portion of a 16B/18B transmission code, in accordance with one embodiment of the present invention.
Figure 7:
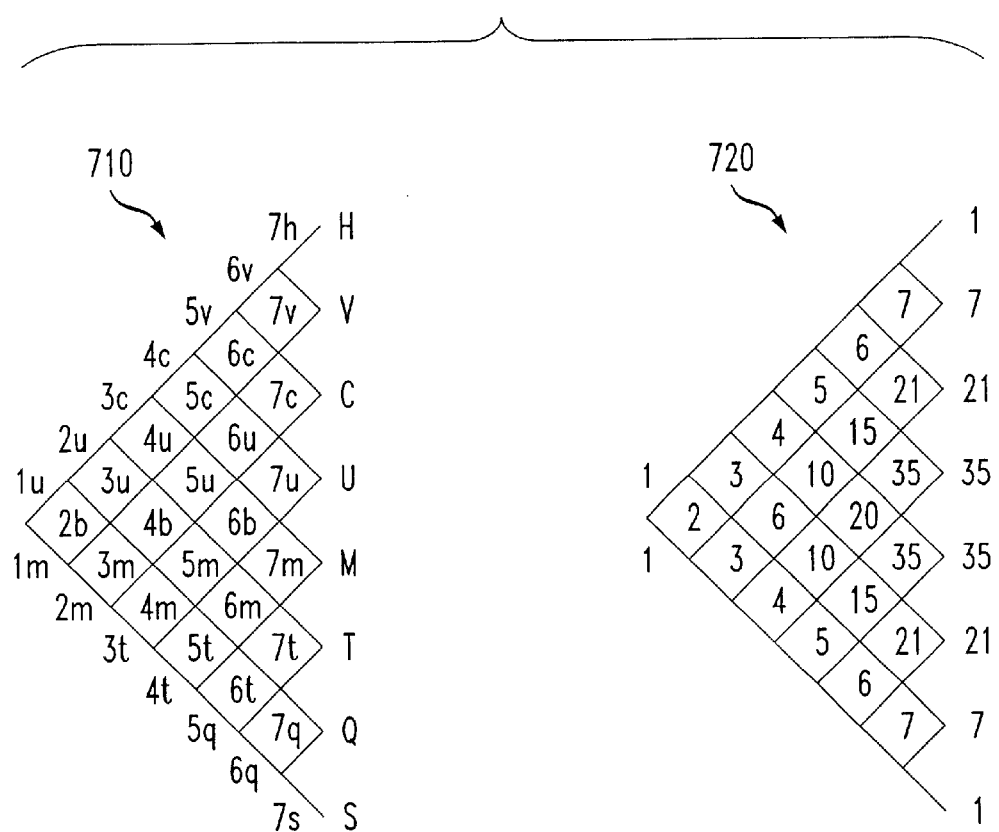
FIG. 7 is a trellis diagram illustrating notations used for disparity control classifications for the 7B/8B code portion of a 16B/18B transmission code, in accordance with one embodiment of the present invention.

The second capital letter used for classification may be more easily explained through reference to FIGS. 6 and 7.

Turning now to FIG. 6, two trellis diagrams 610 and 620 are shown indicating all possible 9B vectors. Trellis diagram 610 indicates different nodes through which a source vector may pass and trellis diagram 620 indicates how many source vectors pass through certain nodes. For instance, the source vector 001001000 would travel through nodes 1m, 2m, 3m, 4m, 5t, 6m, 7t, 8t, and 9q, and there are 36 total source vectors that end up at point Q. Referring now to FIG. 7, two trellis diagrams 710. and 720 are also shown indicating all possible 7B vectors. Trellis diagrams 710 and 720 indicates the same type of information as trellis diagrams 610 and 620, respectively.

The second capital letter indicates the disparity of the uncoded vector or the vertical ending coordinate in the trellises 610 or 710 of FIGS. 6 or 7, respectively, using the notation as follows: U (Up, Uni) indicates a disparity of +1; M (Minus) indicates a disparity of −1; C (Cube) indicates a disparity of +3; T (Three) indicates a disparity of −3; V (Roman numeral V) indicates a disparity of +5; Q (Quint) indicates a disparity of −5; H (Hepta) indicates a disparity of +7; S (Seven) indicates a disparity of −7; X (Roman numeral IX) indicates a disparity of +9; N (Nine, Negative) indicates a disparity of 9.

A third capital letter, if present, indicates the value of the control input bit, K.

Up to three leading capital-letters may be followed by one or more duets of a number paired with a lower case letter to indicate trellis nodes through which the members of the class must go, or not go if negated. The number marks the horizontal x coordinate and the lower case letter marks the vertical y coordinate. For an odd x-coordinate, the letter is the lower case version of the corresponding letter classification (i.e., XHVCUMTQSN) which is tied to the disparity of the uncoded vector as described above. For even x-coordinates, the lower case letter b (balanced) indicates a zero y-coordinate and for non-zero y-coordinates, the letter corresponds to the next letter classification closer to balance. Vectors going through negated nodes, e.g., 4t' where the prime indicates that this point must not be passed through, must not be part of the specified class of vectors. This notation is illustrated in the left-side trellis of FIG. 6 and FIG. 7. The trellis diagrams 620 and 720 show the number of vectors leading to each node.

The third and following capital letters other than K mark the uncoded bits, if any, which must be complemented to obtain the respective coded primary vector. The last coded bit j or z is appended with a zero value and complemented to a value of one, if indicated by a classification name ending in J or Z, respectively.

(ii) Classifications for disparity control. The coding implementations described in "The ANSI Fibre Channel Transmission Code" and in U.S. Pat. No. 4,486,739 to Franasek and Widmer, entitled "Byte Oriented DC Balanced (0,4) 8B/10B Partitioned Block Transmission Code," issued on Dec. 4, 1984 and the disclosure of which is hereby incorporated by reference, use more or less the identical classifications for bit mapping and disparity control. For the code of the present invention, however, the classifications for disparity are much broader and fewer than for bit mapping. The most comprehensive classes can be defined for the required entry disparity (DR) because only the polarity of this parameter must be known. The block disparity (DB) is a little more detailed, because both the polarity and the value (i.e., 0, 2, 4) of the disparity is required for the updating of the running disparity. In U.S. Provisional Patent Application No. 60/289,556, by Widmer, entitled "8B/10B Encoding and Decoding for High Speed Applications," filed on May 8, 2001 and the disclosure of which is hereby incorporated by reference, it is shown how to use these definitions to realize higher speed implementations. The expressions for zero disparity in the DB column, although redundant, are also listed because they can be used to speed up the coding process, especially with parallel encoders.

The notation for the disparity classifications is the same as for bit mapping, except that the first capital letter is left out. Only the data which define the uncoded vector groups in the trellis diagram of FIGS. 6 or 7 are included.

Referring now to FIG. 8, an encoding table for a 9B/10B code is shown. Each entry in the table contains a data name and, for each data name, an uncoded vector, a coding class, a coded vector, a required entry disparity (DR) class, a DR polarity, a block disparity (DB) class, and a DB disparity. For instance, for D0, the uncoded vector (i.e., the source vector) is "000000000" with a K bit of 0. The coding class is "DNCDFI," which means, from the definitions given above, that there is a complementary pair of coded vectors with a disparity of two (D), the disparity of the uncoded vector is −9 (N), and "CDFI" indicate that the bits C, D, F, and I need to be inverted, the vector belongs to the DR class N which requires positive (+) entry disparity, the DB class of the source vector is N, and the DB block disparity of the coded vector is −2. Note that bits that have been complemented in the coded vectors are marked in bold.

The table shown in FIG. 8 was designed using the techniques described above and should decrease complexity and delay for the 9B/10B encoders and decoders. Note that alternate values, as described below in reference to the 7B/8B table of FIG. 34, for the primary values are not shown. However, the table of FIG. 8 can easily be modified to support these alternate values (which, as described below, may be used to provide a single image for decoding). Additionally, although the preferred technique for encoding and decoding is through combinatorial logic, lookup tables or lookup tables combined with combinatorial logic may be used to encode and decode using the table of FIG. 8 and other tables described herein.

(b) Construction of the 9B/10B Coding Table of FIGS. 8A–8L

This section describes auxiliary graphs and diagrams which were used for the assignment of coded 10B vectors to uncoded 9B vectors in the table shown in FIG. 8. The diagrams discussed below have the uncoded (or source) vectors listed along with an accompanying trellis diagram. Long enumerations of vectors are in the text or are presented as tables in the figures or text. Note that the j-bit (the coding bit) is also shown in these figures. Note that the disparity of the uncoded vector is also shown in the figures.

For 435 vectors (417 data and 18 control) represented by the trellis diagrams of FIGS. 9 to 14, the first nine bits of the primary encoded vectors are identical to the corresponding source vectors. All trellis diagrams of FIGS. 9 to 33 represent the input to the 9B encoder, before any complementation of bits.

Figure 9:
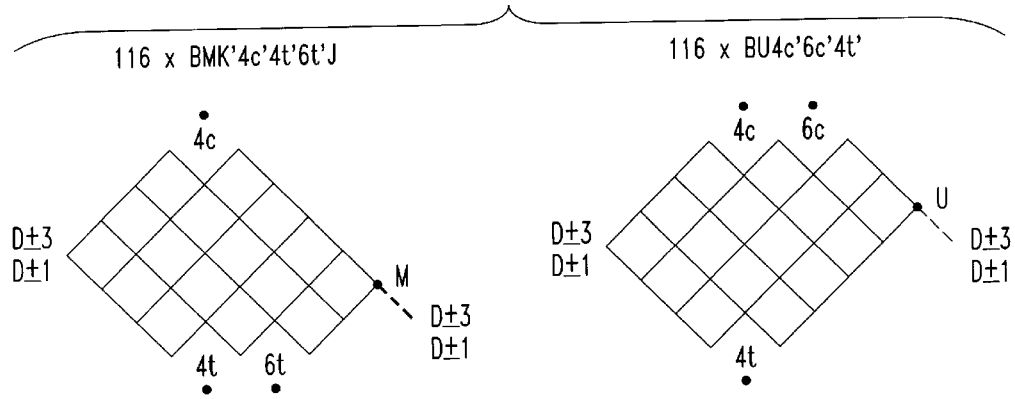
FIGS. 9 through 15 illustrate trellis diagrams, showing uncoded vectors and an additional bit used for coding, that were used for the assignment of coded 10B vectors to uncoded 9B vectors in the table of FIG. 8, in accordance with one embodiment of the present invention.

Referring now to FIG. 9, two trellis diagrams are shown, marked by their classes. The J-bit on the left side of FIG. 9 (i.e., BMK'4c'4t'6t'J) is marked with a double thickness line to indicate that it will be complemented when encoding. FIG. 9 represents all the 232 vectors of trellis diagram 100 of FIG. 1A.

Figure 10:
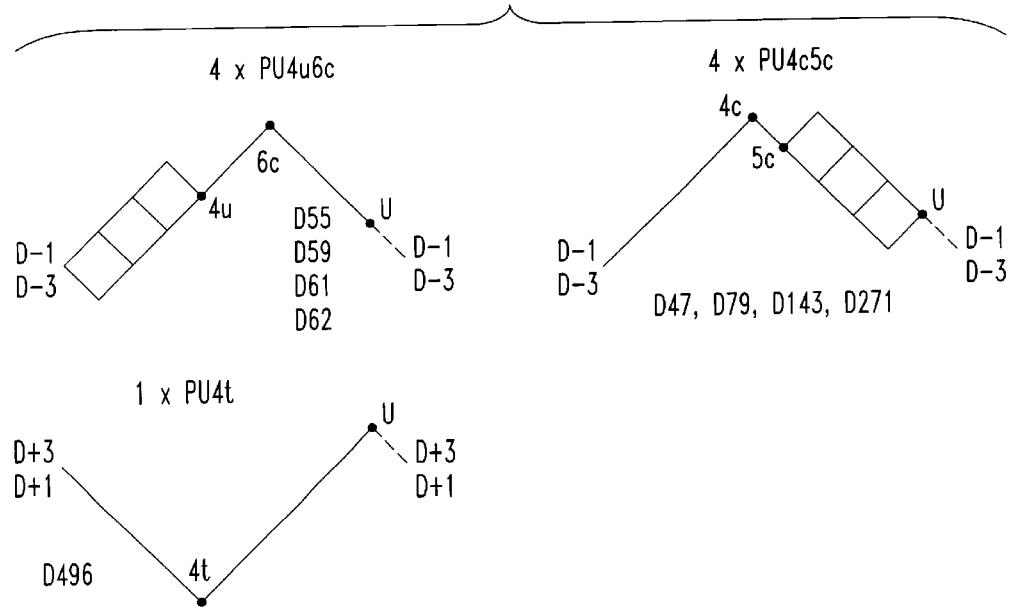

The trellis diagrams of FIG. 10 represent the 9 vectors of trellis diagrams 101, 102, 103, and 104 of FIG. 1A.

Figure 11:
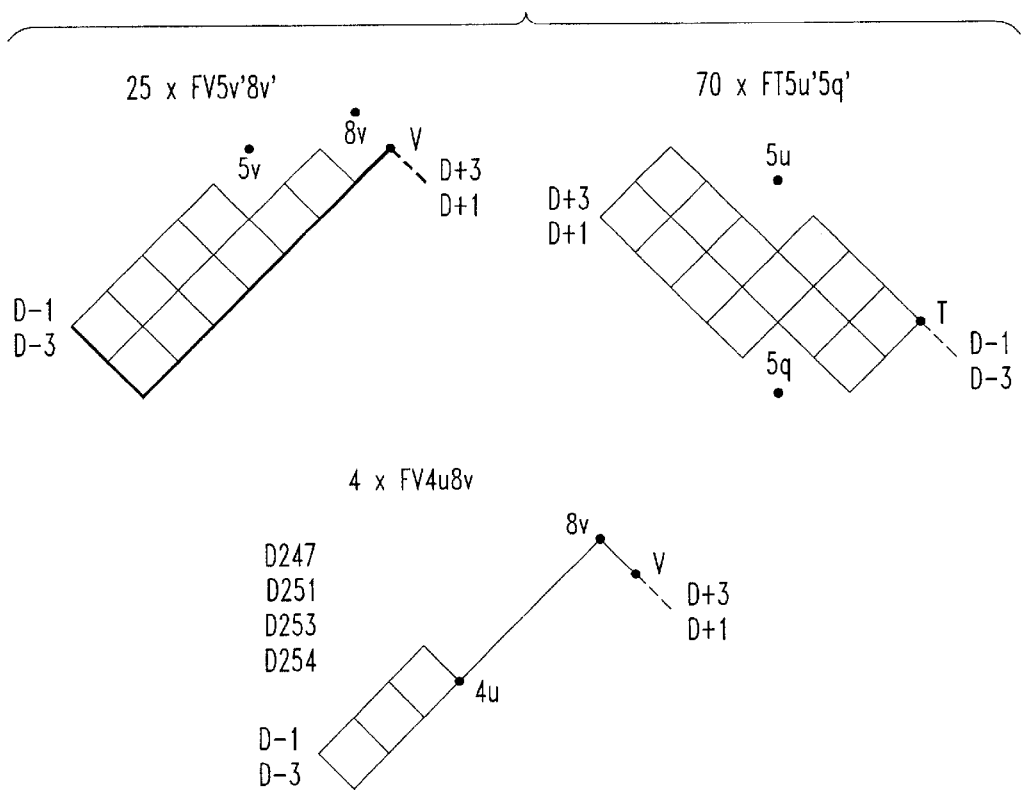

The trellis diagrams FV5v'8v' and FT5u'5q' of FIG. 11 use all 95 vectors of trellis diagrams 107 and 108 of FIG. 1C.

Enumeration of 25 Vectors FV5v'8v' of FIG. 11 are as follows:

D367 D375 D379 D381 D382 D431 D439 D443 D445 D446 D463 D471 D475 D477 D478 D487 D491 D493 D494 D499 D501 D502 D505 D506 C508

The source vector C508=001111111 with K=1 is coded into 0011111110. This represents the special character C508 and is part of the comma sequence. The same source vector D508 with K=0 represents the data vector D508 which belongs to the classification DVK'2mFHI as illustrated below in FIG. 31 and is coded into 0011101000.

Enumeration of 70 Vectors FT5u'5q' of FIG. 11 is as follows:

| | | | | | | | | | |
|---|---|---|---|---|---|---|---|---|---|
| D35 | D37 | D38 | D41 | D42 | D44 | D49 | D50 | D52 | D56 |
| D67 | D69 | D70 | D73 | D74 | D76 | D81 | D82 | D84 | D88 |
| D97 | D98 | D100 | D104 | D112 | D131 | D133 | D134 | D137 | D138 |
| D140 | D145 | D146 | D148 | D152 | D161 | D162 | D164 | D168 | D176 |
| D193 | D194 | D196 | D200 | D208 | D259 | D261 | D262 | D265 | D266 |
| D268 | D273 | D274 | D276 | D280 | D289 | D290 | D292 | D296 | D304 |
| D321 | D322 | D324 | D328 | D336 | D385 | D386 | D388 | D392 | D400 |

The 4 vectors of trellis diagram FV4u8v of FIG. 11 correspond to the 4 vectors of trellis diagrams 109 and 110 of FIG. 1C.

Figure 12:
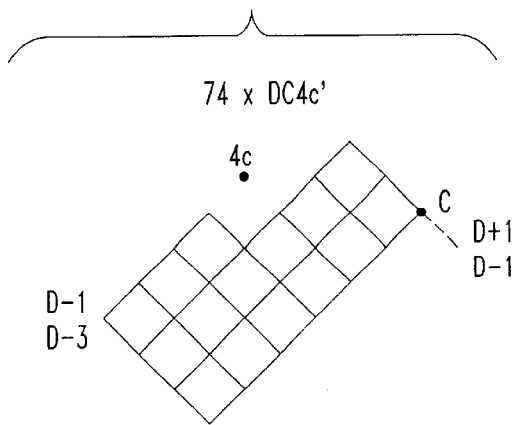

The 74 vectors of FIG. 12 belong to the set of vectors of trellis diagram 105 of FIG. 1B. Enumeration of 74 Vectors DC4c' of FIG. 12 is as follows:

D119 D123 D125 D126 D183 D187 D189 D190 D215 D219 D221 D222 D231 D235 D237 D238 D243 D245 D246 D249 D250 D252 D311 D315 D317 D318 D343 D347 D349 D350 D359 D363 D365 D366 D371 D373 D374 D377 D378 D380 D407 D411 D413 D414 D423 D427 D429 D430 D435 D437 D438 D441 D442 D444 D455 D459 D461 D462 D467 D469 D470 D473 D474 D476 D483 D485 D486 D489 D490 D492 D497 D498 D500 D504

Figure 13:
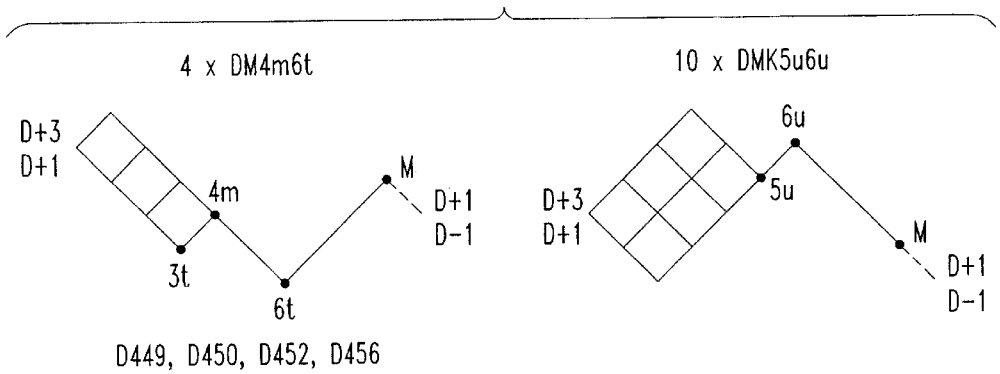

FIG. 13 uses another set of 14 vectors from trellis diagram 106 of FIG. 1B. Enumeration of 10 Control Vectors DMK5u6u of FIG. 13 are as follows: K39 K43 K45 K46 K51 K53 K54 K57 K58 K60

These 10 control vectors can be used in the context of the 16B/18B code. If 10B vectors are directly concatenated, they would generate false commas, so they cannot be used in that application. For all other applications, their use must be specifically evaluated.

Figure 14:
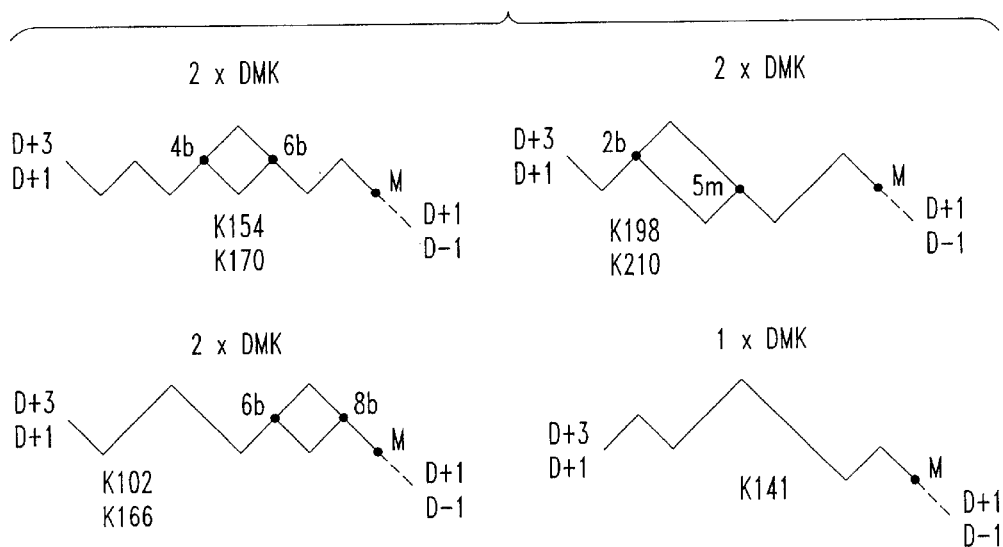

FIG. 14 shows another set of 7 control characters from trellis diagram 106 of FIG. 1B. There are no restrictions on the use of these 7 control characters, and the previously defined comma character C509.

For all control characters, the source vectors are chosen so there is no need to ever change any bits for encoding. The trellis of the coded control vectors are listed here for easier identification and for decoding purposes.

Figure 15:
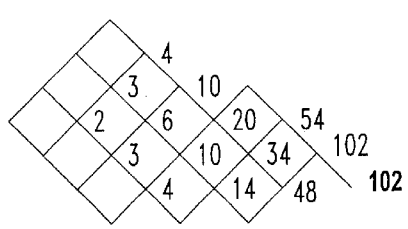

It should be noted that the 435 coded vectors with the appended zero J-bit illustrated in FIGS. 9 to 14 use up all 241 encoded vectors of FIG. 1A, all 99 encoded vectors of FIG. 1C, and 95 out of 190 encoded vectors of FIG. 1B, leaving 95 vectors for assignments, which require complementation of some individual bits in the source vector for mapping to the corresponding encoded vector. The trellis of FIG. 15 shows 102 vectors which are part of trellis diagram 106 of FIG. 1B. They are the remaining 95 data vectors plus the 7 control vectors of FIG. 14.

The 102 encoded primary vectors of FIG. 15 are listed in a table shown in FIG. 16 to avoid duplicate or erroneous assignments. They all belong to the class D with a disparity of two, with a uniform negative disparity for the primary vector. The 95 data vectors are also illustrated in FIGS. 17 to 33. Referring now to FIG. 16, this figure shows a table of 102 encoded primary vectors of the trellis diagram in FIG. 15.

The trellis diagrams of FIGS. 17 to 33 represent source vectors and have been extracted from FIG. 6, which represents the universe of all source vectors. These bit patterns have been compared with the available coded patterns remaining in FIG. 1B as illustrated in FIG. 15 and listed in the table shown in FIG. 16 to arrive at set of classifications according to the principles listed above.

The bits which are complemented for encoding are drawn in double-thickness lines, to the extent that the'complementation applies to all code points of a class.

Enumeration of 14 Vectors DQ4t'6mHI of the left trellis of FIG. 17:

| | | | | | | | | |
|---|---|---|---|---|---|---|---|---|
| D3 | D5 | D9 | D17 | D33 | D6 | D10 | D18 | D34 | D12 |
| D20 | D36 | D24 | D40 | | | | | | |

(c) Construction of the 7B/8B Coding Table (FIGS. 34A–D)

The methodology for the construction of the table shown in FIG. 34, a table for 7B/8B encoding, is the same as for 9B/10B. This task is much simpler because the number of vectors is only about one quarter. Referring to FIG. 34, a table for 7B/8B encoding is shown. In this table are also shown "alternate" coded vectors. These alternate coded vectors are used when the primary coded vector is not of the correct polarity. For example for D6, the primary coded vector has a required entry polarity DR of "+"; if this is not the correct polarity according to the disparity rules, then the alternate coded vector is used. The primary coded vector is inverted to create the alternate coded vector. Bits that are complemented in each primary vector are indicated through bold font.

Figure 35:
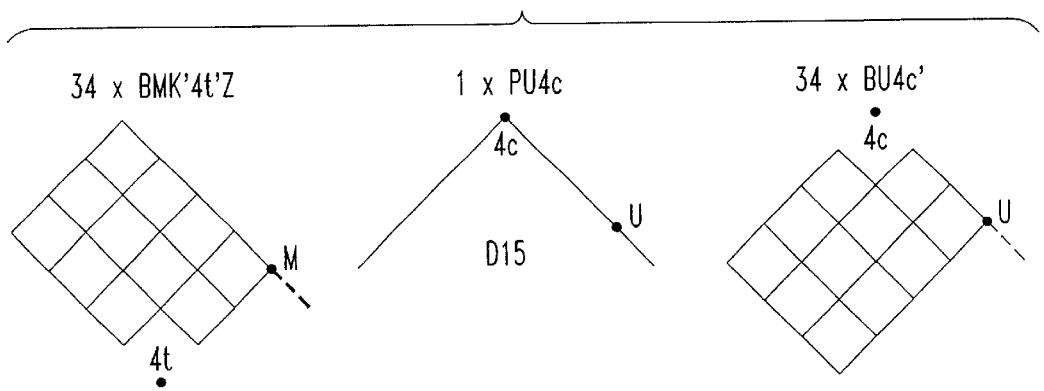
FIGS. 35 through 38 are trellis diagrams, showing uncoded vectors and an additional bit used for coding, that were used for the assignment of coded 8B vectors to uncoded 7B vectors in the table of FIG. 34, in accordance with one embodiment of the present invention.
Figure 36:
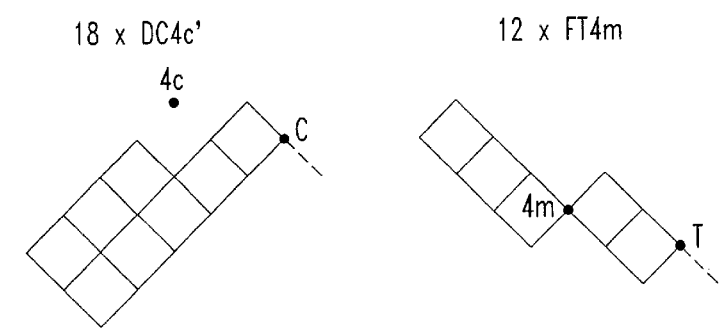
Figure 37:
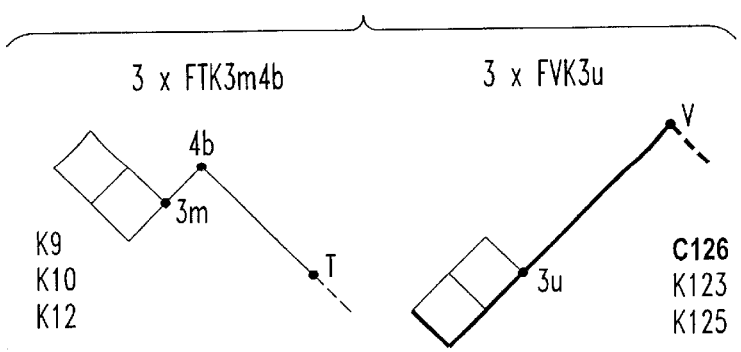

For 105 source vectors, represented by the trellis diagrams of FIGS. 35, 36, and 37, the first 7 bits of the primary encoded vectors are identical to the corresponding source vectors.

Enumeration of 18 Vectors DC4c' of FIG. 36:

D55 D59 D61 D62 D87 D91 D93 D94 D103 D107 D109 D110 D115 D117 D1–18 D121 D122 D124

Enumeration of 12 Vectors FT4m of FIG. 36: D17 D18 D20 D24 D33 D34 D36 D40 D65 D66 D68 D72

The 6 vectors shown in FIG. 37 are optional control vectors. C126 in double-thickness lines is used to generate a comma character for concatenated 7B/8B sequences and for 17B/20B code.

Figure 38:
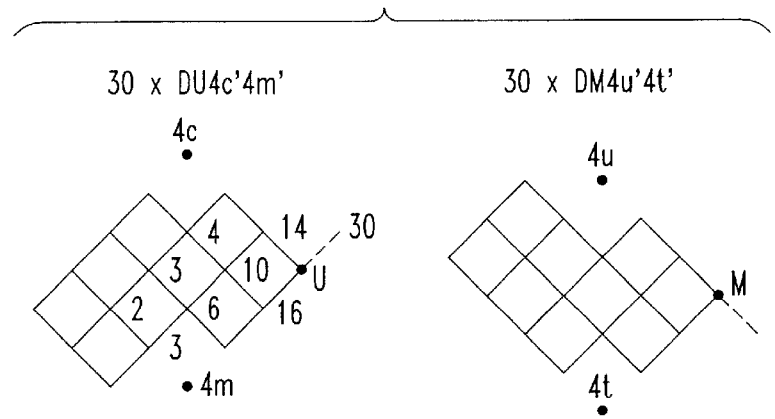
Figure 39:
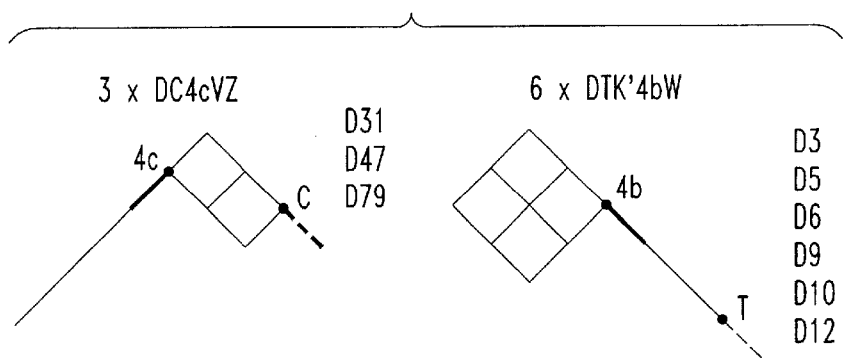
FIGS. 39 through 46 are trellis diagrams of vectors determined through use of the trellis diagrams of FIG. 38, where the trellis diagrams of FIGS. 39 through 46 indicate source vectors, bits to be complemented (if any) in the source vectors, and an additional bit used for coding.

The remaining 30 available 8-bit coded vectors are illustrated in FIG. 38 in true and complement form.

The vectors of FIG. 38 are used for 29 data vectors and one control vector (K98) as shown by the trellis diagrams of FIGS. 39 to 46. For the data vectors, one or more bits of the source vector has to be complemented to fit the respective coded vector. Again, the complemented bits are shown in double-thickness lines whenever the complementation applies to all vectors of a class.

Figure 45:
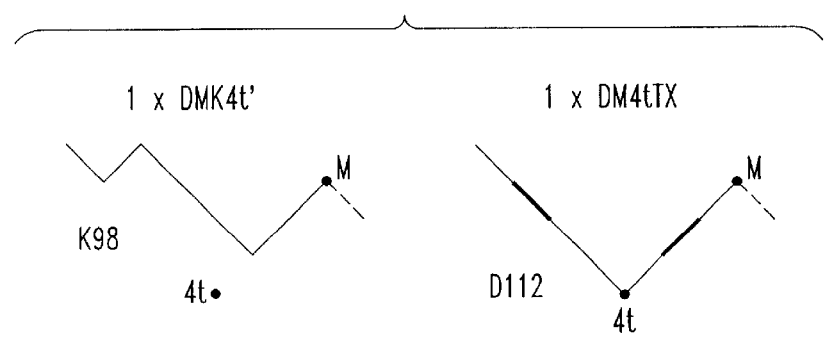
Figure 46:
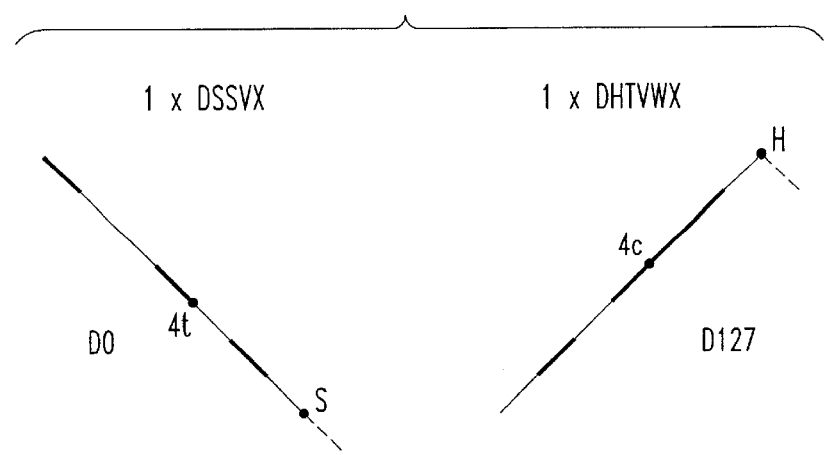

It should be noted that the control characters K and C in the last seven rows of FIG. 34 are illustrated in FIG. 37 and the trellis diagram DMK4t' of FIG. 45.

III. Operation for Various Applications

(a) Implementation of the Comma Sequence for 16B/18B Application

The input to the encoder should be the specified bit patterns, but only the first source vector (9B) should be accompanied with a K value of one. The disparity dependent operations in the second companion vector (7B) of the comma pair is activated if the respective Comma character is present in the first vector (C508 for 16B/18B and for concatenated 9B/10B; C126 for 7B/8B and for 7B/8B followed by 5B/6B).

(b) Operation of Concatenated 9B/10B Coding Blocks

Coded 10B blocks from the revised 9B/10B code can be concatenated without any change in the code. The run length remains at 7, and the digital sum variation also remains constrained to 12. The comma pattern also remains unchanged as shown in FIG. 3 but the second part which was provided by selected 8B vectors must now be provided by 10B vectors as follows:

1. One can pair C508 with D7, D335, D399, D504, or K39 and obtain five different 20-bit control blocks which include the comma sequence regardless of the running disparity and without the special disparity controls needed for the comma in the 16B/18B code.
2. If more 20-bit control blocks with a comma are needed, up to 14 additional ones can be provided using vectors with a leading run of three from the trellis of FIG. 1A. Because these vectors are balanced, the same polarity sensitive selections must be made as for the comma of the 16B/18B code.

| Data Name | Polarity DR | Coded Bit Pattern | Polarity DR | Coded Bit Pattern | Data Name |
|---|---|---|---|---|---|
| D23 | + | 1110100001 | – | 0001011110 | D488 |
| D39 | + | 1110010001 | – | 0001101110 | D472 |
| D71 | + | 1110001001 | – | 0001110110 | D440 |
| D87 | + | 1110101000 | – | 0001010111 | D424 |
| D103 | + | 1110011000 | – | 0001100111 | D408 |
| D135 | + | 1110000101 | – | 0001111010 | D376 |
| D151 | + | 1110100100 | – | 0001011011 | D360 |
| D167 | + | 1110010100 | – | 0001101011 | D344 |
| D199 | + | 1110001100 | – | 0001110011 | D312 |
| D263 | + | 1110000011 | – | 0001111100 | D248 |
| D279 | + | 1110100010 | – | 0001011101 | D232 |
| D295 | + | 1110010010 | – | 0001101101 | D216 |
| D327 | + | 1110001010 | – | 0001110101 | D184 |
| D391 | + | 1110000110 | – | 0001111001 | D120 |

(c) Operation of Concatenated 7B/8B Coding Blocks

Figure 47:
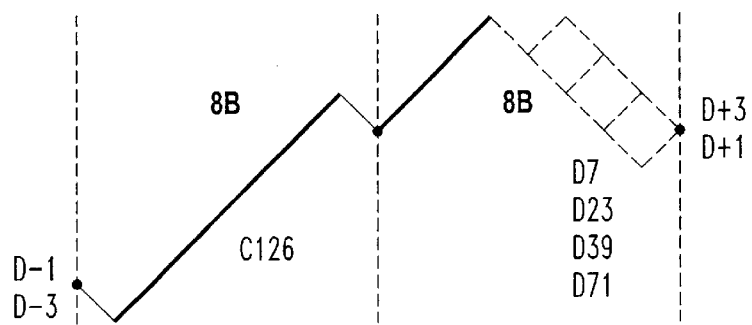
FIG. 47 illustrates an exemplary configuration for a comma character sequence according to the invention when 7B/8B coding blocks are concatenated.

The maximum run length is 7 and the digital sum variation is 12. To generate a comma, two 8B blocks are required. For this purpose, the control character C126 with a run of six has been added. It is listed at the bottom of the table shown in FIG. 34. The control character C126 can be used to generate a singular comma consisting of a run length of six followed contiguously by a run of one and ending with a run of three (0000001'000 or 1111110'111). Only the nine bold bits (i.e., nine zeros or nine ones, respectively) must be checked for synchronization. The comma is embedded in two blocks of eight and is illustrated for one polarity in FIG. 47. The second byte is taken from the group of balanced vectors of the trellis diagram 200 of FIG. 2A and must follow disparity rules as explained previously for the comma in the 16B/18B code, where balanced vectors are made disparity dependent to obtain certain prescribed waveforms.

| Data Name | Polarity DR | Coded Bit Pattern | Polarity DR | Coded Bit Pattern | Data Name |
|---|---|---|---|---|---|
| D7 | + | 11100001 | – | 00011110 | D120 |
| D23 | + | 11101000 | – | 00010111 | D104 |
| D39 | + | 11100100 | – | 00011011 | D88 |
| D71 | + | 11100010 | – | 00011101 | D56 |

(d) Other Applications, 17B/20B Code, 10B/12B Code

Machine upgrades sometimes require serialization of parallel buses to deal with entry and exit congestion at the board level or other modular building blocks. These serial links are usually not based on neatly designed new serial architectures but must be based on existing bus structures which may not be modulo eight in width. To serve these requirements, it is useful to have a variety of code widths in the design arsenal and techniques to combine them into a wider structure. As an example, one application requires the efficient conversion of a 17-bit bus into serial form. This could be solved by two parallel 9B/10B coders which would provide one bit of spare capacity in a 20-bit coded block. Another, perhaps simpler and adequate solution combines one 7B/8B coder with two 5B/6B coders taken from "The ANSI Fibre Channel Transmission Code," U.S. Pat. No. 4,486,739, and U.S. Provisional Patent Application No. 60/289,556 (each of which has already been incorporated by reference) to translate the 17 source bits into 20 coded bits suitable for serial transmission.

Figure 48:
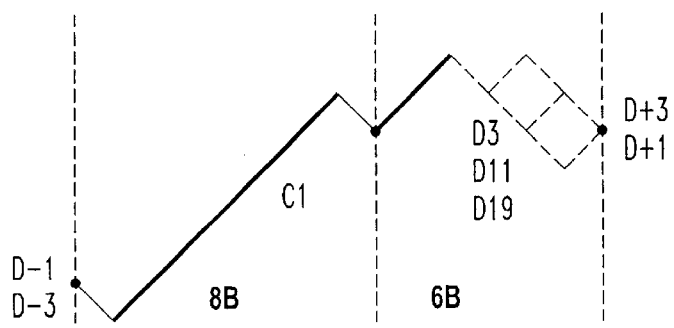
FIG. 48 illustrates an exemplary configuration for a comma character sequence according to the invention when a 12B/14B codes is created using 7B/8B and 5B/6B codes.

The resulting 17B/20B code has a maximum run length of 6 and a digital sum variation of 10. The synchronizing sequence or comma can be defined as a run of 6, contiguously followed by a run of one and ending with run of 2 (111111011 or 000000100) as shown in FIG. 48. This sequence can be generated by C126 from the 8B alphabet followed by the balanced vectors D12, D20, or D28 from the 6B alphabet of "The ANSI Fibre Channel Transmission Code," U.S. Pat. No. 4,486,739, and U.S. Provisional Patent Application No. 60/289,556 (each of which has already been incorporated by reference). Again, the three balanced 6B vectors must be made disparity dependent if they follow C126. If the running disparity at the front of the 6B section is positive, they must be complemented.

| Data Name | Polarity DR | Coded Bit Pattern | Polarity DR | Coded Bit Pattern | Data Name |
|---|---|---|---|---|---|
| D3 | + | 110001 | – | 001110 | D28 |
| D11 | + | 110100 | – | 001011 | D20 |
| D19 | + | 110010 | – | 001101 | D12 |

It is obvious that the same rules apply to a 12B/14B code which would be partitioned into a 7B/8B code followed by a single 5B6B code.

IV. Implementation

(a) Node Notation

A node name such as 4u stands for all the trellis paths from the origin at the left to that particular node in FIG. 6 or 7. An expression such as 24 stands for the paths from node 2x to node 4x, where x can be any identical node letter. In the following equations, some capital letters have overlapping use for group classifications and for the designation of a specific uncoded input bit. If the dual use can be ambiguous such as for a single letter designating a classification, the classification is referred to with bold type. The bit designations are always referred to with plain type. As an example, the bold letter refers to all input patterns which lead to the node 7s in the trellis of FIG. 7, and the plain letter S refers to the uncoded bit S of the 7B/8B code.

As with the 8B/10B code, a large number of code points require no logic definition or action. For example, for the class BU4c'6c'4t' of FIG. 9, all input bits remain unchanged and a zero bit is appended as a default. For the class BMK'4c'4t'6t'J, shown in FIG. 9, all input bits remain unchanged but the appended zero bit is complemented to one. For both groups, the encoded disparity is zero which is also a default value. The it coding for these two classes is essentially a parity circuit, but because not all 9 bit combinations belong to the class, it can be simplified from the classical universal approach. Looking at the trellis diagrams of FIG. 9 for these two classes of vectors, one can see that there is probably an advantage in using 4-way (or two stages of 2-way gates) rather than 3-way gates in a first stage, because this leads to just three rather than four nodes.

An efficient and high speed implementation of the coding rules with combinatorial logic involves probably both manual design and synthesis tools. The trellis diagrams listed above can be used as a start because they provide insight on how to best define the logic functions. Because there are so many vectors, a good nomenclature for specific logic functions is essential for any manual work. It is suggested that some logic functions be identified by the particular node names taken from the left trellis of FIG. 6 or 7 for unrestricted paths to that node. If some paths are not allowed, this can be expressed by prefixes taken from the relevant classification names.

(b) Examples

As an example, please refer again to the 10-bit trellis with the heading BU4c'6c'4t' of FIG. 9. The top node four bits from the left is 4u. The paths to this node are unrestricted and there are four of them, so access to this node can be expressed as follows:

$$4u = ABCD' + ABC'D + AB + CD + A'BCD$$

The upper node, eight bits from the left, is 8u. The path from the front end to 8u for the coding class under consideration (BU) is restricted, it must not go through nodes 4c or 6c. To mark this restriction, the node may be labeled as 4c'6c'8u and is defined as follows:

$$4c'6c'8u = [4u \cdot (EF'GH' + EF'G'H + E'FGH' + E'FG'H + E'F'GH)] + [4b \cdot (EFGH' + EFG'H + EF'GH + E'FGH)] + [4m \cdot EFGH]$$

A similar logic expression can be written for the node 4c'4t'8b and the path to node 9u=U for the coding class BU4c'6c'4t' can thus be defined by the following logic expression:

$$U = (4c'6c'8u \cdot I') + (4c'4t'8b \cdot I)$$

Similar logic equations can be written for all the other classifications, but most of them are much simpler and require fewer logic gates because there are more restrictions, i.e. forbidden nodes. It should also be noted that many basic logic functions can be shared among many classifications and this sharing can be increased if the logic expressions with 3 or 4 inputs are partitioned into smaller steps as was done for the 8B/10B coder of "The ANSI Fibre Channel Transmission Code," which has already been incorporated by reference. As an example, the nodes 4u, 4b, and 4m are equivalent to L31, L22, and L13, respectively, in that design, and they are all generated from a combination of 2-way gates which also drive other functions.

V. Logic Equations for 9B/10B Encoder and Decoder (a) 9B/10B Encoding Equations

Generally, the encoded bits retain the value of the unencoded bit (a=A, b=B, etc), but a specific source bit is complemented (a=A', b=B', etc) if and only if (iff) the respective equation below is true. In a first step, the raw equations are read from the 9B/10B Encoding Table, which is shown in FIG. 8. For the encoded bit 'a', the following can be read from the table of FIG. 8:

$$a = A' \text{ iff } DC6v + DC5v6c + DV4c5c8v + DV5v7c + DH6v7v +$$

$$DH4c5c + DH3c4u + DH1u3u + DX + DS4t5t + DS5q6t +$$

$$DQ4t6m'8t + DQ4t5t8q + DQ5q7q8q +$$

$$DT5q7t8t + DT5q6t7q + DM5q$$

Comparable equations can be obtained from the table of FIG. 8 for all the other bits, the required disparity DR and the block disparity DB.

Figure 24:
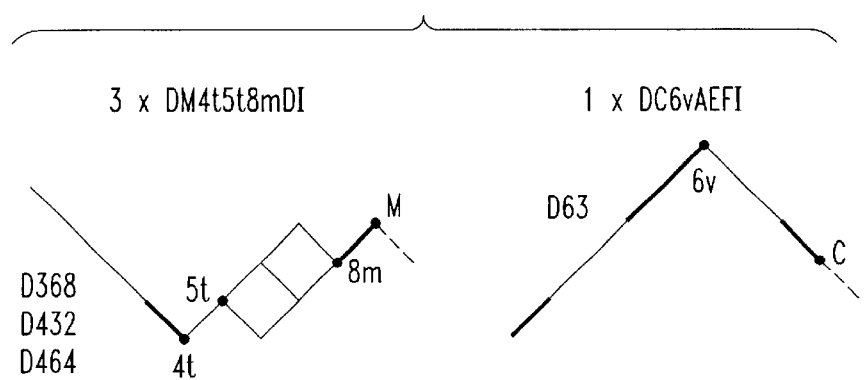
Figure 25:
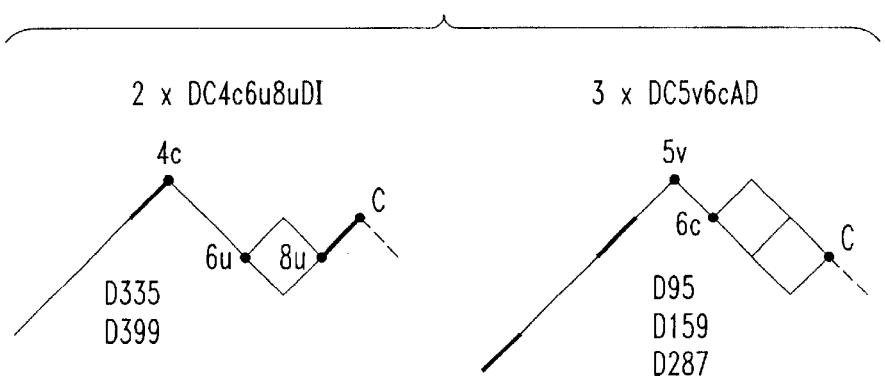
Figure 26:
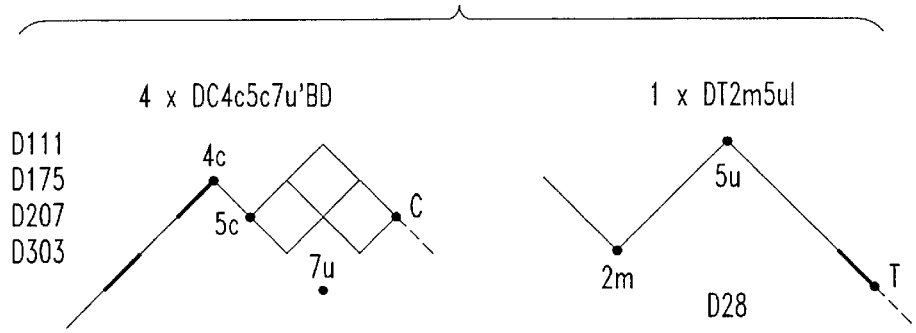
Figure 27:
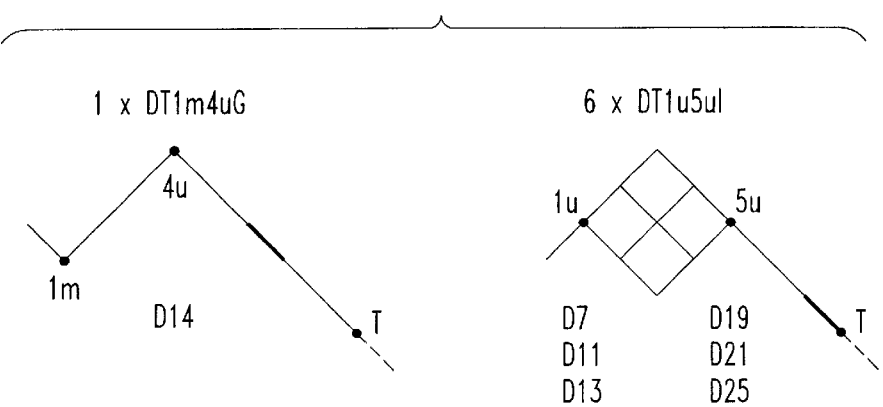
Figure 28:
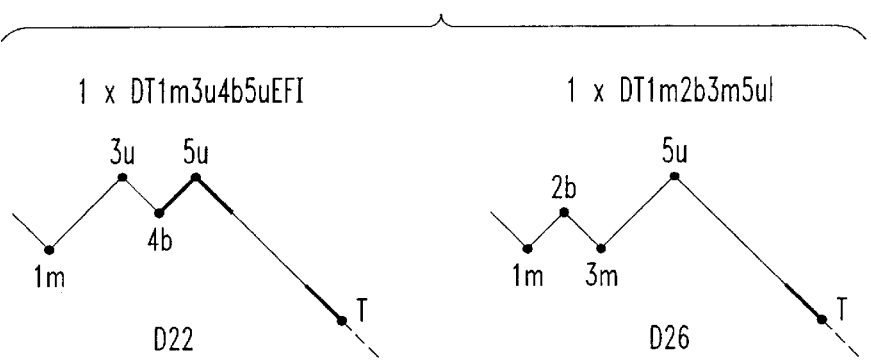

The second step is to simplify the equations by taking advantage of redundancies and overlaps which are readily recognizable from an examination of the relevant trellis diagrams. As examples:

A merger of DC6vAEFI (i.e., the right side) of FIG. 24 and DC5v6cAD (i.e., the right side) of FIG. 25 shows that the classifications C6v+C5v6c can be reduced to C5v.

Figure 30:
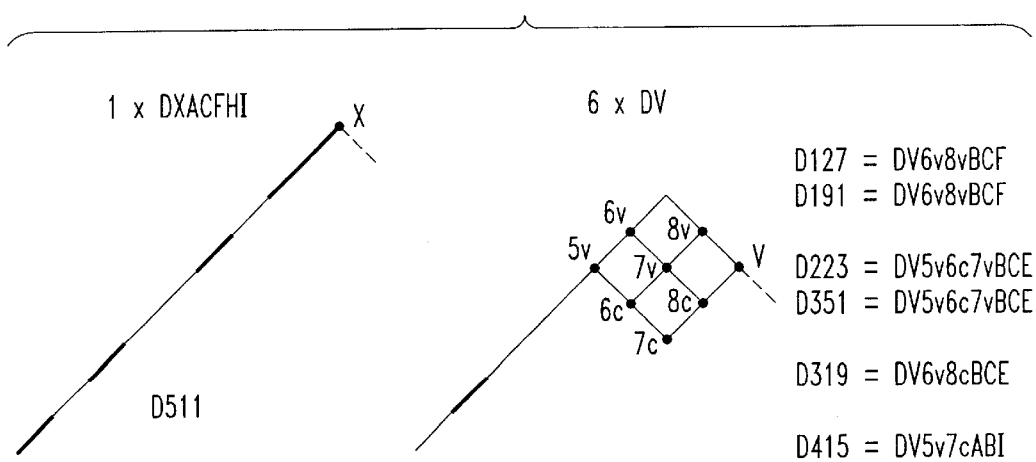
Figure 31:
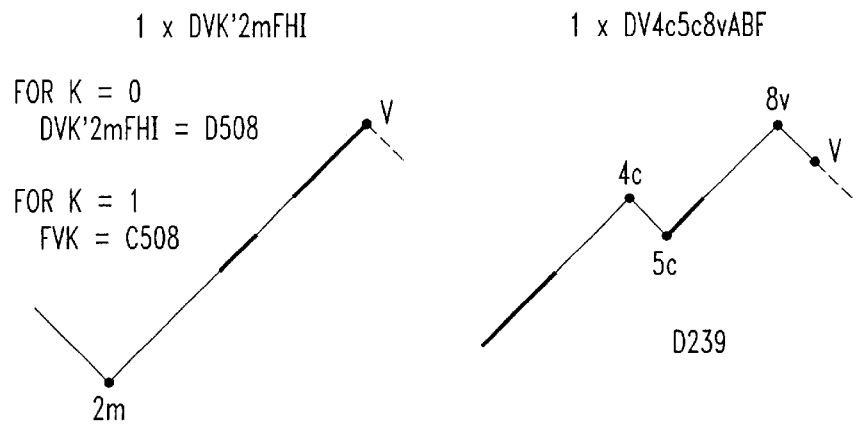

A merger of DT1m2b3m5u1 (i.e., the right side) of FIG. 30 (i.e., D415) and DV4c5c8vABF (i.e., the right side) of FIG. 31 shows that the classifications V5v7c+V4c5c8v can be reduced to V4c·(5v7c+5c8v).

Figure 32:
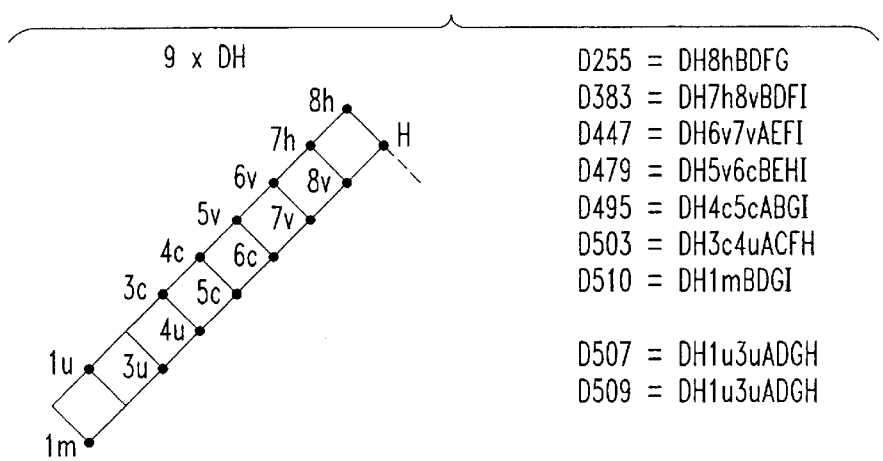

A merger of D447, D495, D503, D507, and D509 in FIG. 32 shows that the classifications H6v7v, H4c5c, H3c4u, and H1u3u can be reduced to H1u·(5c+6v7v).

Figure 33:
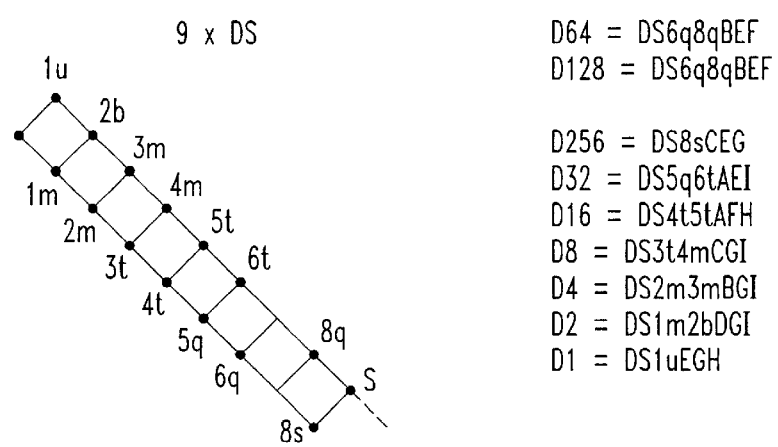

A merger of D32 and D16 in FIG. 33 shows that the classifications S5q6t and S4t5t can be reduced to S4t6t.

Figure 20:
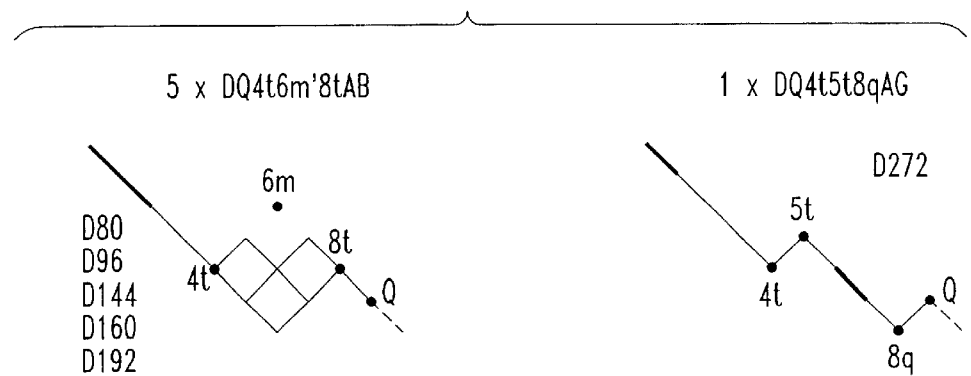
Figure 21:
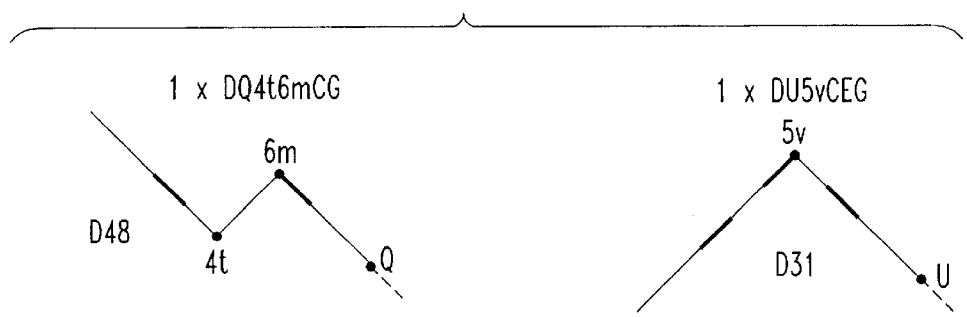
Figure 22:
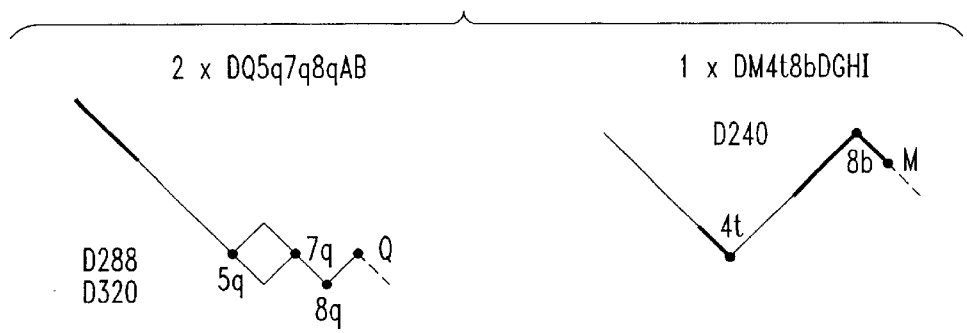
Figure 23:
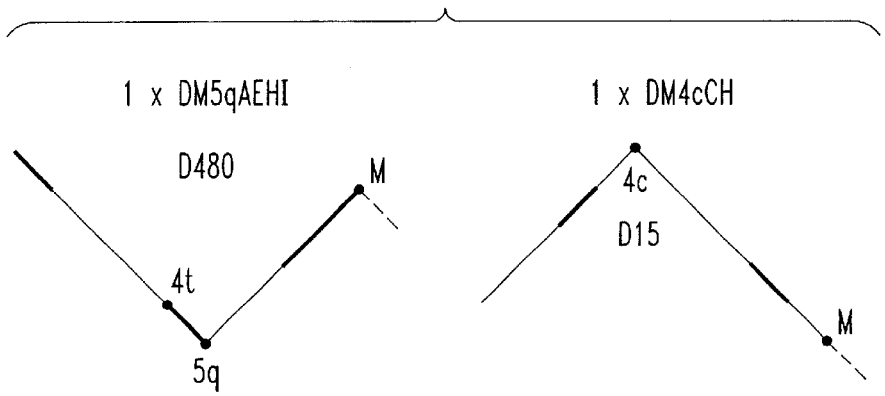

A merger of FIG. 20 and DQ5q7q8qAB (i.e., the left side) of FIG. 22 shows that the classifications Q4t6m'8t, Q4t5t8q, and Q5q7q8q can be reduced to Q4t6m'7s'.

Figure 29:
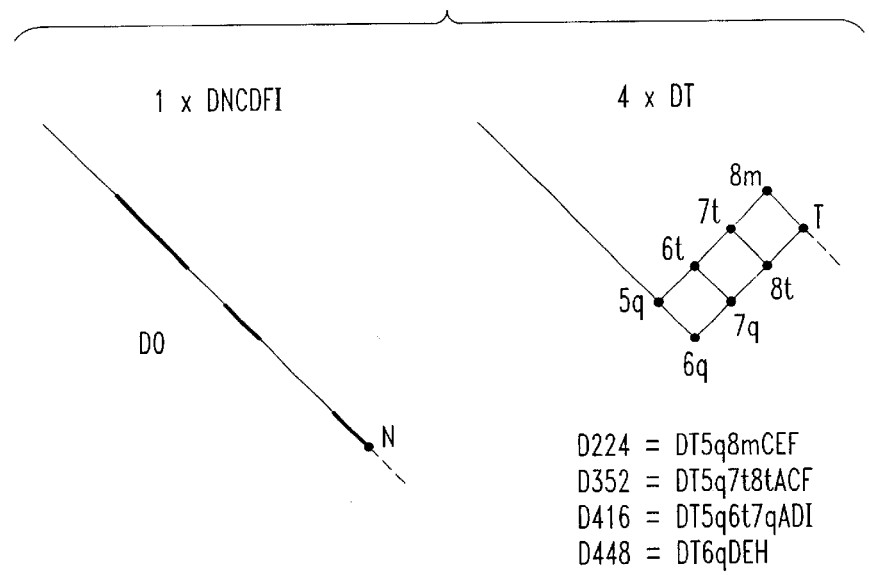

The trellis diagram DT (i.e., the right side) of FIG. 29 shows that T5q7t8t (D352) and T5q6t7q (D416) can be reduced to T5q6t8t.

(b) Basic Auxiliary Equations for 9B/10B Encoding

The following are basic equations used as shorthand below.

$$02 = (A \neq B)$$

$$13 = (B \neq C)$$

$$24 = (C \neq D)$$

$35=(D{\neq}E)$ $46=(E{\neq}F)$ $57=(F{\neq}G)$ $69=(G{\neq}H)$ $79=(H{\neq}H)$ $4c=AB{\cdot}CD$ $4t=A'B'{\cdot}C'D'$ The trellis diagrams of the reduced terms above can now be further simplified observing commonalities among the trellis diagrams and by Boolean operations.

The terms C5v, V4c·(5v7c+5c8v), and X (i.e., the left side of FIG. 30) can be combined to the following:

$4c{\cdot}\{E{\cdot}[HI{\cdot}(F'G'+FG)+57{\cdot}H'I'+F'G'{\cdot}79]+E'FGHI'\}$

The term H1u·(5c+6v7v) can be expressed as the following:

$AHI{\cdot}[13{\cdot}DEFG+BC{\cdot}(FG{\cdot}35+DEFG')]$

The terms S4t6t, T5q6t8t, Q4t6m'7s', and M5q (i.e., the left side of FIG. 23) can be combined to the following:

$4t{\cdot}[46{\cdot}G'HT+68{\cdot}(E'F{\cdot}I+46{\cdot}I')+E'G{\cdot}(F{\cdot}79+FHI)]$ The conditions for complementing the first bit A can thus be written as follows:

$CPLA=4c{\cdot}\{E{\cdot}[HI{\cdot}(F'G'+FG)+57{\cdot}H'I'+$ $F'G'{\cdot}79]+E'FGHI'\}+$ $AHI{\cdot}[13{\cdot}DEFG+BC{\cdot}$ $(FG{\cdot}35+DEFG')]+4t{\cdot}[46{\cdot}G'HT+$ $68{\cdot}(E'F{\cdot}I+46{\cdot}I')+E'G{\cdot}(F{\cdot}79+FHI)]$ After all the manual reductions based on trellis diagrams, Boolean algebra and intuition have been exhausted, logic synthesis and design tools may be able to bring further gains. It is also possible that minor swapping among the vectors of FIG. 14 to FIG. 33 can produce minor improvements. For further examples of the methods useful for logic reduction refer to the section on 7B/8B encoding below.

(c) 10B/9B Decoding Equations

In a first step, a decoding table is generated following the example below in the table shown in FIG. 50 for 8B/7B decoding. As is done for 8B/7B decoding, a single coded image for each uncoded source vector can be generated by inverting all disparity dependent 10B vectors with j=1. Note that all primary coded vectors with j=1 listed in the table shown in FIG. 8 have a ± sign in the 'Pr DR' column, which identifies them as disparity independent. All disparity dependent vectors have j=0 in the primary version and j=1 in the alternate, complemented version. Additionally, bits that are complemented are shown in bold.

The decoding equations can then be developed by the same methods as the encoding equations. On decoding, there is the additional requirement of flagging all invalid vectors. The invalid vectors can be found manually by subtracting the vectors listed in FIGS. 1A, 1B, and 1C from the vectors of FIG. 6. What remains are all invalid vectors. Programmed computer techniques may be helpful and are certainly required to insure that the resulting equations comprise all invalid vectors.

VI. Logic Equations for 7B/8B Encoder

(a) Auxiliary Equations for 7B/8B Encoder

The following are equations used as shorthand below.

$02=(S{\neq}T)$ $13=(T{\neq}U)$ $24=(U{\neq}V)$ $35=(V{\neq}W)$ $46=(W{\neq}X)$ $57=(X{\neq}Y)$ $4c=ST{\cdot}UV$ $4u=02{\cdot}UV+ST{\cdot}24$ $4b=02{\cdot}24+ST{\cdot}U'V'+S'T'{\cdot}UV$ $4m=02{\cdot}U'V'+S'T'{\cdot}24$ $4t=S'T'{\cdot}U'V'$ $4M7=46{\cdot}Y'+WX'Y$ $4U7=46{\cdot}Y+WXY'$ $0U3=02{\cdot}U+STU'$ $0M3=02{\cdot}U'+ST'U$ In the following equations, "(L)" indicates the left side of a figure, "(C)" indicates the center of a figure, and "(R)" indicates the right side of a figure. For example, "FIG. 35(L)" corresponds to BMK'4t'Z of FIG. 35.

FIG. 35(L), BMK'4t'Z: (The term K' blocks out K98)

$MK'4t'=4u{\cdot}WX'Y'+4b{\cdot}4M7+4m{\cdot}4U7{\cdot}K'$

FIG. 35(C), PU4c: $U4c=4c{\cdot}W'X'Y'$

FIG. 35(R), BU4c': $U4c'=4u{\cdot}4M7+4b{\cdot}4U7+4m{\cdot}WXY$

FIG. 36(L), DC4c': $C4c'=4u{\cdot}4U7+4b{\cdot}WXY$

FIG. 36(R), FT4m: $T4m=4m{\cdot}4M7$

FIG. 37(L), FTK3m4b: $TK3m4b=0M3{\cdot}V{\cdot}W'X'Y'{\cdot}K$

FIG. 37(R), FVK3u: $VK3u=0U3{\cdot}VWXY{\cdot}K$

FIG. 38(L), DU4c'4m': $U4c'4m'=4u{\cdot}4M7+4b{\cdot}4U7$

FIG. 38(R), DM4u'4t': $M4u'4t'=4b{\cdot}4M7+4m{\cdot}4U7$

FIG. 39(L), DC4cVZ: $C4c=4c{\cdot}4M7$

FIG. 39(R), DTK'4bW: $TK'4b=4b{\cdot}W'X'Y'K'$

FIG. 40(L), DT5qU: $T5q=4t{\cdot}W'XY$

FIG. 40(R), DT4t5tSTW: $T4t5t=4t{\cdot}W{\cdot}57$

FIG. 41(L), DQ3mWX: $Q3m=0M3{\cdot}V'{\cdot}W'X'Y'$

FIG. 41(R), DQ3t5tSY: $Q3t5t=S'T'U'{\cdot}35{\cdot}X'Y'$

FIG. 42(L), DQ5qTV: $Q5q=4t{\cdot}W'{\cdot}57$

FIG. 42(R), DVK'6vSTW: $VK'6v=4c{\cdot}WXY'$

FIG. 43(L), DVK'5v6cSVW: $VK'5v6c=4c{\cdot}WX'Y$

FIG. 43(R), DVK'2u3uTVW: $VK'2u3u=ST{\cdot}U'{\cdot}V{\cdot}WXY{\cdot}K'$

FIG. 44(L), DVK'3c5cSTX: $VK'3c5c=STU{\cdot}35{\cdot}XY$

FIG. 44(R), DVK'2bVWY: VK'$2b$=02·UVWXY·K'
FIG. 45(L), DMK4t': MK4t'=S'·T·U'V'·W'X'Y'·K
FIG. 45(R), DM4tTX: M4t=4t·WXY
FIG. 46(L), DSSVX: S=4t·W'X'Y'
FIG. 46(R), DHTVWX: H=4c·WXY (b) Equations for Bit Encoding Generally, the encoded bits retain the value of the unencoded bit (s=S, t=T, etc.), but a specific source bit is complemented (s=S', t=T', etc.) if and only if (iff) the respective equation below is true:

$$s=S' \text{ iff } S+Q3t5t+T4t5t+VK'6v+VK'5v6c+VK'3c5c \quad \text{Equation 1.}$$

From the trellis diagrams of FIG. 46(L), FIG. 41(R), and FIG. 40(R), one can observe that the expression (S+Q3t5t+T4t5t) can be reduced to [3t·(S+Q5t+T4t5t)].

From the trellis diagrams of FIG. 42(R), FIG. 43(L), and FIG. 44(L), one can observe that the expression (VK'6v+VK'5v6c+VK'3c5c) can be reduced to (VK'3c).

Writing the equation in more explicit form, one obtains as a condition for complementing the S-bit (CPLS):

$$CPLS=S'T'U'·[X'Y'·(35+V'W')+V'W·57]+STU·(35·XY+VW·57)$$

$$t=T' \text{ iff } Q5q+T4t5t+VK'6v+VK'3c5c+M4t+VK'2u3u+H \quad \text{Equation 2.}$$

From the trellis diagrams of FIG. 42(R), FIG. 44(L), FIG. 43(R), and FIG. 46(R), one can observe that the expression (VK'6v+VK'3c5c+VK'2u3u+H) can be reduced to [2u·X·(2U5·Y+UVW)].

Observations from diagrams of FIG. 42(L), FIG. 40(R), and FIG. 45(R) lead to the following equation:

$$Q5q+T4t5t+M4t=S'T'U'V'·(57+WXY)$$

Therefore, $$CPLT=STX·(2U5·Y+UVW)+S'T'U'V'·(57+WXY)$$

$$u=U' \text{ iff } T5q \quad \text{Equation 3.}$$

From FIG. 40(L), it can be seen that:

$$CPLU=S'T'U'V'WXY$$

$$v=V' \text{ iff } S+C4c+Q5q+VK'5v6c+VK'2u3u+VK'2b+H \quad \text{Equation 4.}$$

From the trellis diagrams of FIG. 39(L), FIG. 43(L), and FIG. 46(R), one can observe that the expression (C4c+VK'5v6c+H)) can be reduced to [4c·(4M7+WY)].

From the trellis diagrams of FIG. 43(R), and FIG. 44(R), one can observe that the expression (VK'2u3u+VK'2b) can be reduced to (VK'3u).

From the trellis diagrams of FIG. 42(L), and FIG. 46(L), one can observe that the expression (Q5q+S) can be reduced to [5q·(XY)'].

Therefore:

$$CPLV=STUV·(4M7+WY)+0U3·VWXY·K'+S'T'U'V'W·(XY)'$$

$$w=W' \text{ iff } Q3m+TK'4b+T4t5t+VK'6v+VK'5v6c+VK'2u3u+\text{...} \quad \text{Equation 5.}$$

From the trellis diagrams of FIG. 41(L), FIG. 39(R), and FIG. 40(R), one can observe that the expression (Q3m+TK'4b+T4t5t) can be reduced to $$0M3·V'WX'Y'+4b·WX'YK'+4t·W·57=WX'Y'·(0M3·V'+4b·K')+S'T'U'V'W·57$$

From the trellis diagrams of FIG. 42(R), FIG. 43, FIG. 44(R), and FIG. 46(R), one can observe that the expression (VK'6v+VK'5v6c+VK'2u3u+VK'2b+H) can be reduced to $$5v·K'·(X+Y)+0U3·VWXY·K'=VWK'·[STU·(X+Y)+0U3·XY]$$

Therefore:

$$CPLV=WX'Y'·(0M3·V'+4b·K')+S'T'U'V'W·57+VWK'·[STU·(X+Y)+0U3·XY]$$

$$x=X' \text{ iff } S+Q3m+VK'3c5c+M4t+H \quad \text{Equation 6.}$$

From the trellis diagrams of FIG. 46(L), FIG. 41(L), and FIG. 44(R), one can observe that the expression (S+Q3m+M4t) can be reduced to V'·[0M3·W'X'Y'+S'T'U'·(WXY+W'X'Y')]

From the trellis diagrams of FIG. 44(L) and FIG. 46(R), one can observe that the expression (VK'3c5c+H)'can be reduced to 3c·(35·XYK'+VWXY)=STUXY·(35·K'+VW)

Since H is not a control character, one can simplify further by writing STUXYK'·(35+VW)

Therefore:

$$CPLX=V'·[0M3·WX'Y'+S'T'U'·(WXY+WX'Y')]+STUXYK'·(35+VW)$$

$$y=Y' \text{ iff } Q3t5t+VK'2b \quad \text{Equation 7.}$$

From FIG. 41(R) and FIG. 44(R) one can derive the equation:

$$CPLY=S'T'UX'Y'·35+02·UVWXY$$

$$z=Z' \text{ iff } MK'4t'+C4c \quad \text{Equation 8.}$$

From FIG. 35(L) and FIG. 39(L) one can derive the equations:

$$MK'4t'=4u·WX'Y'+4b·4M7+4m·4U7$$

$$C4c=4c·4M7$$

Therefore, $$CPLZ=4u·WX'Y'+4M7·(4b+4c)+4m·4U7$$

(c) Equations for Required Disparity (DR)
(i) Positive Required Disparity: PDR.

$$PDR=S+Q+T+M4t+MK4t'+VK'+H$$

The components of this equation are illustrated in FIG. 46, FIG. 41, FIG. 42, FIG. 39(R), FIG. 40, FIG. 36(R), FIG. 37(L), FIG. 45, FIG. 43, and FIG. 44.

Figure 49:
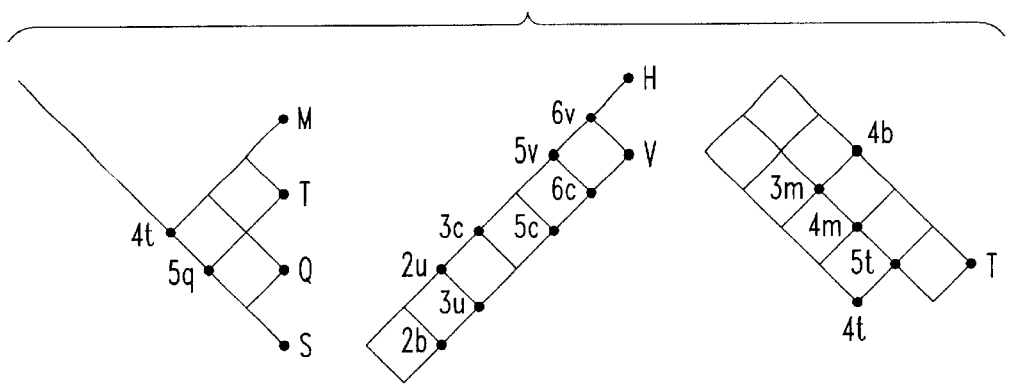
FIG. 49 illustrates trellis diagrams suitable for determining required disparity rules for certain coded vectors in a 9B/10B code.

From the list just above, FIG. 46(L), FIG. 42(L), FIG. 40, and FIG. 45(R) can be combined to the trellis of FIG. 49(L), shown in FIG. 49. Since beyond node 4t, all paths to all nodes are allowed, all the vectors of diagram of FIG. 49(L) can be identified by the expression:

$$S'T'U'V'$$

FIG. 42(R), FIG. 43, FIG. 44, and FIG. 46(R) are merged in the center trellis of FIG. 49(C) and can be identified by the expression:

$VWXY \cdot (STU+0U3)+STU \cdot (3U6 \cdot Y+VWX)$

FIG. 39(R), FIG. 36(R), FIG. 37(L), and FIG. 40(R) are combined in FIG. 49(R) and those vectors may be identified by:

$WX'Y' \cdot (4b+4m)+4m \cdot 4M7$

The K-bit in DTK'4b and FTK3m4b of FIG. 39(R) and FIG. 37(L) can be ignored in this context.

The vector DMK4t' of FIG. 45(L) can be identified with the expression:

$S'TU'V'WXYK$

The 4 simplified expressions can now be inserted into the PDR equation:

$PDR=S'T'U'V'+WX'Y' \cdot (4b+4m)+4m \cdot 4M7+VWXY \cdot (STU+0U3)+STU \cdot (3U6 \cdot Y+VWX)+S'TU'V'WXY$ A Boolean operation results in:

$PDR=S'V' \cdot (T'U'+TUWXY)+WX'Y' \cdot (4b+4m)+4m \cdot 4M7)+VWXY \cdot (STU+0U3)+STU \cdot (3U6 \cdot Y+VWX)$ (ii) Negative Required Disparity: NDR.

$NDR=C+VK+U4c$

The components of the above expressions are illustrated in FIG. 35(C), FIG. 36(L), FIG. 37(R), and FIG. 39(L). From the diagrams, the following is obtained:

$C=4c \cdot 4M7+4u \cdot 4U7+4b \cdot WXY$ $VK=0U3 \cdot VWXY$ $U4c=4c \cdot WX'Y'$ Plugging these expressions into the NDR equation results in:

$NDR=4c \cdot (4M7+WX'V')+4u \cdot 4U7+WXY \cdot (4b+0U3 \cdot V)$ (d) Equations for Block Disparity (DB)
(i) Positive Block Disparity of Four: PDB4.

$PDB4=VK$

From FIG. 37(R), the equation for VK and PDB4 is derived as follows:

$PDB4=VK=0U3 \cdot VWXYK$ (ii) Positive Block Disparity of Two: PDB2.

$PDB2=C$

From FIG. 36(L) and FIG. 39(L), the equation for C and PDB2 is derived as follows:

$PDB2=C=4c \cdot 4M7+4u \cdot 4U7+4b \cdot WXY$ (iii) Negative Block Disparity of Two: NDB2.

$NDB2=S+Q+T4b+T4t5t+T5q+M4t+MK4t'+VK'+H$

Figure 40:
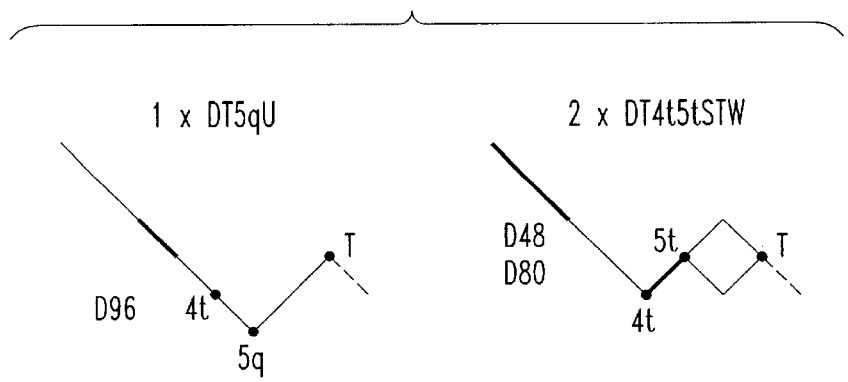
Figure 41:
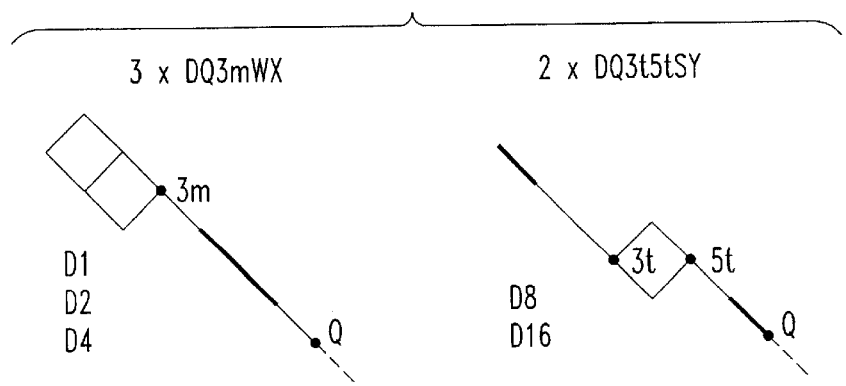
Figure 42:
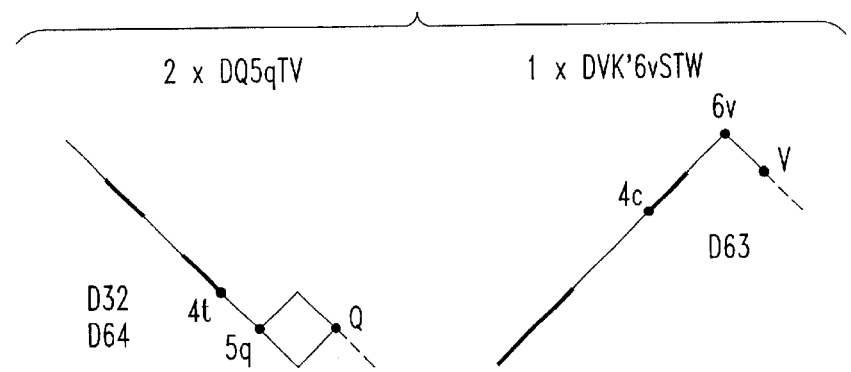
Figure 43:
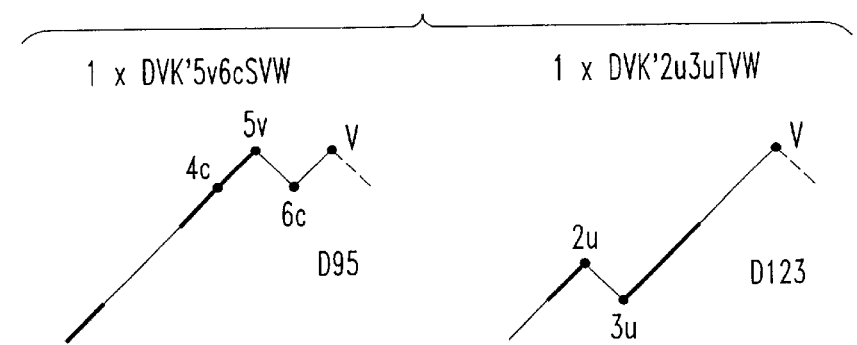
Figure 44:
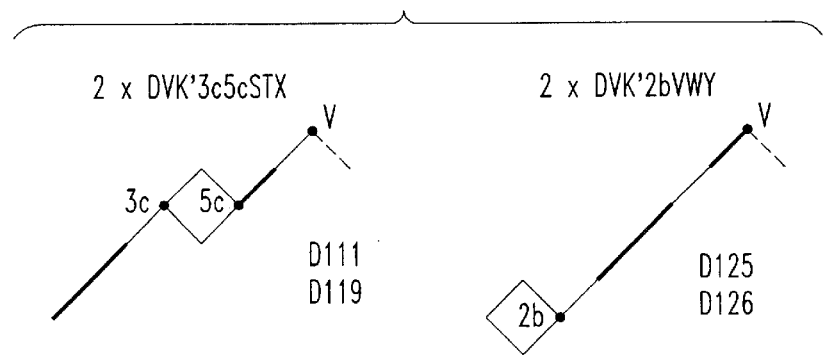

This expression is similar to PDR, except that T is replaced by TK'4b+4t5t+T5q represented in FIG. 39(R) and FIG. 40 and does not include the vectors FT4m of FIG. 39(R) and FTK3m4b of FIG. 40(L). The expression [W'X'Y' \cdot (4b+4m)+4m \cdot 4M7] representing FIG. 49(R) is replaced by $(4b \cdot WX'Y'K'+4t \cdot W \cdot 57)$.

$NDB2=S'T'U'V'+VWXY \cdot (STU+0U3)+STU \cdot (3U6 \cdot Y+VWX)+4b \cdot WX'Y'K'+4t \cdot W \cdot 57+S'TU'V'WXYK$ Boolean operations simplify this to:

$NDB2=S'U'V' \cdot (T'+TWXYK)+VWXY \cdot (STU+0U3)+STU \cdot (3U6 \cdot Y+VWX)+4b \cdot WX'Y'K'+4t \cdot W \cdot 57$ (iv) Negative Block Disparity of Four: NDB4.

$NDB4=T4m+TK$

From FIG. 36(R) and FIG. 37(L) the expression below may be read:

$NDB4=4m \cdot 4M7+0M3 \cdot VWX'Y'K$ (v) Neutral Block Disparity: DB0.

$DB0=MK'4t'+U4c'+U4c$

The separate functions U4c' and U4c are required for bit mapping and so we use them rather than just specifying U=U4c'+U4c. The function DB0 is redundant but may be of use for faster operation when multiple coders operate in parallel.

VII. 8B/7B Decoding

For the 8B/7B decoding process, one could follow the techniques used for the 10B/8B decoder of "The ANSI Fibre Channel Transmission Code," U.S. Pat. No. 4,486,739, and U.S. Provisional Patent Application No. 60/289,556 (each of which has already been incorporated by reference). Because there are many more vectors involved in this case, a two-step approach is described below which can easily be adapted for pipe lining if timing constraints require it.

In a first step, three significant functions are performed: (1) The required entry and exit disparities of all the received vectors are determined; (2) Invalid vectors are flagged as errors; and (3) A single image, the primary vector, of each complementary pair of vectors in the code is created by complementing one vector of the pair. Step (3) is performed under the following conditions:

Complement if z=1, except for the 34 balanced vectors of trellis diagram 100 of FIG. 1 with z=1 and except for the 3 vectors U3c4u of the lower trellis of FIG. 39(L).

Complement the 3 vectors M3t4m (z=0) of upper trellis of FIG. 39(L). CMPL iff:

$CMPL=z \cdot [4u \cdot w'x'y'+4b \cdot 4M7+4m \cdot 4U7+stuv' \cdot 4M7]'+s't'u'vz' \cdot 4U7$, where
  $2b=02=s \neq t$
  $2u=s \cdot t$
  $2m=s' \cdot t'$
  $24=u \neq v$
  $46=w \neq x$
  $57=x \neq y$
  $4u=2u \cdot 24+2b \cdot uv$
  $4b=2bs \cdot 24+2u \cdot u'v'+2m \cdot uv$
  $4m=2m \cdot 24+2b \cdot u'v'$
  $4U7=46 \cdot y+wxy'$
  $4M7=46 \cdot y'+w'x'y$ In a second step, the following functions are performed: (1) Bit mapping back to the source vectors is accomplished by dropping the z-bit; for a minority of vectors, complementation of selected bits is also required; (2) The conformance with disparity rules is checked and violations are flagged as errors; and (3) A 2-bit state machine keeps track of the running disparity at the end of the received vector (+2, +1, −1, −2) following rules described later for normal and spurious signals.

(a) Vector Classifications and Notations for Decoding

The letter B refers to the 68 disparity independent vectors ending with node 8b of trellis diagram 200 of FIG. 2A.

$$B=4c'4t'8b$$

The single, disparity dependent, balanced coded vector D15 ending with node 8b of the trellis diagrams 201 and 202 of FIG. 2A can be defined as follows:

$$D15=4t8b+4c8b$$

The letter C refers to the 12 vectors of trellis diagram 205 of FIG. 2C with a disparity of +4 and ending in node 8c. The letter T refers to their complements ending with node 8t, as shown in trellis diagram 206 of FIG. 2C and FIG. 36(R):

$$C=4u7c8c$$

$$T=4m7t8t$$

The letters CK refer to the 6 control vectors ending with node 8c of trellis diagram 207 of FIG. 2C with a disparity of +4 and the letters TK refer to their complements as shown in trellis diagram 208 of FIG. 2C. The respective vectors are listed in FIG. 37 where there is also a trellis of one polarity:

$$CK=3u \cdot (v \neq z) \cdot wxy$$

$$TK=3m \cdot (v \neq z) \cdot w'x'y'$$

Figure 2B:
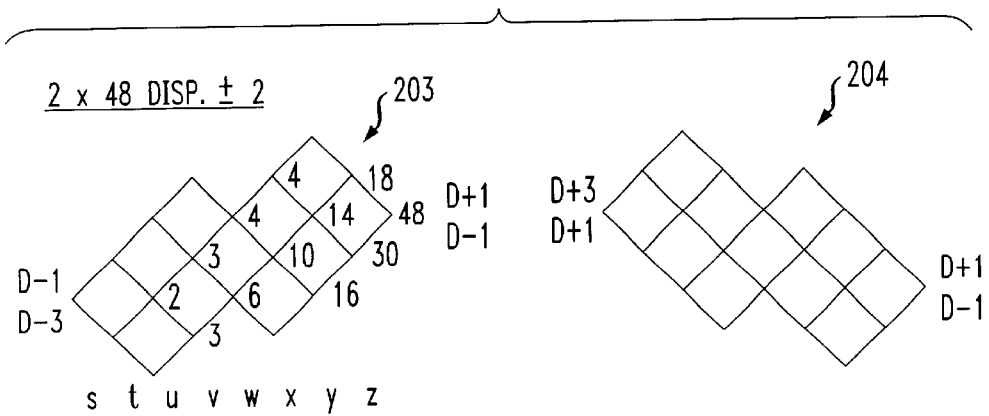

The letter U refers generally to coded vectors ending with node 8u of trellis diagram 203 of FIG. 2B with a disparity of +2. The letter M refers to coded vectors ending with node 8m of trellis diagram 204 of FIG. 2B with a disparity of −2.

The single letter M with no explicit node restrictions in the column 'Decoding Class' refers to the complements of the 18 vectors DC4c' of FIG. 36(L) with a disparity of −2 and with the following implicit path restrictions:

$$M=4t'7t8m$$

These 18 vectors are decoded by simply dropping the last bit z after conversion to the primary vector representation (complement).

If M in the column 'Decoding Class' is followed by node restrictions, the vector belongs to the group of 30 vectors DM4u'4t' illustrated in FIG. 38(R) which require selective complementation of one or more bits depending on the specific node restrictions. In this context, the nomenclature for vector identification is as follows:

1. A first capital M relegates the vector to class M as identified by the last two nodes in the trellis, with the implicit path restrictions M=7m8m.
2. The letter U or M may be followed by additional path restrictions.
   a. The vector Name Dnn represents the respective coded string stuvwxyz. It is used to identify single vectors as listed in the first column 'Name'. As an example, for the term MD0SVX, M identifies the vector as belonging to class M, D0 refers to the first row of the table shown in FIG. 50 (discussed below) as indicated in the first column.
   b. If several vectors of a group require the same action as is the case for the vectors of FIG. 51 (discussed below), the path restrictions are generally illustrated by trellis nodes.
   c. The capital letters following the trellis nodes or Dnn mark the bits which must be complemented for decoding, e.g. X means that the coded bit x must be complemented to obtain the source bit X in the column 'Decoded Bits'.

(b) 8B/7B Decoding Table

Referring now to FIG. 50, this figure shows a decoding table used to decode 8B/7B encoded vectors. Again, the complemented bits are indicated by bold font.

FIGS. 51 to 58 show the encoded primary vectors corresponding to the source vectors of FIG. 39 to FIG. 46. The double-thickness lines mark the bits which must be complemented for decoding. Note that for all these diagrams except U3c4u in the lower left part of FIG. 51(L), the z-bit is always zero.

VIII. Logic Equations for 8B/7B Decoder

(a) Equations for Bit Mapping (i) Basic Auxiliary Equations. The basic auxiliary equations defined for 7B/8B encoding are valid for 8B/7B decoding as well if the capital letters representing individual bits are replaced by lower case letters.

Figure 51:
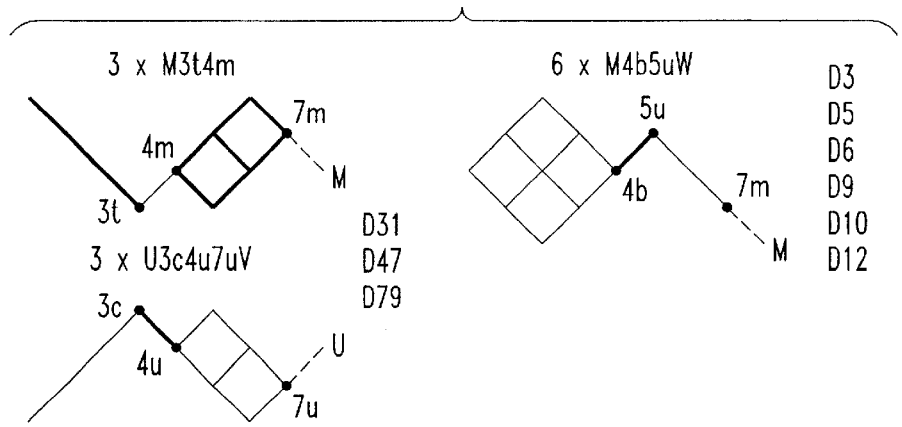
Figure 52:
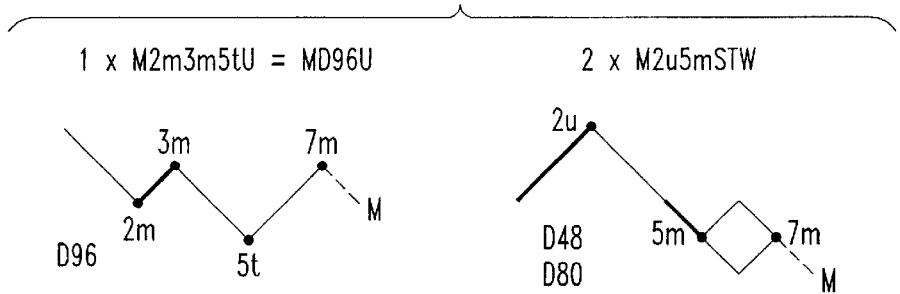
Figure 53:
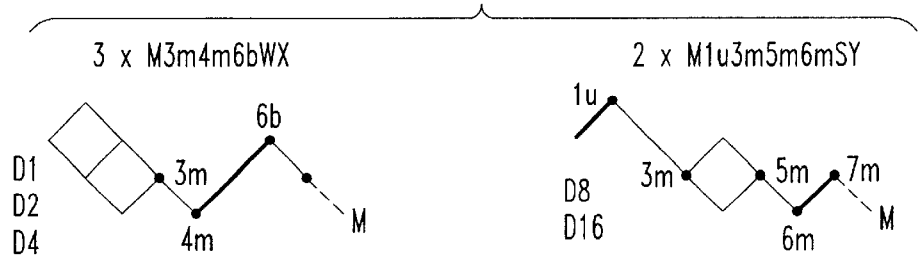
Figure 54:
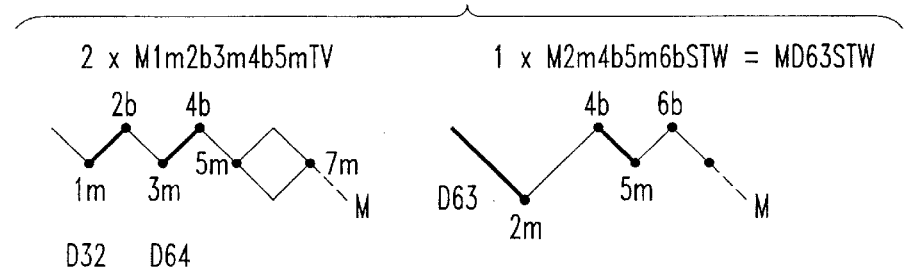

D0=M1u3m4b5m6b=s't'u'vw'xy'z' [FIG. 58(L)]
D63=M2m4b5m6b=s't'uvw'xy'z' [FIG. 54(R)]
D95=M1m3u6m=s'tuv'w'x'yz' [FIG. 55(L)]
D96=M2m3m5t=s't'uv'w'xyz' [FIG. 52(L)]
D112=M1m2b4m5m6m=s'tu'v'wx'yz' [FIG. 57(R)]
D123=M1u5t=st'u'v'w'xyz' [FIG. 55(R)]
D127=M1u2b3u6m=st'uv'w'x'yz' [FIG. 58(R)]
K98=M1m2b5t=s'tu'v'w'xyz' [FIG. 57(L)]
0M3=02·u'+s't'u
M3m4m6b=0M3·v'wxy'z' [FIG. 53(L)]
M4b5u=[02·24+(s≠v)·13]·wx'y'z' [FIG. 51(R)]
M1u3m5m6m=st'u'·35·x'yz' [FIG. 53(R)]
4M7=46·y'+w'x'y
M3c4u7u=stuv'z·4M7 [FIG. 51(L)]
4U7=46·y+wxy'
M3t4m=s't'u'v·4U7 [FIG. 51 (L)]
M1m2b3m4b5m=s'tu'vw'·57·z' [FIG. 54(L)]
M2u5m=stu'v'w'·57·z' [FIG. 52(R)]
M2m3m5m6m=s't'u·35·x'yz' [FIG. 56(L)]
M2b3u5m6b=02·uv'w'xy'z' [FIG. 56(R)]
TK3m4b=0M3·vw'x'y'z' [FIG. 37(L)]
0U2=02·u+stu'
VK3u=0U2·vwxyz' [FIG. 37(R)]

(ii) Equations for 8B/7B Bit Mapping. The following equations can be reduced and simplified by the same techniques as demonstrated for the 7B/8B encoding equations. Just the raw equations as read from the table shown in FIG. 50 are shown below.

S=s' iff D0+M1u3m5m6m+M2u5m+D63+D95+M2m3m5m6m

Therefore,

CPLs=D0+M1u3m5m6m+M2u5m+D63+D95+M2m3m5m6m

T=t' iff M1m2b3m4b5m+M2u5m+D63+D112+M2m3m5m6m+D123+D127

Therefore,
CPLt=M1m2b3m4b5m+M2u5m+D63+D112+M2m3m5m6m+D123+D127
U=u' iff D96
Therefore,
CPLu=D96
V=v' iff D0+U3c4u7u+M1m2b3m4b5m+D95+D123+M2b3u+D127
Therefore,
CPLv=D0+U3c4u7u+M1m2b3m4b5m+D95+D123+M2b3u5+D127
W=w' iff M3m4m6b+M4b5u+M2u5m+D63+D95+D123+M2b3u5m6b+D127
Therefore,
CPLw=M3m4m6b+M4b5u+M2u5m+D63+D95+D123+M2b3u5m6b+D127
X=x' iff D0+M3m4m6b+M2m3m5m6m+D112+D127
Therefore,
CPLx=D0+M3m4m6b+M2m3m5m6m+D112+D127
Y=y' iff M1u3m5m6m+M2b3u5m6b
Therefore,
CPLy=M1u3m5m6m+M2b3u5m6b
K=1 iff TK3m4b+K98+CK
The default value of K is zero, therefore,
CPLK=TK3m4b+K98+CK (b) Equations for Required Disparity (DR)

For the required disparity, only valid vectors are considered since invalid vectors will indicate an error regardless.
(i) Positive Required Disparity PDR. PDR=M+4t8b+T, where
M comprises a total of 48 vectors, illustrated in trellis diagram 204 of FIG. 2B
M=4m·[46·68+(w≠z)·57]+4b·(46·y'z'+w'x'·68)
57=(x≠y)
68=(y≠z)
4t8b=s't'u'v'·wxyz [FIG. 2A2(R)]
For disparity purposes, T includes the class TK which is separate for bit mapping only. So in this context, T comprises the 18 vectors illustrated in trellis diagram 206 of FIG. 2C and trellis diagram 208 of FIG. 2C:
4M7=46·y'+w'·57
T=4m·4M7·z'+0M3·w'x'y'·(v≠z)
(ii) Negative Required Disparity NDR.
NDR=U+4c8b+C, where
U comprises a total of 48 vectors, illustrated in FIG. 2B(L):
U=4u·[46·68+(w≠z)·57]+4b·(46·yz'+wx·68)
4c8b=stuv·w'x'y'z' [FIG. 2A2(L)]
Again, for disparity purposes, C includes the class CK which is separate for bit mapping only. So in this context, C comprises the 18 vectors illustrated in trellis diagram 205 of FIG. 2C and trellis diagram 206 of FIG. 2C
4U7=46·y+w·57
C=4u·(4U7·z)+0U3·wxy·(v≠z)

(c) Equations for Block Disparity (DB)

For the block disparity, invalid vectors are considered as well. Vectors with more than six ones or zeros are lumped together with vectors of a disparity of four.
(i) Positive Block Disparity of Four PDB4. Referring to FIG. 6(L), all 8B vectors are included which end in node 8c, 8v, or 8h.

PDB4=4c·(wx+wy+wz+xy+xz+yz)'+4u (wxy+wxz+wyz+xyz)+4b·wxyz
(ii) Positive Block Disparity of Two PDB2. This includes all vectors ending with node 8u in FIG. 6(L).
PDB2=4c·(4M7·z'+w'x'y'z)+4u·[46·68+57·(w≠z)]+4b·(4U7·z+wxyz')+4m·wxyz
(iii) Negative Block Disparity of Two NDB2. This includes all vectors ending with node 8m in FIG. 6(L).
NDB2=4t·(4U7·z+wxyz')+4m·[46 68+57·(w≠z)]+4b·(4M7·z'+w'x'y'z)+4u·w'x'y'z'
(iv) Negative Block Disparity of Four NDB4. Referring to FIG. 6(L), all 8B vectors are included which end in node 8t, 8q, or 8s.
PDB4=4t·(w'x'+w'y'+w'z'+x'y'+x'z'+y'z')+4m·(w'x'y'+w'x'z'+w'y'z'+x'y'z')+4b·w'x'y'z'
(v) Neutral Block Disparity DB0. This includes all vectors ending with node 8b in FIG. 6(L).
DB0=4c·w'x'y'z'+4u·(4M7·z'+w'x'y'z)+4m·(4U7·z+wxyz')+4t·wxyz+4b·[46·68+57·(w≠z)]
The function DB0 is redundant but may be of use for faster operation when multiple coders operate in parallel.

(d) 54 Invalid 8B Vectors

The 8B alphabet of FIGS. 2A, 2B, and 2C comprises 202 valid vectors, so there are a total of 54 invalid 8B vectors.
INVAL8=4c·(w'x'y'z')'+wxyz·(4m+4u+v·0M3)+stuv'wxyz'+4t·(wxyz)'+w'x'y'z'·(4u+4m+v'·0U3)+s't'u'vw'x'y'z
(i) Invalid 18B Word.
An 18-bit word is invalid if for any of the following conditions:
1. INVAL10=1, an invalid 10B vector is present
2. INVAL8=1, an invalid 8B vector is present
3. Internal disparity violations which can be recognized regardless of the running disparity at the front end of the 10B vector which may deviate from the transmitted value because of preceding errors:
    a. The 10B vector is one of the 9 balanced disparity dependent vectors of FIG. 10 and the 8B vector is the balanced disparity dependent vector D15 of FIG. 35(C) but the polarities of the respective required entry disparities DR do not match.
    b. The 10B and 8B vectors have both a disparity of four with matching polarity.
    c. The 10B vector has a disparity of four and the required entry polarity DR of the 8B vector is not the complement of the 10B block polarity.
    d. The 10B vector is one of the 9 balanced disparity dependent vectors of FIG. 10 and the 8B vector has a block disparity of four, but the DR polarities of the 10B and 8B blocks do not match.
(iii) Disparity Checks. In this code, a single bit error will always be detected by the next vector with a disparity of four or by the second. vector with a disparity of two, but may escape detection by the first disparity dependent vector with a disparity of two or zero, e.g. if the error changed the running disparity at the end of a vector from +1 to +3. However, if the error changed the polarity of the running disparity, it will be detected by the first of any of the disparity dependent vectors.

IX. Conclusion

It has been assumed that most users will prefer an efficient implementation using combinatorial logic and the efforts have been devoted entirely to this kind of implementation. However, for some applications table look-up solutions may be appropriate, if sufficient storage is available which might otherwise go unused, e.g. in combination with programmable logic arrays. Note, that with a little effort and a few gates, the size of the tables can be reduced. For the decoding process, one would want to at least complement a selected set of received 10B and 8B vectors which end with a one before accessing the table as described above.

Most effort has been devoted to the 8B/10B encoding equations. So in a first step, a user may want to see whether logic synthesis programs can improve the implementation, preferably with less circuit delay. In a second step one may want to examine whether logic synthesis alone applied just to the tables or raw equations can produce a comparable result. In the affirmative, one would rely entirely on synthesis tools for the decoder and the 9B/10B codec. Otherwise, the manual techniques demonstrated for the 7B/8B case can be applied to the remaining cases.

The encoders and decoders for both the 9B/10B and 7B/8B codes can be implemented with far fewer gates than one would expect. The reason for this is the availability of vectors with a disparity of four which allow more source vectors to be mapped directly into the coded format without individual bit changes.

The 9B/10B and 7B/8B components of the 16B/18B code can be used as stand alone codes or in combination with the 5B/6B and 3B/4B components of the 8B/10B code. A particular attractive applications of the full code or the components is for very high speed busses to save lines in combination with U.S. patent application Ser. No. 09/120,675, by Widmer, entitled "Transformation of Parallel Interface into Coded Format with Preservation of Baud-Rate," filed on Jul. 22, 1998, the disclosure of which is hereby incorporated by reference, which shows how to avoid an increase in the line baud rate due to coding and how to eliminate clock gear boxes and extra clock domains by adding extra lines to compensate for-the loss of throughput resulting from the code redundancy.

The tables and equations have only been manually checked, and no progranmned computer checks have been run so far. However, the basic coding principles are sound and detail errors can be corrected by engineers with ordinary skills using the methods described in this report or other techniques. A user may also want to make minor modifications for a better match for a specific application. Elimination of some of the control characters can simplify some of the equations and the error checks.

It is to be understood that the embodiments and variations shown and described herein are merely illustrative of the principles of this invention and that various modifications may be implemented by those skilled in the art without departing from the scope and spirit of the invention.

What is claimed is:

1. A method of producing a Direct Current (DC) balanced run length limited rate 16B/18B code from an input data stream which includes one or more sixteen-bit source vectors, the method comprising the steps of:

partitioning the sixteen-bit input source vector into two vectors including nine and seven contiguous bits, respectively;

determining disparities associated with the partitioned vectors such that a first coded vector having ten binary digits is assigned to the nine-bit vector based on the determined disparity in accordance with a ten binary digit vector set, and a second coded vector having eight binary digits is assigned to the seven-bit vector based on the determined disparity in accordance with an eight binary digit vector set;

combining the first and second coded vectors to form an eighteen-binary digit coded vector for transmission; and wherein, for a chosen one or both of the ten binary digit vector set and the eight binary digit vector set, the chosen vector set or sets are divided into a plurality of classes, each class comprising encoded vectors and used to assign uncoded vectors to coded vectors.

2. The method of claim 1, wherein the classes correspond to uncoded vectors and to block disparity of coded vectors.

3. The method of claim 2, further comprising the step of constructing the classes.

4. The method of claim 3, wherein the step of constructing the classes further comprises the step of minimizing the number of classes corresponding to uncoded vectors.

5. The method of claim 4, wherein the step of minimizing further comprises the step of minimizing the number of classes corresponding to block disparity.

6. The method of claim 4, wherein the step of minimizing further comprises the step of minimizing the number of bits changed from uncoded vectors to coded vectors when constructing the classes corresponding to uncoded vectors.

7. The method of claim 1, wherein:

the ten binary digit vector set is chosen as one of the chosen vector sets;

a first class for the ten binary digit vector set comprises 116 disparity independent balanced vectors, generated by appending a one bit to all nine-bit source vectors with a disparity of minus one, not more than three leading ones or zeros, and not more than two trailing ones;

a second class for the ten binary digit vector set comprises 116 disparity independent balanced vectors, generated by appending a zero bit to all nine-bit source vectors with a disparity of plus one, not more than three leading ones or zeros, and not more than two trailing zeros; and the step of determining disparities further comprises assigning the first coded vector having ten binary digits to the nine-bit vector based on the determined disparity in accordance with the ten binary digit vector set and the first and second classes of the ten binary digit vector set.

8. The method of claim 7, wherein:

a third class for the ten binary digit vector set comprises four balanced vectors with a required negative entry disparity, generated by appending a zero bit to all nine-bit source vectors with a disparity of plus one, not more than three leading ones or one leading zero, and exactly three trailing zeros;

a fourth class for the ten binary digit vector set comprises four balanced vectors with a required negative entry disparity, generated by appending a zero bit to all nine-bit source vectors with a disparity of plus one, four leading ones and not more than three trailing zeros or at most one one;

a fifth class for the ten binary digit vector set comprises a single balanced vector with a required negative entry disparity, generated by appending a zero bit to the 9-bit source vector with four leading zeros and five trailing ones; and the step of determining disparities further comprises assigning the first coded vector having ten binary digits to the nine-bit vector based on the determined disparity in accordance with the ten binary digit vector set and the first through fifth classes of the ten binary digit vector set.

9. The method of claim 8, wherein:

a sixth class for the ten binary digit vector set comprises 24 vectors with a disparity of plus four, generated by appending a zero bit to all nine-bit source vectors with a disparity of plus five, not more than four leading ones or one zero, and one to six trailing ones;

a seventh class for the ten binary digit vector set comprises 70 vectors with a disparity of minus four, generated by appending a zero bit to all nine-bit source vectors with a disparity of minus three, not more than two leading ones or at most four zeros, and not more than three trailing zeros or at most two trailing ones;

an eighth class for the ten binary digit vector set comprises four vectors with a disparity of plus four, generated by appending a zero bit to all nine-bit source vectors with a disparity of plus five, not more than three leading ones or one zero, and exactly one trailing zero;

a ninth class for the ten binary digit vector set comprises 74 vectors with a disparity of plus two, generated by appending a zero bit to all nine-bit source vectors with a disparity of plus three, not more than three leading ones or zeros, and not more than two trailing zeros;

a tenth class for the ten binary digit vector set comprises four vectors with a disparity of minus two, generated by appending a zero bit to all nine-bit source vectors with a disparity of minus one, not more than one leading one or at most three zeros, and exactly three trailing ones;

an eleventh class for the ten binary digit vector set comprises ten control vectors with a disparity of minus two, generated by appending a zero bit to all nine-bit source vectors, accompanied by a control line equal to a predetermined value, with a disparity of minus one, not more than three leading ones or at most two zeros, and exactly three trailing zeros;

a twelfth class for the ten binary digit vector set comprises 14 vectors with a disparity of minus two, generated by complementing a last two bits to ones and appending a zero bit to all 9-bit source vectors with a disparity of minus 5, not more than two leading ones or at most three zeros, and at least three trailing zeros; and the step of determining disparities further comprises assigning the first coded vector having ten binary digits to the nine-bit vector based on the determined disparity in accordance with the ten binary digit vector set and the first through twelfth classes of the ten binary digit vector set.

10. The method of claim 1, wherein:

the eight binary digit vector set is chosen as one of the chosen vector sets;

a first class for the eight binary digit vector set comprises 34 balanced disparity independent vectors, generated by appending a one bit to all seven-bit source vectors with a disparity of minus one, not more than three leading ones or at most three zeros;

a second class for the eight binary digit vector set comprises 34 balanced disparity independent vectors, generated by appending a zero bit to all seven-bit source vectors with a disparity of plus one, not more than three leading ones or at most three zeros;

a third class for the eight binary digit vector set comprises single balanced disparity dependent vector, generated by appending a zero bit to a seven-bit source vector of four ones followed by three zeros;

a fourth class for the eight binary digit vector set comprises 18 vectors with a disparity of plus two, generated by appending a zero bit to all seven-bit source vectors with a disparity of plus three, not more than three leading ones or at most two zeros;

a fifth class for the eight binary digit vector set comprises 12 vectors with a disparity of minus four, generated by appending a zero bit to all seven-bit source vectors with a disparity of minus three, not more than one leading one or at most three zeros and not more than two trailing zeros; and the step of determining disparities further comprises assigning the second coded vector having eight binary digits to the seven-bit vector based on the determined disparity in accordance with the eight binary digit vector set and the first through fifth classes of the eight binary digit vector set.

11. The method of claim 10, wherein:

a sixth class for the eight binary digit vector set comprises three vectors with a disparity of plus two, generated by complementing a fourth bit to a zero and appending a one bit to all seven-bit source vectors with a disparity of plus three and at least four leading-ones;

a seventh class for the eight-binary digit vector set comprises six vectors with a disparity of minus two, generated by complementing a fifth bit to a one and appending a zero bit to all seven-bit source vectors with a disparity of minus three and at least four trailing zeros;

an eighth class for the eight binary digit vector set comprises two vectors with a disparity of minus two, generated by complementing a first two bits to ones and a fifth bit to a zero and appending a zero bit to two seven-bit source vectors with a disparity of minus four and four leading ones followed by at least one one;

a ninth class for the eight binary digit vector set comprises three vectors with a disparity of minus two, generated by complementing fifth and sixth bits to ones and appending a zero bit to three seven-bit source vectors with a disparity of minus five and at least four trailing zeros;

a tenth class for the eight binary digit vector set comprises two vectors with a disparity of minus two, generated by complementing a first and a last bit to ones and appending a zero bit to two seven-bit source vectors with a disparity of minus five, at least three leading zeros and at least two trailing zeros;

an eleventh class for the eight binary digit vector set comprises two vectors with a disparity of minus two, generated by complementing a second and a fourth bit to one and appending a zero bit to two seven-bit source vectors with a disparity of minus five and at least five leading zeros;

a twelfth class for the eight binary digit vector set comprises two vectors with a disparity of plus two, generated by complementing a first two and a sixth bit to zeros and appending a zero bit to two seven-bit source vectors with a disparity of plus five, at least three leading ones and at least two trailing ones;

a thirteenth class for the eight binary digit vector set comprises two vectors with a disparity of plus two, generated by complementing a fourth, a fifth, and a last bit to one and appending a zero bit to two seven-bit source vectors with a disparity of plus five and at least five trailing zeros; and the step of determining disparities further comprises assigning the second coded vector having eight binary digits to the seven-bit vector based on the determined disparity in accordance with the eight binary digit vector set and the first through thirteenth classes of the eight binary digit vector set.

12. An apparatus for producing a Direct Current (DC) balanced run length limited rate 16B/18B code from an input data stream which includes one or more sixteen-bit source vectors, the apparatus comprising:

an encoder operative to partition the sixteen-bit input source vector into two vectors including nine and seven contiguous bits, respectively, to determine disparities associated with the partitioned vectors such that a first coded vector having ten binary digits is assigned to the nine-bit vector based on the determined disparity in accordance with a ten binary digit vector set, and a second coded vector having eight binary digits is assigned to the seven-bit vector based on the determined disparity in accordance with an eight binary digit vector set, and to combine the first and second coded vectors to form an eighteen-binary digit coded vector for transmission, wherein, for a chosen one or both of the ten binary digit vector set and the eight binary digit vector set, the chosen vector set or sets are divided into a plurality of classes, each class comprising encoded vectors and used to assign uncoded vectors to coded vectors.

13. A method for decoding a Direct Current (DC) balanced, run-length limited code from an input data stream that includes one or more coded vectors, the method comprising the steps of:

determining, through a bit of a given one of the one or more coded vectors and characteristics of the given coded vector, if the given coded vector is an alternate coded vector of a complementary pair of coded vectors of the DC balanced run-length limited code, the complementary pair comprising the alternate coded vector and a primary coded vector;

inverting the given coded vector when it is determined that the given coded vector is the alternate coded vector, the step of inverting creating an inverted vector equivalent to the primary coded vector; and decoding the inverted vector to create a decoded vector.

14. The method of claim 13, wherein the step of determining, through a bit of a given one of the one or more coded vectors and characteristics of the given coded vector, if the given coded vector should be inverted further comprises the step of determining a value of the bit, wherein one predetermined value of the bit indicates that the given coded vector is the alternate coded vector and a second predetermined value of the bit indicates that the given coded vector is the primary coded vector, and wherein the given coded vector should be inverted when the bit of the given coded vector is the one predetermined value.

15. The method of claim 14, wherein the step of determining, through a bit of a given one of the one or more coded vectors and characteristics of the given coded vector, if the given coded vector should be inverted further comprises the steps of:

determining if the characteristics of the given coded vector indicates that the given coded vector is part of at least one specified class; and determining if both the given coded vector is part of the at least one specified class and the bit is the one predetermined value, wherein the given coded vector should be inverted when both the given coded vector is part of the at least one specified class and the bit is the one predetermined value.

16. The method of claim 15, further comprising the steps of:

separating a sixteen-bit input given coded vector into first and second coded vectors including ten and eight contiguous bits, respectively; and performing the steps of determining, through a bit of a given one of the one or more coded vectors and characteristics of the given coded vector, if the given coded vector should be inverted, inverting, and decoding, for one or both of the first and second coded vectors.

17. The method of claim 13, wherein the step of decoding the inverted vector to create a decoded vector comprises the step of dropping the bit and outputting the decoded vector as the remaining bits of the given coded vector.

18. A method of decoding a Direct Current (DC) balanced, run-length limited rate 16B/18B code from an input data stream that includes one or more eighteen-bit coded vectors, the method comprising the steps of:

separating the sixteen-bit input coded vector into two vectors including ten and eight contiguous bits, respectively; and performing the following steps for each of the separated vectors:

determining if the separated vector should be inverted by determining a value of a bit of the separated vector and by using characteristics of the separated vector, the characteristics comprising class indicia; and performing one of the following steps:
(i) when it is determined the separated vector should be inverted, inverting the separated vector and decoding the inverted separated vector; and
(ii) when it is determined the separated vector should not be inverted, decoding the separated vector.

19. An apparatus for decoding a Direct Current (DC) balanced, run-length limited rate 16B/18B code from an input data stream that includes one or more eighteen-bit coded vectors, the apparatus comprising:

a decoder operative to separate the sixteen-bit input coded vector into two vectors including ten and eight contiguous bits, respectively, and operative to perform the following for each of the separated vectors:

determine if the separated vector should be inverted by determining a value of a bit of the separated vector and by using characteristics of the separated vector, the characteristics comprising class indicia; and perform one of the following steps:
(i) when it is determined the separated vector should be inverted, invert the separated vector and decoding the inverted separated vector; and
(ii) when it is determined the separated vector should not be inverted, decode the separated vector.

20. A method of transmitting a comma sequence spanning first and second blocks, each block constructed from a coded vector determined by using a transmission code, the method comprising the steps of:

transmitting a first coded vector, in the first block, from a first transmission code, the first vector comprising a first run of a first number of bits and a second run of a second number of bits, wherein the first number is greater than the second number, wherein each bit of the first and second runs is a single value, and wherein opposite values are used for the bits of the first and second runs; and transmitting a second coded vector, in the second block, from a second transmission code, the second coded vector comprising a third run having a third number of bits, wherein each bit of the third run is a single value and wherein the value of each bit of the third run is the same as the value of each bit in the first run, wherein the comma sequence comprises the first and second coded vectors.

21. The method of claim 20, wherein:

the first and second transmission codes are 9B/10B transmission codes;

the first run is seven bits long and the second run is one bit long; and the third run is three bits long.

22. The method of claim 21, wherein the values of all of the bits in the first and third runs are ones and the value of all of the bits in the second run is zero.

23. The method of claim 22, wherein the comma sequence is inverted when disparity rules require inversion.

24. The method of claim 21, wherein the values of all of the bits in the first and third runs are zeros and the value of all of the bits in the second run is one.

25. The method of claim 24, wherein the comma sequence is inverted when disparity rules require inversion.

26. The method of claim 20, wherein:

the first and second transmission codes are 7B/8B transmission codes;

the first run is six bits long and the second run is one bit long; and the third run is three bits long.

27. The method of claim 20, wherein:

X the first transmission code is a 7B/8B transmission code;

the second transmission codes is a 5B/6B transmission code;

the first run is six bits long and the second run is one bit long; and the third run is two bits long.

28. The method of claim 20, wherein:

the first and second transmission codes are 9B/10B transmission codes;

the first run is seven bits long and the second run is one bit long; and the third run is three bits long.

29. An apparatus for transmitting a comma sequence spanning first and second blocks, each block constructed from a coded vector determined by using a transmission code, the apparatus comprising:

an encoder adapted to transmit a first coded vector, in the first block, from a first transmission code, the first vectors comprising a first run of a first number of bits and a second run of a second number of bits, wherein the first number is greater than the second number, wherein each bit of the first and second runs is a single value, and wherein opposite values are used for the bits of the first and second runs, and wherein the encoder is additionally adapted to transmit a second coded vector, in the second block, from a second transmission code, the second coded vector comprising a third run having a third number of bits, wherein each bit of the third run is a single value and wherein the value of each bit of the third run is the same as the value of each bit in the first run, wherein the comma sequence comprises the first and second coded vectors.

* * * * *